(12) United States Patent
Jang et al.

(10) Patent No.: US 11,923,348 B2
(45) Date of Patent: Mar. 5, 2024

(54) LIGHT EMITTING DEVICE WITH LED STACK FOR DISPLAY AND DISPLAY APPARATUS HAVING THE SAME

(71) Applicant: SEOUL VIOSYS CO., LTD., Ansan-si (KR)

(72) Inventors: Seong Gyu Jang, Ansan-si (KR); Ho Joon Lee, Ansan-si (KR); Jong Hyeon Chae, Ansan-si (KR); Chung Hoon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 17/963,147

(22) Filed: Oct. 10, 2022

(65) Prior Publication Data

US 2023/0033645 A1    Feb. 2, 2023

Related U.S. Application Data

(63) Continuation of application No. 16/988,272, filed on Aug. 7, 2020, now Pat. No. 11,557,577, which is a
(Continued)

(51) Int. Cl.
*H01L 33/38* (2010.01)
*H01L 25/075* (2006.01)
(Continued)

(52) U.S. Cl.
CPC .......... *H01L 25/13* (2013.01); *H01L 25/0756* (2013.01); *H01L 33/38* (2013.01);
(Continued)

(58) Field of Classification Search
CPC ................. H01L 25/13; H01L 25/0756; H01L 33/00–648; H01L 27/15–156;
(Continued)

(56) References Cited

U.S. PATENT DOCUMENTS 5,583,349 A    12/1996  Norman et al.
5,583,350 A    12/1996  Norman et al.
(Continued)

FOREIGN PATENT DOCUMENTS

CN     1423345        6/2003
CN     102593290      7/2012
(Continued)

OTHER PUBLICATIONS

Notice of Allowance issued in U.S. Appl. No. 16/988,272 dated Nov. 25, 2022.
(Continued)

*Primary Examiner* — Shahed Ahmed
(74) *Attorney, Agent, or Firm* — Oblon, McClelland, Maier & Neustadt, L.L.P.

(57) ABSTRACT

A light emitting diode pixel for a display includes a first subpixel including a first LED sub-unit, a second subpixel including a second LED sub-unit, a third subpixel including a third LED sub-unit, and a bonding layer overlapping the first, second, and third subpixels, in which each of the first, second, and third LED sub-units includes a first type of semiconductor layer and a second type of semiconductor layer, each of the first, second, and third LED sub-units is disposed on a different plane, and light generated from the second subpixel is configured to be emitted to an outside of the light emitting diode pixel by passing through a lesser number of LED sub-units than light generated from the first subpixel and emitted to the outside.

18 Claims, 57 Drawing Sheets

Related U.S. Application Data continuation of application No. 16/234,541, filed on Dec. 27, 2018, now Pat. No. 10,784,240.

(60) Provisional application No. 62/633,998, filed on Feb. 22, 2018, provisional application No. 62/618,576, filed on Jan. 17, 2018, provisional application No. 62/613,338, filed on Jan. 3, 2018.

(51) Int. Cl.
| | | |
|---|---|---|
| *H01L 25/13* | (2006.01) | |
| *H01L 33/40* | (2010.01) | |
| *H01L 33/50* | (2010.01) | |
| *H01L 33/00* | (2010.01) | |
| *H01L 33/20* | (2010.01) | |
| *H01L 33/62* | (2010.01) | |

(52) U.S. Cl.
CPC .......... *H01L 33/405* (2013.01); *H01L 33/505* (2013.01); *H01L 33/0093* (2020.05); *H01L 33/20* (2013.01); *H01L 33/62* (2013.01)

(58) Field of Classification Search
CPC .................. H01L 2933/00–0091; H01L 2224/48155–48165
See application file for complete search history.

(56) References Cited

U.S. PATENT DOCUMENTS

| | | | |
|---|---|---|---|
| 5,696,389 | A | 12/1997 | Ishikawa et al. |
| 5,703,436 | A | 12/1997 | Forrest et al. |
| 5,707,745 | A | 1/1998 | Forrest et al. |
| 5,739,552 | A | 4/1998 | Kimura et al. |
| 6,046,543 | A | 4/2000 | Bulovic et al. |
| 6,100,103 | A | 8/2000 | Shim et al. |
| 6,365,270 | B2 | 4/2002 | Forrest et al. |
| 6,717,358 | B1 | 4/2004 | Liao et al. |
| 6,888,305 | B2 | 5/2005 | Weaver |
| 6,934,309 | B2 | 8/2005 | Nishikawa et al. |
| 7,282,741 | B2 | 10/2007 | Kim et al. |
| 7,514,720 | B2 | 4/2009 | Kim et al. |
| 7,570,310 | B2 | 8/2009 | Harada et al. |
| 7,732,803 | B2 | 6/2010 | Shum et al. |
| 7,745,986 | B2 | 6/2010 | Ito et al. |
| 7,982,228 | B2 | 7/2011 | Choi et al. |
| 8,017,955 | B2 | 9/2011 | Wang et al. |
| 8,022,421 | B2 | 9/2011 | Hsueh et al. |
| 8,035,115 | B2 | 10/2011 | Ogihara et al. |
| 8,058,663 | B2 | 11/2011 | Fan et al. |
| 8,089,074 | B2 | 1/2012 | Kim et al. |
| 8,324,803 | B2 | 12/2012 | Forrest et al. |
| 8,390,020 | B2 | 3/2013 | Tanaka et al. |
| 8,436,346 | B2 | 5/2013 | Ushikubo et al. |
| 8,466,542 | B2 | 6/2013 | Kriman et al. |
| 8,546,836 | B2 | 10/2013 | Kamiya et al. |
| 8,563,144 | B2 | 10/2013 | Kim et al. |
| 8,618,551 | B2 | 12/2013 | Nishikawa et al. |
| 8,624,274 | B2 | 1/2014 | Hsueh et al. |
| 8,766,295 | B2 | 7/2014 | Kim |
| 8,835,948 | B2 | 9/2014 | Chang et al. |
| 8,884,316 | B2 | 11/2014 | Weaver et al. |
| 8,941,566 | B2 | 1/2015 | Haase |
| 9,006,752 | B2 | 4/2015 | So et al. |
| 9,018,834 | B2 | 4/2015 | Ide et al. |
| 9,052,096 | B2 | 6/2015 | Nishimura et al. |
| 9,076,929 | B2 | 7/2015 | Katsuno et al. |
| 9,136,498 | B2 | 9/2015 | Skipor |
| 9,142,748 | B2 | 9/2015 | Ohmae et al. |
| 9,202,994 | B2 | 12/2015 | Hashimoto et al. |
| 9,252,380 | B2 | 2/2016 | Seo et al. |
| 9,312,249 | B2 | 4/2016 | Choi et al. |
| 9,337,400 | B2 | 5/2016 | Hashimoto et al. |
| 9,362,335 | B2 | 6/2016 | Von Malm |
| 9,406,908 | B2 | 8/2016 | Kim et al. |
| 9,419,031 | B1 | 8/2016 | Or-Bach et al. |
| 9,443,833 | B2 | 9/2016 | Oraw |
| 9,515,278 | B2 | 12/2016 | Suzuki et al. |
| 9,559,263 | B2 | 1/2017 | Matsui et al. |
| 9,577,012 | B2 | 2/2017 | Ooki et al. |
| 9,748,313 | B2 | 8/2017 | Tsuji et al. |
| 9,786,817 | B2 | 10/2017 | Kim et al. |
| 9,786,859 | B2 | 10/2017 | Yamae et al. |
| 9,847,051 | B2 | 12/2017 | Choi et al. |
| 9,853,187 | B2 | 12/2017 | Kim |
| 9,893,233 | B2 | 2/2018 | Kong et al. |
| 9,905,725 | B2 | 2/2018 | Lee |
| 9,960,212 | B2 | 5/2018 | Gee et al. |
| 9,960,390 | B2 | 5/2018 | Höfle et al. |
| 9,966,369 | B2 | 5/2018 | Kim et al. |
| 10,056,535 | B2 | 8/2018 | Chang et al. |
| 10,069,036 | B2 | 9/2018 | Atanackovic |
| 10,079,265 | B1 | 9/2018 | Wu et al. |
| 10,134,813 | B2 | 11/2018 | Choi |
| 10,170,666 | B2 | 1/2019 | Cha et al. |
| 10,205,058 | B2 | 2/2019 | Lee |
| 10,304,811 | B2 | 5/2019 | Zhang et al. |
| 10,326,056 | B2 | 6/2019 | Jung et al. |
| 10,388,978 | B2 | 8/2019 | Morris-Cohen et al. |
| 10,418,577 | B2 | 9/2019 | Yoo et al. |
| 10,475,957 | B2 | 11/2019 | Cha et al. |
| 10,515,580 | B2 | 12/2019 | Henry et al. |
| 10,559,557 | B2 | 2/2020 | Chang et al. |
| 10,686,099 | B2 | 6/2020 | Huppmann et al. |
| 10,686,149 | B2 | 6/2020 | Park et al. |
| 10,811,475 | B2 | 10/2020 | Zhang et al. |
| 2002/0154259 | A1 | 10/2002 | Freidhoff et al. |
| 2003/0047742 | A1 | 3/2003 | Hen |
| 2003/0168989 | A1 | 9/2003 | Hen |
| 2003/0213967 | A1 | 11/2003 | Forrest et al. |
| 2004/0232433 | A1 | 11/2004 | Doverspike et al. |
| 2005/0067627 | A1 | 3/2005 | Shen et al. |
| 2005/0140278 | A1 | 6/2005 | Kato |
| 2005/0264550 | A1 | 12/2005 | Ohshima et al. |
| 2006/0027820 | A1 | 2/2006 | Cao |
| 2006/0231852 | A1 | 10/2006 | Kususe et al. |
| 2007/0069220 | A1 | 3/2007 | Ogihara |
| 2007/0170444 | A1 | 7/2007 | Cao |
| 2007/0222922 | A1 | 9/2007 | Jin et al. |
| 2008/0068315 | A1 | 3/2008 | Kurosaki et al. |
| 2008/0099770 | A1 | 5/2008 | Mendendorp et al. |
| 2008/0128728 | A1 | 6/2008 | Nemchuk et al. |
| 2008/0130278 | A1 | 6/2008 | Ushikubo et al. |
| 2008/0251799 | A1 | 10/2008 | Ikezawa |
| 2008/0308819 | A1 | 12/2008 | Louwsma et al. |
| 2009/0009101 | A1 | 1/2009 | Kang et al. |
| 2009/0078955 | A1 | 3/2009 | Fan et al. |
| 2009/0114931 | A1 | 5/2009 | Hsueh et al. |
| 2009/0272989 | A1 | 11/2009 | Shum et al. |
| 2010/0032691 | A1 | 2/2010 | Kim |
| 2010/0045175 | A1 | 2/2010 | Mathai et al. |
| 2010/0051975 | A1 | 3/2010 | Suzuki et al. |
| 2010/0065867 | A1 | 3/2010 | Unno |
| 2010/0066239 | A1 | 3/2010 | Spindler et al. |
| 2010/0076527 | A1 | 3/2010 | Hammond et al. |
| 2010/0084668 | A1 | 4/2010 | Choi et al. |
| 2010/0144073 | A1 | 6/2010 | Louwsma et al. |
| 2010/0159792 | A1 | 6/2010 | Visser et al. |
| 2010/0224860 | A1 | 9/2010 | Ibbetson et al. |
| 2010/0276706 | A1 | 11/2010 | Herrmann |
| 2011/0057211 | A1 | 3/2011 | Lee et al. |
| 2011/0086486 | A1 | 4/2011 | Lee et al. |
| 2011/0156114 | A1 | 6/2011 | Park et al. |
| 2011/0204376 | A1 | 8/2011 | Su et al. |
| 2011/0215714 | A1 | 9/2011 | Seo et al. |
| 2012/0034714 | A1 | 2/2012 | Tsai et al. |
| 2012/0094414 | A1 | 4/2012 | Or-Bach et al. |
| 2012/0223875 | A1 | 9/2012 | Lau et al. |
| 2012/0231572 | A1 | 9/2012 | Or-Bach et al. |
| 2012/0236532 | A1 | 9/2012 | Koo et al. |
| 2012/0305959 | A1 | 12/2012 | Yu et al. |
| 2013/0056717 | A1 | 3/2013 | Ishihara et al. |
| 2013/0069191 | A1 | 3/2013 | Or-Bach et al. |
| 2013/0264587 | A1 | 10/2013 | Chang |

(56) References Cited

U.S. PATENT DOCUMENTS

| | | |
|---|---|---|
| 2013/0285076 A1 | 10/2013 | Liu et al. |
| 2013/0292711 A1 | 11/2013 | Ogihara et al. |
| 2014/0184062 A1 | 7/2014 | Kolodin |
| 2014/0191243 A1 | 7/2014 | Singh et al. |
| 2014/0252382 A1 | 9/2014 | Hashimoto et al. |
| 2014/0284633 A1 | 9/2014 | Tsay et al. |
| 2015/0001572 A1 | 1/2015 | Katsuno et al. |
| 2015/0099728 A1 | 4/2015 | Frank et al. |
| 2015/0221627 A1 | 8/2015 | Nielson et al. |
| 2015/0325555 A1 | 11/2015 | Hashimoto et al. |
| 2015/0362165 A1 | 12/2015 | Chu et al. |
| 2016/0005375 A1 | 1/2016 | Naijo et al. |
| 2016/0043290 A1 | 2/2016 | Sogo et al. |
| 2016/0064439 A1 | 3/2016 | Or-Bach et al. |
| 2016/0099384 A1 | 4/2016 | Kim et al. |
| 2016/0155378 A1 | 6/2016 | Hack et al. |
| 2016/0155892 A1 | 6/2016 | Li et al. |
| 2016/0163940 A1 | 6/2016 | Huang et al. |
| 2016/0315068 A1* | 10/2016 | Lee ................. H01L 33/46 |
| 2016/0322293 A1 | 11/2016 | Kimura et al. |
| 2016/0336482 A1 | 11/2016 | Lu et al. |
| 2016/0359143 A1 | 12/2016 | Osawa et al. |
| 2017/0012173 A1 | 1/2017 | Lee et al. |
| 2017/0025593 A1 | 1/2017 | Bower et al. |
| 2017/0062680 A1 | 3/2017 | Yoo et al. |
| 2017/0064785 A1 | 3/2017 | Kim et al. |
| 2017/0069612 A1 | 3/2017 | Zhang et al. |
| 2017/0084876 A1 | 3/2017 | Suzuki |
| 2017/0104035 A1 | 4/2017 | Lee et al. |
| 2017/0117259 A1 | 4/2017 | Xu |
| 2017/0133357 A1 | 5/2017 | Kuo et al. |
| 2017/0162746 A1 | 6/2017 | Cha et al. |
| 2017/0194298 A1 | 7/2017 | Negley et al. |
| 2017/0194535 A1 | 7/2017 | Park et al. |
| 2017/0213502 A1 | 7/2017 | Henry et al. |
| 2017/0236866 A1* | 8/2017 | Lee ................. H05B 47/19 257/89 |
| 2017/0250329 A1 | 8/2017 | Takeya et al. |
| 2017/0286044 A1 | 10/2017 | Kim et al. |
| 2017/0331009 A1 | 11/2017 | Shioji |
| 2017/0331021 A1 | 11/2017 | Chae et al. |
| 2017/0338275 A1 | 11/2017 | Banna et al. |
| 2017/0345801 A1 | 11/2017 | Lin et al. |
| 2018/0156965 A1 | 6/2018 | El-Ghoroury et al. |
| 2018/0158808 A1 | 6/2018 | Zhang et al. |
| 2018/0233492 A1 | 8/2018 | Liu et al. |
| 2018/0240952 A1 | 8/2018 | Moon et al. |
| 2018/0283642 A1 | 10/2018 | Liao et al. |
| 2019/0053347 A1 | 2/2019 | Lee et al. |
| 2019/0074324 A1* | 3/2019 | Kim ................. H01L 33/505 |
| 2019/0097088 A1 | 3/2019 | Huppmann et al. |
| 2019/0131578 A1* | 5/2019 | Lee ................. H10K 50/856 |
| 2019/0148612 A1 | 5/2019 | Lee et al. |
| 2019/0165207 A1 | 5/2019 | Kim et al. |
| 2019/0181181 A1 | 6/2019 | Yeon et al. |
| 2019/0229149 A1 | 7/2019 | Yoo |
| 2019/0267436 A1 | 8/2019 | Zhang et al. |
| 2019/0333964 A1 | 10/2019 | Lee et al. |
| 2020/0063920 A1 | 2/2020 | Vampola |
| 2020/0212017 A1 | 7/2020 | Oh et al. |
| 2020/0212262 A1 | 7/2020 | Jang et al. |
| 2020/0219858 A1 | 7/2020 | Chang |

FOREIGN PATENT DOCUMENTS

| | | |
|---|---|---|
| CN | 102593303 | 7/2012 |
| CN | 105789237 | 7/2016 |
| CN | 106848043 | 6/2017 |
| CN | 111788690 A | 10/2020 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2004015072 A | 1/2004 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2017153123 | 9/2017 |

OTHER PUBLICATIONS

International Search Report dated Feb. 26, 2019, issued in International Application No. PCT/KR2018/014671.

Written Opinion of the International Searching Authority dated Feb. 26, 2019, issued in International Application No. PCT/KR2018/014671.

International Search Report dated Feb. 26, 2019, issued in International Application No. PCT/KR2018/014674.

Written Opinion of the International Searching Authority dated Feb. 26, 2019, issued in International Application No. PCT/KR2018/014674.

International Search Report dated Mar. 6, 2019, issued in International Application No. PCT/KR2018/014728.

Written Opinion of the International Searching Authority dated Mar. 6, 2019, issued in International Application No. PCT/KR2018/014728.

International Searching Report dated Mar. 6, 2019, issued in International Application No. PCT/KR2018/014734.

Written Opinion of the International Searching Authority dated Mar. 6, 2019, issued in International Application No. PCT/KR2018/014734.

International Search Report dated Mar. 6, 2019, issued in International Application No. PCT/KR2018/014672.

Written Opinion of the International Searching Authority dated Mar. 6, 2019, issued in International Application No. PCT/KR2018/014672.

International Search Report dated Apr. 3, 2019, issued in International Application No. PCT/KR2018/015268.

(56) References Cited

OTHER PUBLICATIONS

Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Nov. 7, 2019, in U.S. Appl. No. 16/207,881.
Non-Final Office Action dated Oct. 31, 2019, in U.S. Appl. No. 16/198,850.
Non-Final Office Action dated Nov. 4, 2019, in U.S. Appl. No. 16/198,784.
Ex Parte Quayle Action issued on Nov. 19, 2019, in U.S. Appl. No. 16/198,796.
Non-Final Office Action dated Oct. 24, 2019, in U.S. Appl. No. 16/228,621.
Non-Final Office Action dated Jan. 9, 2020, in U.S. Appl. No. 16/673,184.
Notice of Allowance dated Mar. 31, 2020, in U.S. Appl. No. 16/234,541.
Non-Final Office Action dated Mar. 23, 2020, in U.S. Appl. No. 16/219,716.
Non-Final Office Action dated Apr. 15, 2020, in U.S. Appl. No. 16/198,873.
Final Office Action dated Apr. 20, 2020, in U.S. Appl. No. 16/228,621.
Notice of Allowance dated Mar. 12, 2020, in U.S. Appl. No. 16/198,784.
Notice of Allowance dated Feb. 10, 2020, in U.S. Appl. No. 16/198,796.
Non-Final Office Action dated Mar. 5, 2020, in U.S. Appl. No. 16/228,601.
Non-Final Office Action dated Nov. 19, 2019, in U.S. Appl. No. 16/198,792.
Notice of Allowance dated Apr. 9, 2020, in U.S. Appl. No. 16/198,792.
Final Office Action dated May 29, 2020, in U.S. Appl. No. 16/198,850.
Non-Final Office Action dated Jun. 24, 2020, in U.S. Appl. No. 16/236,737.
Final Office Action dated Jun. 25, 2020, in U.S. Appl. No. 16/228,601.
Final Office Action dated Jul. 23, 2020, in U.S. Appl. No. 16/673,184.
Notice of Allowance for U.S. Appl. No. 16/198,796 dated Aug. 26, 2020.
Non-Final Office Action for U.S. Appl. No. 16/673,114 dated Sep. 3, 2020.
Notice of Allowance for U.S. Appl. No. 16/219,716 dated Sep. 3, 2020.
Non-Final Office Action for U.S. Appl. No. 16/200,036 dated Sep. 24, 2020.
Non-Final Office Action for U.S. Appl. No. 16/228,621 dated Sep. 29, 2020.
Final Office Action for U.S. Appl. No. 16/198,873 dated Oct. 15, 2020.
Notice of Allowance for U.S. Appl. No. 16/236,737 dated Oct. 28, 2020.
Non-Final Office Action for U.S. Appl. No. 16/198,784 dated Nov. 19, 2020.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.
Non-Final Office Action dated Mar. 18, 2021 in U.S. Appl. No. 16/228,601.
Final Office Action dated Mar. 25, 2021 in U.S. Appl. No. 16/200,036.
Non-Final Office Action dated Apr. 7, 2021, in U.S. Appl. No. 16/915,384.
Non-Final Office Action dated Apr. 15, 2021, in U.S. Appl. No. 16/673,184.
Final Office Action dated Apr. 21, 2021, in U.S. Appl. No. 16/198,784.
Notice of Allowance dated Aug. 26, 2021, in U.S. Appl. No. 16/789,877.
Notice of Allowance dated Jul. 12, 2021, in U.S. Appl. No. 16/198,784.
Non-Final Office Action dated Jul. 8, 2021, in U.S. Appl. No. 16/228,621.
Non-Final Office Action dated Jun. 10, 2021, in U.S. Appl. No. 16/198,873.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 14, 2021, in European Patent Application No. 18881496.6.
Notice of Allowance dated Sep. 14, 2021, in U.S. Appl. No. 16/899,522.
Notice of Allowance dated Sep. 22, 2021, in U.S. Appl. No. 16/200,036.
Final Office Action dated Sep. 27, 2021, in U.S. Appl. No. 16/915,384.
Extended European Search Report dated Sep. 29, 2021, in European Patent Application No. 18891199.4.
Final Office Action dated Sep. 30, 2021, in U.S. Appl. No. 16/228,601.
Final Office Action dated Sep. 30, 2021, in U.S. Appl. No. 16/198,850.
Extended European Search Report dated Oct. 5, 2021, in European Patent Application No. 18882087.2.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal drafted on Sep. 14, 2021, in Japanese Patent Application No. 2020-532747.
Final Office Action dated Dec. 2, 2021, in U.S. Appl. No. 16/228,621.
Notice of Allowance dated Dec. 9, 2021, in U.S. Appl. No. 16/915,384.
Final Office Action dated Dec. 24, 2021, in U.S. Appl. No. 16/198,873.
Final Office Action dated Nov. 12, 2021, in U.S. Appl. No. 16/673,184.
Non-Final Office Action dated Jan. 21, 2022, in U.S. Appl. No. 16/673,114.

(56) References Cited

OTHER PUBLICATIONS

Notice of Allowance issued in U.S. Appl. No. 16/228,621 dated Feb. 17, 2022.
Notice of Allowance issued in U.S. Appl. No. 16/673,184 dated Mar. 15, 2022.
Notice of Allowance issued in U.S. Appl. No. 16/198,873 dated Mar. 16, 2022.
Notice of Allowance issued in U.S. Appl. No. 16/228,601 dated Mar. 17, 2022.
Notice of Allowance issued in U.S. Appl. No. 16/198,850 dated Mar. 30, 2022.
Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Extended European Search Report issued in European Patent Application 18886954.9 dated Aug. 3, 2021.
Examination Report issued in Indian Patent Application 202037026094 dated Mar. 28, 2022.
Notice of Allowance issued in U.S. Appl. No. 16/915,384 dated Apr. 21, 2022.
Non-Final Office Action dated May 11, 2022, in U.S. Appl. No. 17/164,829.
Notice of Allowance issued in U.S. Appl. No. 16/228,621 dated Jun. 15, 2022.
Substantive Examination Report Notice dated Jun. 15, 2022, in Saudi Arabian Patent Application No. 520412046.
Notice of Allowance issued in U.S. Appl. No. 16/673,184 dated Jun. 23, 2022.
Office Action dated Jul. 5, 2022 for Japanese Patent Application No. 2020-536804(with English Translation).
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873 dated Aug. 9, 2022.
Notice of Allowance issued in U.S. Appl. No. 16/228,601 dated Aug. 9, 2022.
Non-Final Office Action dated Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 dated Sep. 26, 2022.
Office Action dated Oct. 23, 2023 in corresponding Chinese Patent Application No. 201911320177.9 (with English-language Translation), 24 pages.
Office Action dated Oct. 23, 2023in corresponding Chinese Patent Application No. 201911320178.3 (with English-language Translation), 16 pages.

\* cited by examiner

LIGHT EMITTING DEVICE WITH LED STACK FOR DISPLAY AND DISPLAY APPARATUS HAVING THE SAME

CROSS REFERENCE TO RELATED APPLICATIONS

This application is a Continuation of U.S. patent application Ser. No. 16/988,272, filed on Aug. 7, 2020, which is a Continuation of U.S. patent application Ser. No. 16/234,541, filed on Dec. 27, 2018, now issued as U.S. Pat. No. 10,784,240, which claims priority form and the benefit of U.S. Provisional Application No. 62/613,338, filed on Jan. 3, 2018, U.S. Provisional Application No. 62/618,576, filed on Jan. 17, 2018, and U.S. Provisional Application No. 62/633,998, filed on Feb. 22, 2018, which are hereby incorporated by reference for all purposes as if fully set forth herein.

BACKGROUND

Field

Exemplary embodiments of the invention relate to a light emitting diode pixel and a display apparatus including the same and, more particularly, to a micro light emitting diode pixel having a stacked structure and a display apparatus having the same.

Discussion of the Background

As an inorganic light source, light emitting diodes have been used in various technical fields, such as displays, vehicular lamps, general lighting, and the like. With advantages of long lifespan, low power consumption, and high response speed, light emitting diodes have been rapidly replacing existing light sources.

Light emitting diodes have been mainly used as a backlight light source in a display apparatus. However, micro-LED displays have been recently developed as a next generation display that are capable of implementing an image directly using the light emitting diodes.

In general, a display apparatus implements various colors by using mixed colors of blue, green, and red light. The display apparatus includes pixel each having subpixels that correspond to blue, green, and red colors, and a color of a certain pixel may be determined based on the colors of the sub-pixels therein, and an image can be displayed through combination of the pixels.

In a micro-LED display, micro-LEDs corresponding to each subpixel are arranged on a two-dimensional plane. Therefore, a large number of micro LEDs are required to be disposed on one substrate. However, the micro-LED has a very small size with a surface area of about 10,000 square m or less, and thus, there are various problems due to this small size. In particular, it is difficult to mount the micro-LEDs on a display panel due to its small size, especially as over hundreds of thousands or million are required.

The above information disclosed in this Background section is only for understanding of the background of the inventive concepts, and, therefore, it may contain information that does not constitute prior art.

SUMMARY

Light emitting stacked structures constructed according to the principles and some exemplary implementations of the invention are capable of being manufactured simultaneously, and thus, may obviate the step of individually mounting each light emitting diode corresponding to a subpixel on a display panel.

Light emitting diodes and a display using the light emitting diodes, e.g., micro LEDs, constructed according to the principles and some exemplary implementations of the invention are capable of being manufactured at the wafer level through wafer bonding.

Additional features of the inventive concepts will be set forth in the description which follows, and in part will be apparent from the description, or may be learned by practice of the inventive concepts.

A light emitting diode pixel for a display according to an exemplary embodiment includes a first subpixel, a second subpixel, and a third subpixel, each of the first, second, and third subpixels including a first LED sub-unit including a first type of semiconductor layer and a second type of semiconductor layer, a second LED sub-unit disposed on the first LED sub-unit and including a first type of semiconductor layer and a second type of semiconductor layer, and a third LED sub-unit disposed on the second LED sub-unit and including a first type of semiconductor layer and a second type of semiconductor layer, in which the second and third LED sub-units of the first subpixel are electrically floated, the first and third LED sub-units of the second subpixel are electrically floated, and the first and second LED sub-units of the third subpixel are electrically floated.

The first LED sub-units of the first, second, and third subpixels may be separated from each other, the second LED sub-units of the first, second, and third subpixels may be separated from each other, and the third LED sub-units of the first, second, and third subpixels may be separated from each other, each of the first LED sub-unit of the first subpixel, the second LED sub-unit of the second subpixel, and the third LED sub-unit of the third subpixel may be configured to emit light, light generated from the first LED sub-unit of the first subpixel may be configured to be emitted to the outside of the light emitting diode pixel through the second and third LED sub-units of the first subpixel, light generated from the second LED sub-unit of the second subpixel may be configured to be emitted to the outside of the light emitting diode pixel through third LED sub-unit of the second subpixel.

The first LED sub-unit of the first subpixel, the second LED sub-unit of the second subpixel, and the third LED sub-unit of the third subpixel may include a first LED stack, a second LED stack, and a third LED stack configured to emit red light, green light, and blue light, respectively.

The first subpixel may further include a first upper ohmic electrode forming ohmic contact with the first type of semiconductor layer of the first LED sub-unit, and a first lower ohmic electrode forming ohmic contact with the second type of semiconductor layer of the first LED sub-unit, the second subpixel may further include a second upper ohmic electrode forming ohmic contact with the first type of semiconductor layer of the second LED sub-unit, and a second lower ohmic electrode forming ohmic contact with the second type of semiconductor layer of the second LED sub-unit, and the third subpixel may further include a third upper ohmic electrode forming ohmic contact with the first type of semiconductor layer of the third LED sub-unit, and a third lower ohmic electrode forming ohmic contact with the second type of semiconductor layer of the third LED sub-unit.

The first upper ohmic electrode may be electrically separated from the first LED sub-units of the second and third subpixels, the second upper ohmic electrode may be electrically separated from the second LED sub-units of the first and third subpixels, and the third upper ohmic electrode may be electrically separated from the third LED sub-units of the first and second subpixels.

The first lower ohmic electrode may include a reflection layer configured to reflect light generated from the first LED sub-unit of the first subpixel, and each of the second lower ohmic electrode and the third lower ohmic electrode may be transparent.

The first lower ohmic electrode may form ohmic contact with the first LED sub-units of the first, second, and third subpixels.

Each of the first, second, and third subpixels may further include a first color filter interposed between the first LED sub-unit and the second LED sub-unit to transmit light generated from the first LED sub-unit of the first subpixel and reflect light generated from the second LED sub-unit of the second subpixel, and a second color filter interposed between the second LED sub-unit and the third LED sub-unit to transmit light generated from the first LED sub-unit of the first subpixel and light generated from the second LED sub-unit of the second subpixel and reflect light generated from the third LED sub-unit of the third subpixel.

Each of the first color filter and the second color filter may include at least one of a low pass filter, a band pass filter, and a band stop filter.

The light emitting diode pixel may further include a support substrate, in which each of the first, second, and third subpixels may further include a first bonding layer interposed between the support substrate and the first LED sub-unit, a second bonding layer interposed between the first LED sub-unit and the second LED sub-unit, and a third bonding layer interposed between the second LED sub-unit and the third LED sub-unit, the second bonding layer may be transparent to light generated from the first LED sub-unit of the first subpixel, the third bonding layer may be transparent to light generated from the first LED sub-unit of the first subpixel and light generated from the second LED sub-unit of the second subpixel.

The light emitting diode pixel may further include a light blocking layer surrounding the first, second, and third subpixels.

The light blocking layer may include at least one of a light reflective white material or a light absorptive black material.

The first LED sub-unit of the first subpixel, the second LED sub-unit of the second subpixel, and the third LED sub-unit of the third subpixel may have different areas from each other.

The first, second, and third subpixels may include a micro LED having a surface area less than about 10,000 square μm, the first LED sub-unit may be configured to emit any one of red, green, and blue light, the second LED sub-unit may be configured to emit one of red, green, and blue light different from the first LED sub-unit, and the third LED sub-unit may be configured to emit one of red, green, and blue light different from the first and second LED sub-units.

At least one of the first and second type of semiconductor layers of the electrically floated LED sub-units may not be connected any ohmic electrode.

A display apparatus according to an exemplary embodiment includes a plurality of pixels disposed on a support substrate, at least one of the pixels may include a light emitting diode pixel for display including a first subpixel, a second subpixel, and a third subpixel, each of the first, second, and third subpixels including a first LED sub-unit including a first type of semiconductor layer and a second type of semiconductor layer, a second LED sub-unit disposed on the first LED sub-unit and including a first type of semiconductor layer and a second type of semiconductor layer, and a third LED sub-unit disposed on the second LED sub-unit and including a first type of semiconductor layer and a second type of semiconductor layer, in which the second and third LED sub-units of the first subpixel are electrically floated, the first and third LED sub-units of the second subpixel are electrically floated, and the first and second LED sub-units of the third subpixel are electrically floated.

The second type of semiconductor layer of the first LED sub-unit of the first subpixel, the second type of semiconductor layer of the second LED sub-unit of the second subpixel, and the second type of semiconductor layer of the third LED sub-unit of the third subpixel may be electrically connected to a common line, and the first type of semiconductor layer of the first LED sub-unit of the first subpixel, the first type of semiconductor layer of the second LED sub-unit of the second subpixel, and the first type of semiconductor layer of the third LED sub-unit of the third subpixel may be electrically connected to different lines.

The first lower ohmic electrode may be commonly disposed under the first, second, and third subpixels, and the second type of semiconductor layer of the second LED sub-unit of the second subpixel and the second type of semiconductor layer of the third LED sub-unit of the third subpixel may be electrically connected to the first lower ohmic electrode.

The first lower ohmic electrode may include a reflective electrode.

The reflective electrode may be continuously disposed over the plurality of pixels and may include the common line.

Each of the first upper ohmic electrode, the second upper ohmic electrode, and the third upper ohmic electrode may include a pad and a projection.

In each pixel, the first LED sub-unit of the first subpixel, the second LED sub-unit of the second subpixel, and the third LED sub-unit of the third subpixel may have different areas from each other.

A light emitting diode pixel for a display according to an exemplary embodiment includes a support substrate, a first subpixel, a second subpixel, and a third subpixel, each of which is disposed on the support substrate and separated from each other in a horizontal direction, each of the first, second, and third subpixels being configured to emit light having first, second, and third wavelengths, respectively, and including a first LED sub-unit including a first type of semiconductor layer and a second type of semiconductor layer, a second LED sub-unit disposed on the first LED sub-unit and including a first type of semiconductor layer and a second type of semiconductor layer, and a third LED sub-unit disposed on the second LED sub-unit and including a first type of semiconductor layer and a second type of semiconductor layer, in which the first subpixel is configured to emit light from the first LED sub-unit thereof, the second subpixel is configured to emit light from the second LED sub-unit thereof, and the third subpixel is configured to emit light from the third LED sub-unit thereof.

A light emitting diode pixel for a display according to an exemplary embodiment includes a first subpixel including a first LED sub-unit, a second subpixel including a second LED sub-unit, and a third subpixel including a third LED sub-unit, in which each of the first, second, and third LED sub-units includes a first type of semiconductor layer and a second type of semiconductor layer, and the first, second, and third LED sub-units are separated from each other in a first direction, disposed at different planes from each other, and do not overlap each other in the first direction.

The first LED sub-unit, the second LED sub-unit, and the third LED sub-unit may include a first LED stack, a second LED stack, and a third LED stack configured to emit light having a different wavelength from each other, respectively.

The second and third subpixels may further include at least one bonding layer disposed under the second and third LED sub-units, respectively.

The number of bonding layers disposed under the second LED sub-unit may be greater than the number of bonding layers disposed under the third LED sub-unit.

The first and second subpixels may further include at least one bonding layer disposed at an upper side of the first LED sub-unit and the second LED sub-unit, respectively.

At least two bonding layers may be disposed in an upper region of the first LED sub-unit.

The first subpixel may further include a first lower ohmic electrode having a reflective layer and disposed under the first LED sub-unit to form ohmic contact with the second type of semiconductor layer of the first LED sub-unit.

The reflective layer may extend to overlap the second LED sub-unit and the third LED sub-unit.

The second type of semiconductor layer of the second LED sub-unit and the second type of semiconductor layer of the third LED sub-unit may be commonly electrically connected to the first lower ohmic electrode.

The first subpixel may further include a first upper ohmic electrode forming ohmic contact with the first type of semiconductor layer of the first LED sub-unit, the second subpixel may further include a second upper ohmic electrode forming ohmic contact with the first type of semiconductor layer of the second LED sub-unit, and a second lower ohmic electrode forming ohmic contact with the second type of semiconductor layer of the second LED sub-unit, the third subpixel may further include a third upper ohmic electrode forming ohmic contact with the first type of semiconductor layer of the third LED sub-unit, and a third lower ohmic electrode forming ohmic contact with the second type of semiconductor layer of the third LED sub-unit, and the second lower ohmic electrode and the third lower ohmic electrode may be electrically connected to the first lower ohmic electrode.

Each of the second lower ohmic electrode and the third lower ohmic electrode may be transparent.

The light emitting diode pixel may further include a support substrate on which the first, second, and third subpixels are disposed, and a bonding layer interposed between the reflective layer and the support substrate.

The light emitting diode pixel may further include a light blocking layer surrounding side surfaces of the first, second, and third subpixels.

The light blocking layer may include at least one of a light reflective white material and a light absorptive black material.

The first LED sub-unit, the second LED sub-unit, and the third LED sub-unit may have different areas from each other.

A display apparatus may include a plurality of pixels arranged on a support substrate, at least one of the pixel may include the light emitting diode pixel according to an exemplary embodiment.

The second type of semiconductor layer of the first LED sub-unit, the second type of semiconductor layer of the second LED sub-unit, and the second type of semiconductor layer of the third LED sub-unit may be electrically connected to a common line, and the first type of semiconductor layer of the first LED sub-unit, the first type of semiconductor layer of the second LED sub-unit, and the first type of semiconductor layer of the third LED sub-unit may be electrically connected to different lines.

The first subpixel may further include a first upper ohmic electrode forming ohmic contact with the first type of semiconductor layer of the first LED sub-unit, and a first lower ohmic electrode forming ohmic contact with the second type of semiconductor layer of the first LED sub-unit, the second subpixel may further include a second upper ohmic electrode forming ohmic contact with the first type of semiconductor layer of the second LED sub-unit, and a second lower ohmic electrode forming ohmic contact with the second type of semiconductor layer of the second LED sub-unit, and the third subpixel may further include a third upper ohmic electrode forming ohmic contact with the first type of semiconductor layer of the third LED sub-unit, and a third lower ohmic electrode forming ohmic contact with the second type of semiconductor layer of the third LED sub-unit.

The first lower ohmic electrode may be commonly disposed under the first, second, and third subpixels, and the second type of semiconductor layer of the second LED sub-unit and the second type of semiconductor layer of the third LED sub-unit may be electrically connected to the first lower ohmic electrode.

The first lower ohmic electrode may include a reflective electrode.

The reflective electrode may be continuously disposed over the plurality of pixels and may include the common line.

Each of the first upper ohmic electrode, the second upper ohmic electrode, and the third upper ohmic electrode may include a pad and a projection.

In each pixel, the first LED sub-unit, the second LED sub-unit, and third LED sub-unit may have different areas from each other.

A light emitting diode pixel for a display according to an exemplary embodiment includes a first subpixel including a first LED sub-unit, a second subpixel including a first LED sub-unit and a second LED sub-unit disposed thereon, and a third subpixel including a first LED sub-unit, a second LED sub-unit, and a third LED sub-unit sequentially disposed thereon, in which each of the first, second, and third LED sub-units includes a first type of semiconductor layer and a second type of semiconductor layer, the second LED sub-unit of the second subpixel is separated from the second LED sub-unit of the third subpixel, and the first LED sub-unit of the first subpixel is separated from the first LED sub-units of the second and third subpixels.

The first LED sub-units of the second and third subpixels, and the second LED sub-unit of the third subpixel may be electrically floated.

The first LED sub-unit of the first subpixel, the second LED sub-unit of the second subpixel, and the third LED sub-unit of the third subpixel may be configured to emit light having different wavelengths.

Light generated from the first LED sub-unit of the first subpixel may be configured to be emitted to the outside of the light emitting diode pixel without passing through the second LED sub-unit, and light generated from the second LED sub-unit of the second subpixel may be configured to be emitted to the outside of the light emitting diode pixel without passing through the third LED sub-unit.

The light emitting diode pixel may further include an insulation layer covering the first, second, and third subpixels, the insulation layer adjoining an upper surface of the first LED sub-unit of the first subpixel, an upper surface of the second LED sub-unit of the second subpixel, and an upper surface of the third LED sub-unit of the third subpixel.

The second subpixel may further include a first reflection layer interposed between the first LED sub-unit and the second LED sub-unit, and the third subpixel may further include a second reflection layer interposed between the first LED sub-unit and the second LED sub-unit, and a third reflection layer interposed between the second LED sub-unit and the third LED sub-unit.

The second subpixel may further include a first bonding layer interposed between the first reflection layer and the first LED sub-unit, and the third subpixel may further include a second bonding layer interposed between the second reflection layer and the first LED sub-unit, and a third bonding layer interposed between the third reflection layer and the second LED sub-unit.

Each of the first, second, and third bonding layers may include metal.

The second subpixel may further include an insulation layer insulating the first LED sub-unit from the first bonding layer, and the third subpixel may further include insulation layers insulating the first LED sub-unit and the second LED sub-unit from the second and third bonding layers, respectively.

The first subpixel may further include a first upper ohmic electrode contacting the first type of semiconductor layer of the first LED sub-unit, and a first lower ohmic electrode contacting the second type of semiconductor layer of the first LED sub-unit, the second subpixel may further include a second upper ohmic electrode contacting the first type of semiconductor layer of the second LED sub-unit, and a second lower ohmic electrode contacting the second type of semiconductor layer of the second LED sub-unit, and the third subpixel may further include a third upper ohmic electrode contacting the first type of semiconductor layer of the third LED sub-unit, and a third lower ohmic electrode contacting the second type of semiconductor layer of the third LED sub-unit.

The first lower ohmic electrode may include a reflection layer commonly disposed under the first, second, and third subpixels, and the first lower ohmic electrode, the second lower ohmic electrode, and the third lower ohmic electrode may be electrically connected to a common line.

At least one of the LED sub-units in the second subpixel and the third subpixel may not be configured to emit light.

The first LED sub-unit of the first subpixel, the second LED sub-unit of the second subpixel, and the third LED sub-unit of the third subpixel may have different areas from each other.

The light emitting diode pixel may further include a light blocking layer surrounding side surfaces of the first LED sub-unit, the second LED sub-unit, and the third LED sub-unit.

Only one of the first LED sub-units of the first, second, and third subpixels may be configured to emit light.

Light may be configured to be emitted from substantially different planes in the first, second, and third subpixels.

A display apparatus may include a support substrate, and a plurality of pixels disposed on the support substrate, at least one of the pixels may include the light emitting diode pixel according to an exemplary embodiment.

The second type of semiconductor layer of the first LED sub-unit of the first subpixel, the second type of semiconductor layer of the second LED sub-unit of the second subpixel, and the second type of semiconductor layer of the third LED sub-unit of the third subpixel may be electrically connected to a common line, and the first type of semiconductor layer of the first LED sub-unit of the first subpixel, the first type of semiconductor layer of the second LED sub-unit of the second subpixel, and the first type of semiconductor layer of the third LED sub-unit of the third subpixel may be electrically connected to different lines from each other.

The light emitting diode pixel may further include a first lower ohmic electrode forming ohmic contact with the second type of semiconductor layer of the first subpixel, in which the first lower ohmic electrode may include a reflection layer disposed between the first LED sub-unit and the support substrate.

The first lower ohmic electrode may be continuously disposed over the plurality of pixels.

The first LED sub-unit of the first subpixel, the second LED sub-unit of the second subpixel, and the third LED sub-unit of the third subpixel may have different areas.

The light emitting diode pixel may further include a light blocking layer covering side surfaces of the first, second, third LED sub-units.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
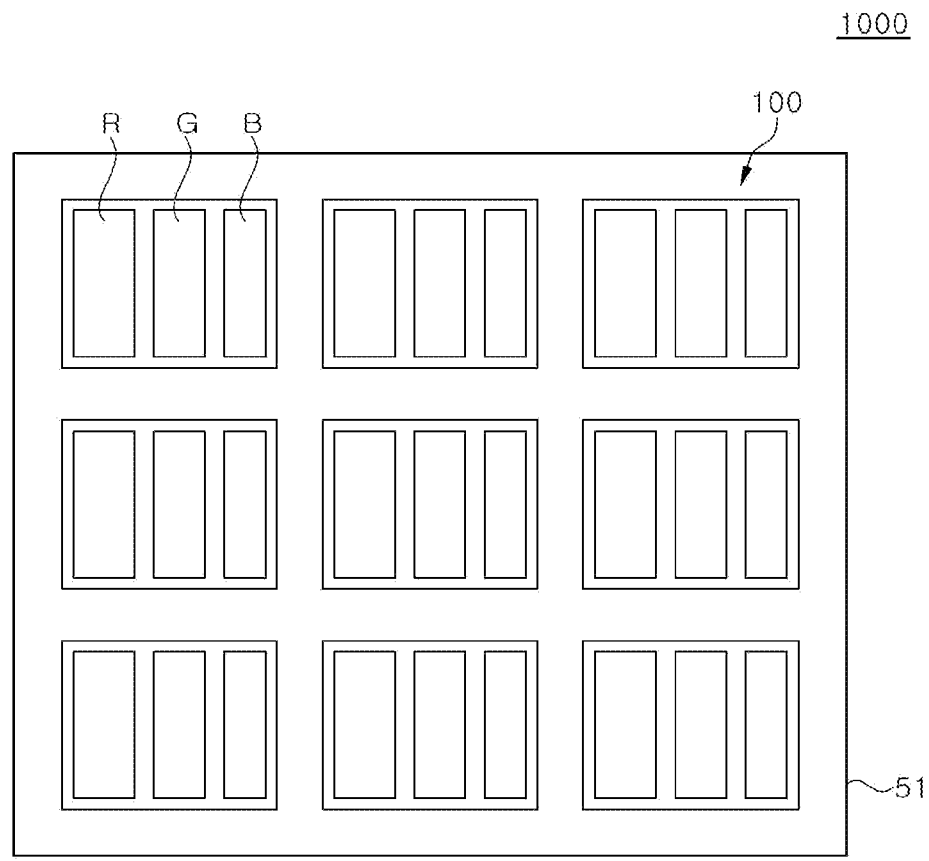
FIG. 1 is a schematic plan view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings. As used herein, a light emitting diode pixel or a light emitting diode according to exemplary embodiments may include a micro LED, which has a surface area less than about 10,000 square µm as known in the art. In other exemplary embodiments, the micro LED's may have a surface area of less than about 4,000 square µm, or less than about 2,500 square µm, depending upon the particular application.

Figure 2:
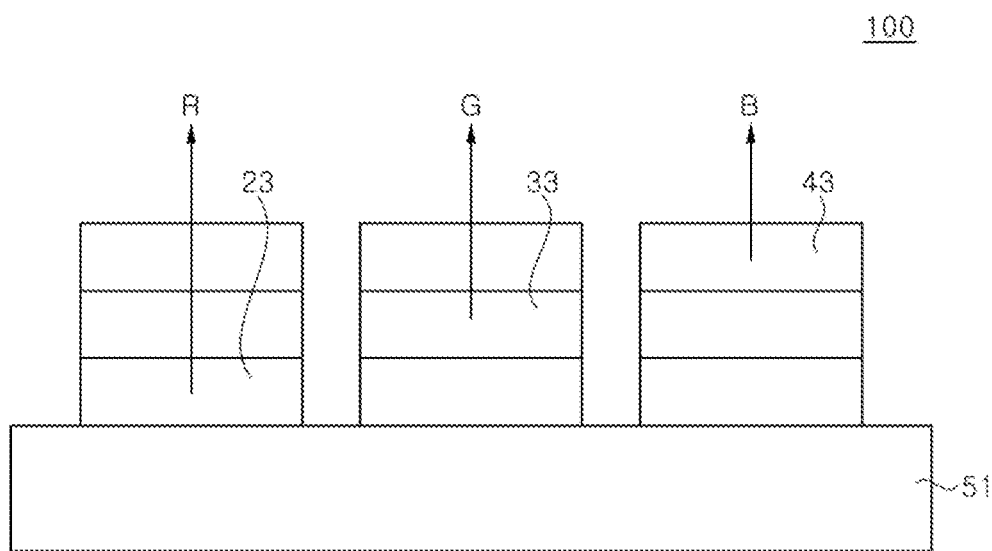
FIG. 2 is a schematic cross-sectional view of a light emitting diode pixel for a display according to an exemplary embodiment.

FIG. 1 is a schematic plan view of a display apparatus according to an exemplary embodiment, and FIG. 2 is a schematic cross-sectional view of a light emitting diode pixel for a display according to an exemplary embodiment.

Referring to FIG. 1, the display apparatus 1000 includes a support substrate 51 and a plurality of pixels 100 arranged on the support substrate 51. Each of the pixels 100 includes first, second, and third subpixels R, G, B.

Referring to FIG. 2, the support substrate 51 supports LED stacks 23, 33, 43. The support substrate 51 may include a circuit on a surface thereof or therein, but is not limited thereto. The support substrate 51 may include, for example, a sapphire substrate, a glass substrate, a Si substrate, or a Ge substrate.

Each of the first to third subpixels R, G, B includes the first LED stack 23, the second LED stack 33, and the third LED stack 43. Each of the first LED stack 23, the second LED stack 33, and the third LED stack 43 includes an n-type semiconductor layer, a p-type semiconductor layer, and an active layer interposed therebetween. The active layer may have a multi-quantum well layer structure.

According to an exemplary embodiment, the first LED stack 23 may be an inorganic light emitting diode emitting red light, the second LED stack 33 may be an inorganic light emitting diode emitting green light, and the third LED stack 43 may be an inorganic light emitting diode emitting blue light. The first LED stack 23 may include a GaInP-based well layer, and the second LED stack 33 and the third LED stack 43 may include GaInN-based well layers.

The first subpixel R is adapted to emit light from the first LED stack 23, the second subpixel G is adapted to emit light from the second LED stack 33, and the third subpixel B is adapted to emit light from the third LED stack 43. The first to third LED stacks 23, 33, 43 can be independently driven.

The second LED stack 33 and the third LED stack 43 of the first subpixel R are electrically floated, the first LED stack 23 and the third LED stack 43 of the second subpixel G are electrically floated, and the first LED stack 23 and the second LED stack 33 of the third subpixel B are electrically floated. Since the electrically floated LED stacks in each subpixel are isolated and separated from a current path through which electric current is supplied from the outside, the electrically floated LED stacks cannot be driven. As such, the floated LED stacks may be dummy stacks that planarize upper surface of each of the subpixels R, G, B to be substantially flush with each other.

As shown in FIG. 2, light generated from the first LED stack 23 of the first subpixel R is emitted outside through the second LED stack 33 and the third LED stack 43. In addition, light generated from the second LED stack 33 of the second subpixel G is emitted outside through the third LED stack 43. In addition, light generated from the third LED stack 43 of the third subpixel B may be emitted outside without passing through the first and second LED stacks 23 and 33. However, the inventive concepts are not limited thereto. When the light emitting diode pixel includes a micro LED, which has a surface area less than about 10,000 square µm as known in the art, or less than about 4,000 square µm or 2,500 square µm in other exemplary embodiments, the first epitaxial stack 20 may emit any one of red, green, and blue light, and the second and third epitaxial stacks 30 and 40 may emit a different one of red, green, and blue light, without adversely affecting operation, due to the small form factor of a micro LED.

Figure 3:
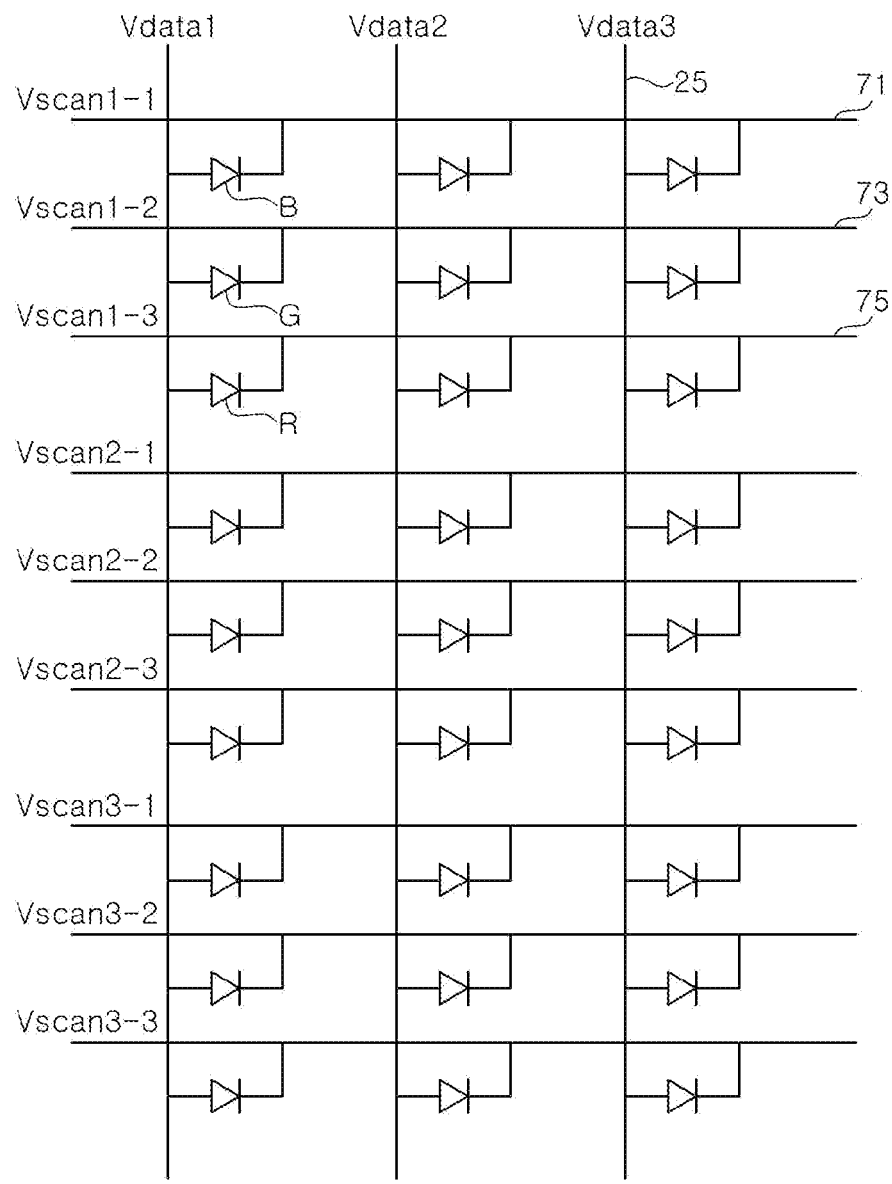
FIG. 3 is a schematic circuit diagram of a display apparatus according to an exemplary embodiment.

FIG. 3 is a schematic circuit diagram of a display apparatus according to an exemplary embodiment.

Referring to FIG. 3, the display apparatus according to an exemplary embodiment may be driven in a passive matrix manner. As described with reference to FIG. 1 and FIG. 2, one pixel includes first to third subpixels R, G, B. The first LED stack 23 of the first subpixel R emits light having a first wavelength, the second LED stack 33 of the second subpixel G emits light having a second wavelength, and the third LED stack 43 of the third subpixel B emits light having a third wavelength. Anodes of the first to third subpixels R, G, B may be connected to a common line, for example, a data line Vdata 25, and cathodes thereof may be connected to different lines, for example, scan lines Vscan 71, 73, 75.

For example, in the first pixel, the anodes of the first to third subpixels R, G, B are commonly connected to the data line Vdata1 and the cathodes thereof are connected to scan lines Vscan1-1, Vscan1-2, Vscan1-3, respectively. Accordingly, the subpixels R, G, B in the same pixel can be individually driven.

In addition, each of the LED stacks 23, 33, 43 in each of the subpixels R, G, B may be driven by pulse width modulation or by changing the magnitude of electric current to control the brightness of each subpixel. Alternatively, brightness may be adjusted through adjustment of the areas of the first to third LED stacks 23, 33, 43. For example, the first subpixel R that may emit red light having low visibility may be formed to have a larger area than the second subpixel G or the third subpixel B.

Figure 4:
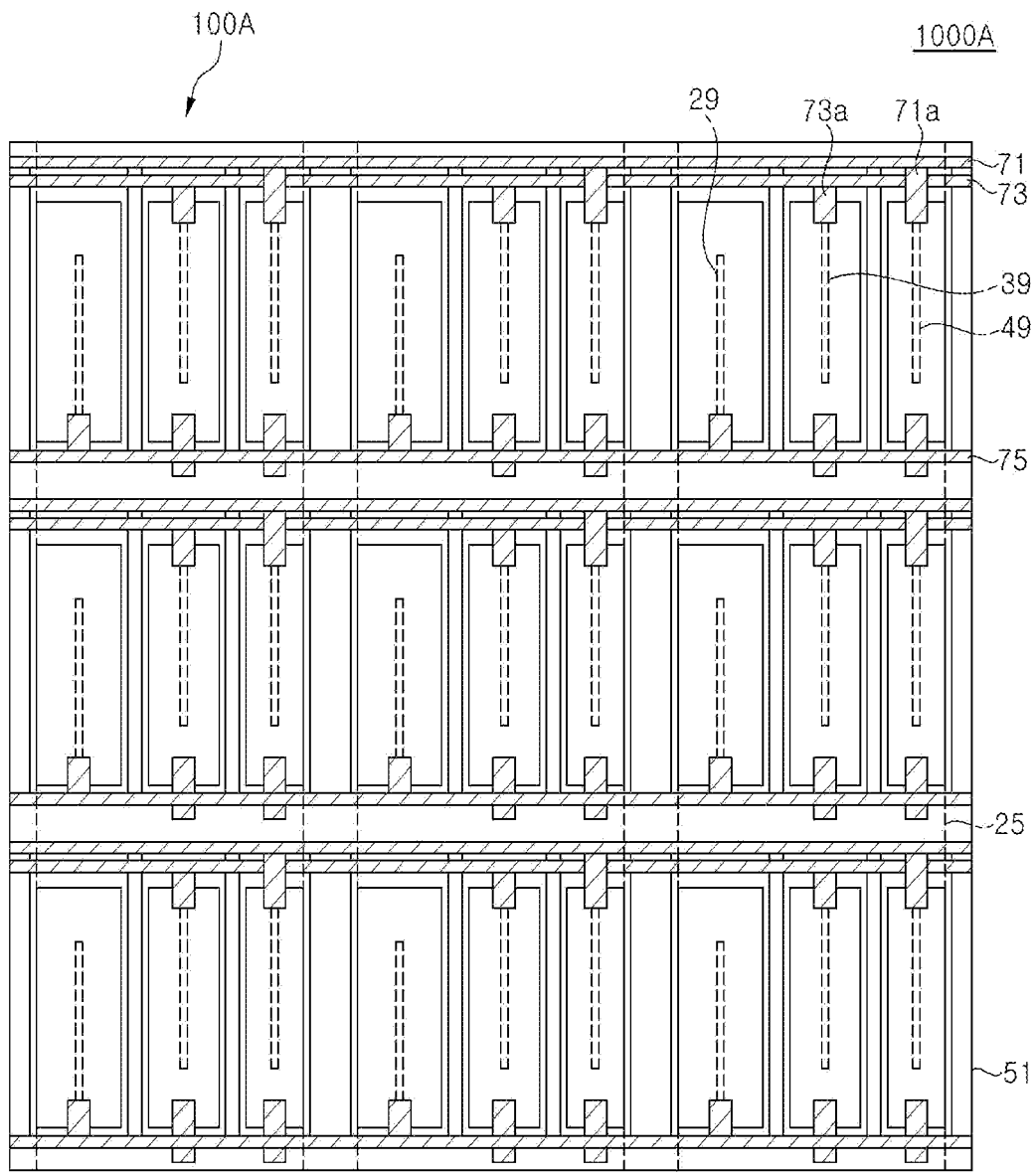
FIG. 4 is a schematic plan view of a display apparatus according to an exemplary embodiment.

FIG. 4 is a schematic plan view of a display apparatus according to an exemplary embodiment.

Figure 5:
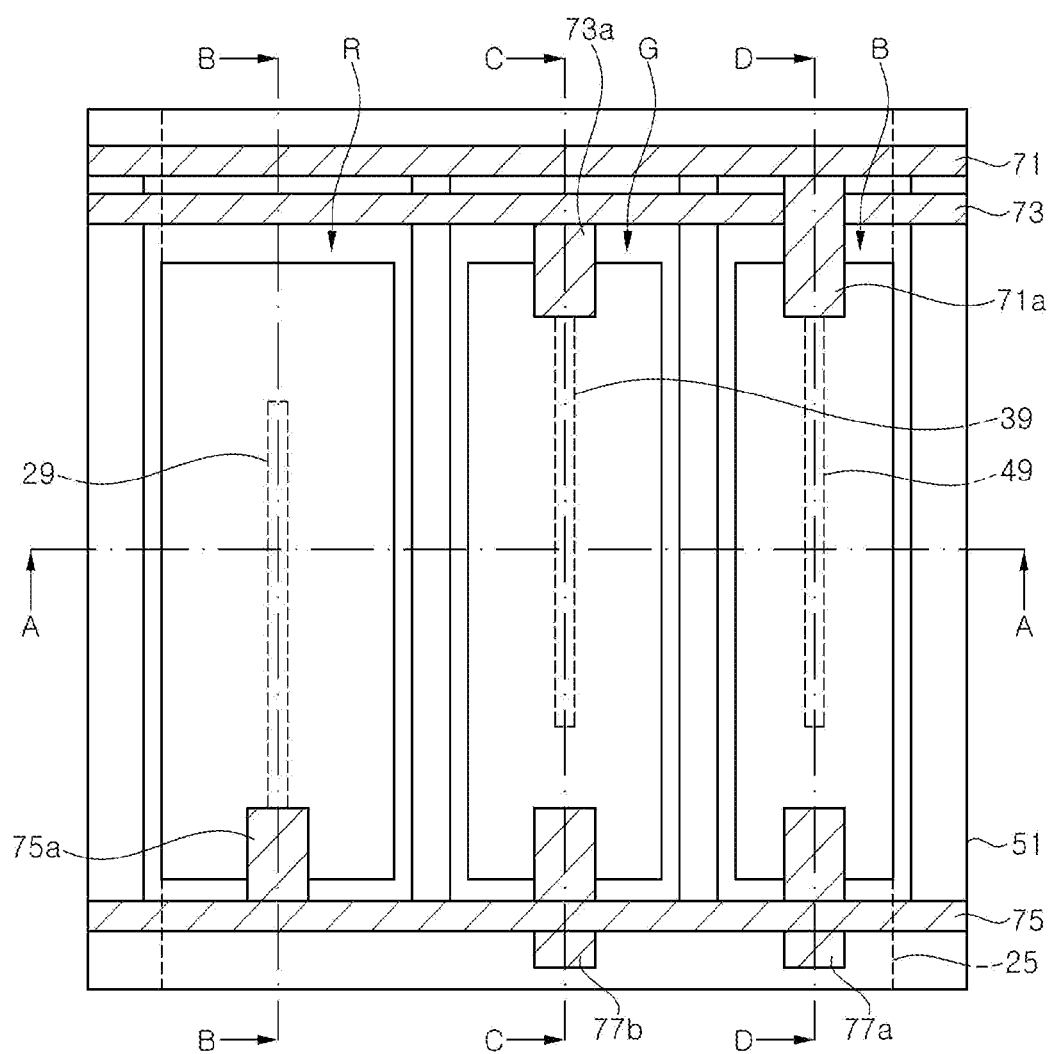
FIG. 5 is an enlarged plan view of one pixel of the display apparatus of FIG. 4.

Referring to FIG. 4, the display apparatus 1000A shown in the circuit diagram of FIG. 3 according to an exemplary embodiment may include plural pixels 100A arranged on a support substrate 51 (see FIG. 5). Each of the subpixels R, G, B is connected to a reflective electrode 25 and interconnection lines 71, 73, 75. As shown in FIG. 3, the reflective electrode 25 may correspond to the data line Vdata and the interconnection lines 71, 73, 75 may correspond to the scan lines Vscan.

The pixels 100A may be arranged in a matrix form, in which anodes of the subpixels R, G, B in each pixel are commonly connected to the reflective electrode 25, and cathodes thereof are connected to the interconnection lines 71, 73, 75 separated from each other, respectively. The connecting portions 71a, 73a, 75a may connect the interconnection lines 71, 73, 75 to the subpixels R, G, B.

FIG. 5 is an enlarged plan view of one pixel 100A of the display apparatus of FIG. 4. FIG. 6A, FIG. 6B, FIG. 6C, and FIG. 6D are schematic cross-sectional views taken along lines A-A, B-B, C-C, and D-D of FIG. 5, respectively.

Referring to FIG. 4, FIG. 5, FIG. 6A, FIG. 6B, FIG. 6C and FIG. 6D, the display apparatus 1000A may include a support substrate 51, a plurality of pixels 100A, first to third subpixels R, G, B, a first LED stack 23, a second LED stack 33, a third LED stack 43, a reflective electrode 25 (or a first-2 ohmic electrode), a first-1 ohmic electrode 29, a second-1 ohmic electrode 39, a second-2 ohmic electrode 35, a third-1 ohmic electrode 49, a third-2 ohmic electrode 45, a first color filter 37, a second color filter 47, hydrophilic material layers 56, 58, a first bonding layer 53, a second bonding layer 55, a third bonding layer 57, a first protective layer 61, a light blocking material 63, a second protective layer 65, a third protective layer 67, interconnection lines 71, 73, 75, and connecting portions 71a, 73a, 75a, 77a, 77b.

The support substrate 51 supports the LED stacks 23, 33, 43. The support substrate 51 may include a circuit on a surface thereof or therein, but the inventive concepts are not limited thereto. The support substrate 51 may include, for example, a glass substrate, a sapphire substrate, a Si substrate, or a Ge substrate.

The first LED stack 23 includes a first conductivity type semiconductor layer 23a and a second conductivity type semiconductor layer 23b. The second LED stack 33 includes a first conductivity type semiconductor layer 33a and a second conductivity type semiconductor layer 33b. The third LED stack 43 includes a first conductivity type semiconductor layer 43a and a second conductivity type semiconductor layer 43b. In addition, active layers may be interposed between the first conductivity type semiconductor layers 23a, 33a, 43a and the second conductivity type semiconductor layers 23b, 33b, 43b, respectively.

In an exemplary embodiment, each of the first conductivity type semiconductor layers 23a, 33a, 43a may be an n-type semiconductor layer and each of the second conductivity type semiconductor layers 23b, 33b, 43b may be a p-type semiconductor layer. In some exemplary embodiments, a roughened surface may be formed on at least one surfaces of the first conductivity type semiconductor layers 23a, 33a, 43a by surface texturing. However, the inventive concepts are not limited thereto, and the types of semiconductor layers in each LED stack may be varied in some exemplary embodiments.

The first LED stack 23 is disposed near the support substrate 51, the second LED stack 33 is disposed above the first LED stack 23, and the third LED stack 43 is disposed above the second LED stack. Light generated from the first LED stack 23 may be emitted outside through the second and third LED stacks 33, 43. In addition, light generated from the second LED stack 33 may be emitted outside through the third LED stack 43.

Materials forming the first LED stack 23, the second LED stack 33, and the third LED stack 43 may be substantially the same as those described with reference to FIG. 2, and thus, detailed descriptions thereof will be omitted to avoid redundancy.

The reflective electrode 25 forms ohmic contact with a lower surface of the first LED stack 23, for example, the second conductivity type semiconductor layer 23b. The reflective electrode 25 may be commonly connected to the first LED stacks 23 of the first to third subpixels R, G, B. Furthermore, the reflective electrode 25 may be commonly connected to the plurality of pixels 100a as the data line Vdata.

The reflective electrode 25 may be formed of, for example, a material layer forming ohmic contact with the second conductivity type semiconductor layer 23b of the first LED stack 23, and may include a reflection layer that may reflect light generated from the first LED stack 23, for example, red light.

The reflective electrode 25 may include an ohmic reflection layer and may be formed of, for example, an Au—Zn alloy or an Au—Be alloy. These alloys have high reflectance with respect to light in the red range and form ohmic contact with the second conductivity type semiconductor layer 23b.

Figure 6A:
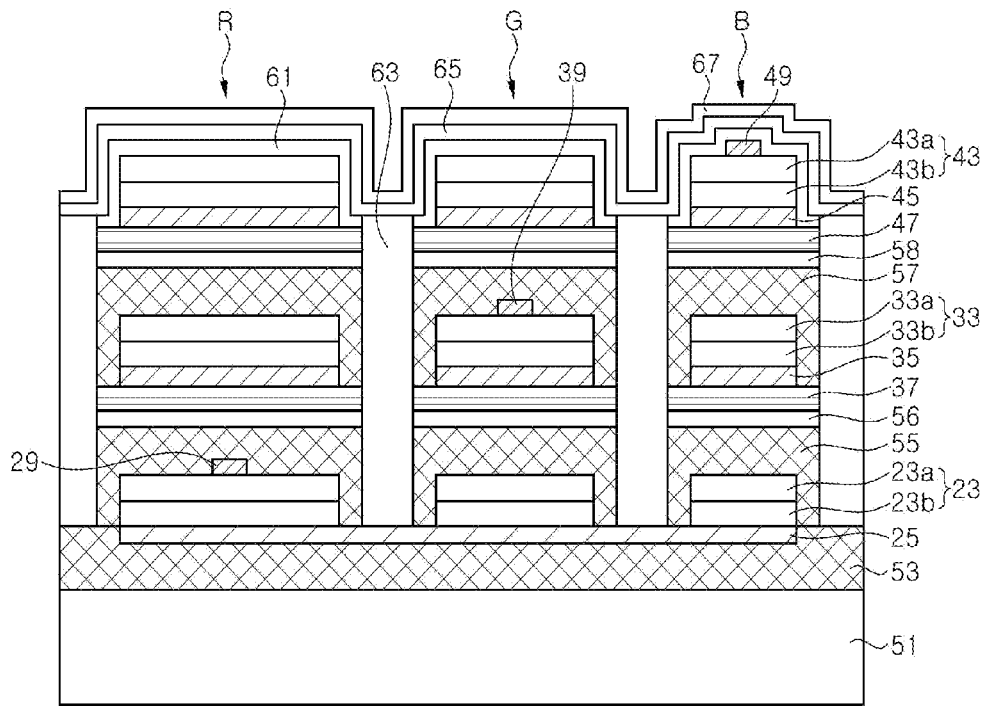
FIG. 6A is a schematic cross-sectional view taken along line A-A of FIG. 5.
Figure 6B:
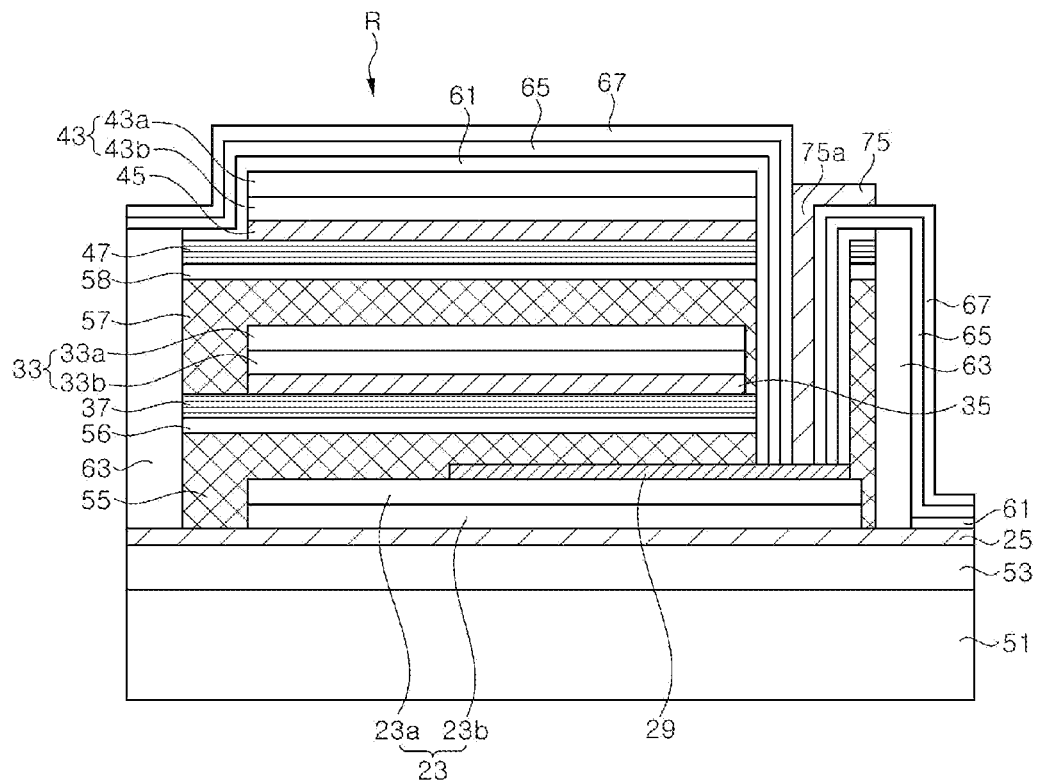
FIG. 6B is a schematic cross-sectional view taken along line B-B of FIG. 5.

The first-1 ohmic electrode 29 forms ohmic contact with the first conductivity type semiconductor layer 23a of the first subpixel R. The ohmic electrode 29 may not be formed on the first conductivity type semiconductor layer 23a of each of the second subpixel G and the third subpixel B, such that the first LED stacks 23 of the second subpixel G and the third subpixel B are electrically floated. The first-1 ohmic electrode 29 may include a pad region and an extended portion (see FIG. 9A), and the connecting portion 75a may be connected to the pad region of the first-1 ohmic electrode 29, as shown in FIG. 6B.

The second-1 ohmic electrode 39 forms ohmic contact with the first conductivity type semiconductor layer 33a of the second LED stack 33 of the second subpixel G. The ohmic electrode 39 may not be formed on the first conductivity type semiconductor layer 33a of each of the first subpixel R and the third subpixel B, such that the second LED stacks 33 of the first subpixel R and the third subpixel B are electrically floated.

Figure 6C:
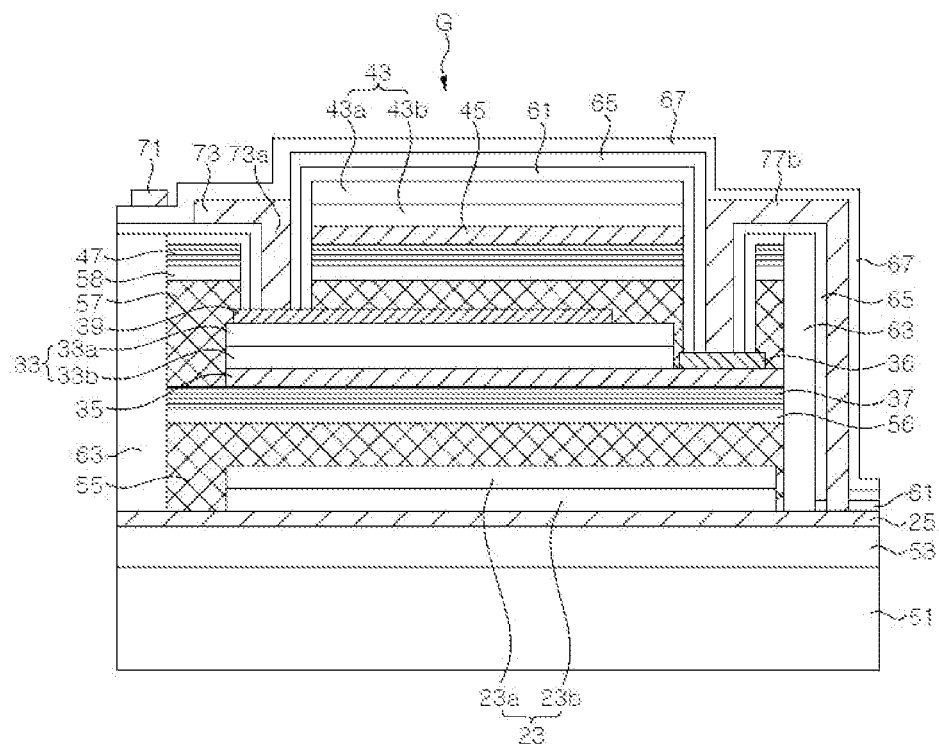
FIG. 6C is a schematic cross-sectional view taken along line C-C of FIG. 5.

The second-1 ohmic electrode 39 may include a pad region and an extended portion, and the connecting portion 73a may be connected to the pad region of the second-1 ohmic electrode 39, as shown in FIG. 6C.

The second-2 ohmic electrode 35 forms ohmic contact with the second conductivity type semiconductor layer 33b of the second LED stack 33 of each of the first to third subpixels R, G, B. The second-2 ohmic electrode 35 may be transparent with respect to light generated from the first LED stack 23 and may be formed of, for example, a metal layer or a conductive oxide layer.

An electrode pad 36 is formed on the second-2 ohmic electrode 35 of the second subpixel G. The electrode pad 36 may be restrictively disposed on the second-2 ohmic electrode 35 of the second subpixel G, and may not be disposed on the second-2 ohmic electrode 35 of the first subpixel R or the third subpixel B. The connecting portion 77b may be connected to the electrode pad 36.

The third-1 ohmic electrode 49 forms ohmic contact with the first conductivity type semiconductor layer 43a of the third LED stack 43 of the third subpixel B. The ohmic electrode 49 may not be formed on the first conductivity type semiconductor layer 43a of each of the first subpixel R and the second subpixel G, such that the third LED stacks 43 of the first subpixel R and the second subpixel G are electrically floated.

Figure 6D:
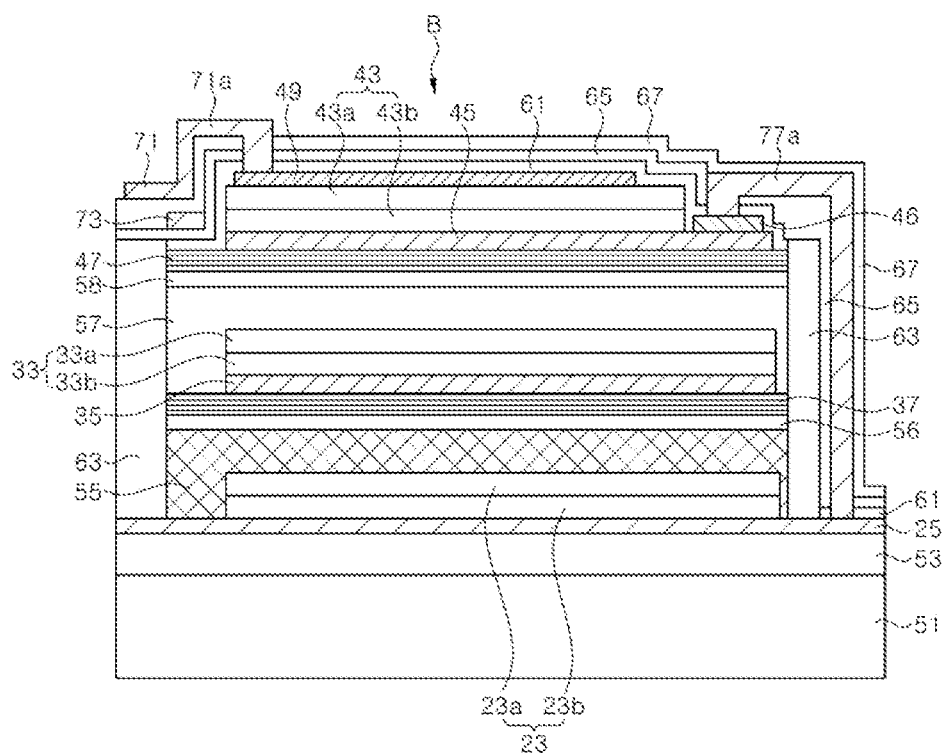
FIG. 6D is a schematic cross-sectional view taken along line D-D of FIG. 5.

The third-1 ohmic electrode 49 may include a pad region and an extended portion (see FIG. 12A), and the connecting portion 71a may be connected to the pad region of the third-1 ohmic electrode 49, as shown in FIG. 6D.

The third-2 ohmic electrode 45 forms ohmic contact with the second conductivity type semiconductor layer 43b of the third LED stack 43 of each of the first to third subpixels R, G, B. The third-2 ohmic electrode 45 may be transparent with respect to light generated from the first LED stack 23 and the second LED stack 33 and may be formed of, for example, a metal layer or a conductive oxide layer.

An electrode pad 46 is formed on the third-2 ohmic electrode 45 of the third subpixel B. The electrode pad 46 may be restrictively disposed on the third-2 ohmic electrode 45 of the third subpixel B, and may not be disposed on the third-2 ohmic electrode 45 of the first subpixel R or the second subpixel G. The connecting portion 77a may be connected to the electrode pad 46.

The reflective electrode 25, the second-2 ohmic electrode 35, and the third-2 ohmic electrode 45 may assist in current spreading through ohmic contact with the p-type semiconductor layer of each LED stack, and the first-1 ohmic electrode 29, the second-1 ohmic electrode 39 and the third-1 ohmic electrode 49 may assist in current spreading through ohmic contact with the n-type semiconductor layer of each LED stack.

In each of the subpixels R, G, B, the first color filter 35 may be interposed between the first LED stack 23 and the second LED stack 33. In addition, the second color filter 45 may be interposed between the second LED stack 33 and the third LED stack 43. The first color filter 35 transmits light generated from the first LED stack 23 while reflecting light generated from the second LED stack 33. The second color filter 45 transmits light generated from the first and second LED stacks 23, 33 while reflecting light generated from the third LED stack 43. Accordingly, light generated from the first LED stack 23 may be emitted outside through the second LED stack 33 and the third LED stack 43, and light generated from the second LED stack 33 may be emitted outside through the third LED stack 43. In this manner, light generated from the second LED stack 33 may be prevented from entering the first LED stack 23 and light generated from the third LED stack 43 may be prevented from entering the second LED stack 33, thereby preventing light loss.

In some exemplary embodiments, the first color filter 37 may reflect light generated from the third LED stack 43.

The first and second color filters 37, 45 may be, for example, a low pass filter that allows light in a low frequency band, e.g., in a long wavelength band, to pass therethrough, a band pass filter that allows light in a predetermined wavelength band to pass therethrough, or a band stop filter that prevents light in a predetermined wavelength band from passing therethrough. In particular, the first and second color filters 37, 45 may include distributed Bragg reflectors (DBRs). The distributed Bragg reflector may be formed by alternately stacking insulation layers having different refractive indices one above another, for example, by alternately stacking $TiO_2$ and $SiO_2$ layers. In addition, the stop band of the distributed Bragg reflector may be controlled by adjusting the thicknesses of $TiO_2$ and $SiO_2$ layers. The low pass filter and the band pass filter may also be formed by alternately stacking insulation layers having different refractive indices one above another.

The first bonding layer 53 couples the first LED stack 23 to the support substrate 51. As shown in the drawings, the reflective electrode 25 may adjoin the first bonding layer 53. The first bonding layer 53 may be a light transmissive or opaque layer. The first bonding layer 53 may be formed of an organic or inorganic material. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. The organic material layers may be bonded under high vacuum and high pressure conditions, and the inorganic material layers may be bonded under high vacuum after changing the surface energy using plasma through, for example, chemical mechanical polishing, to flatten the surfaces of the inorganic material layers. The first bonding layer 53 may also be formed of transparent spin-on-glass. In particular, a bonding layer formed of a black epoxy resin capable of absorbing light may be used as the first bonding layer 53, thereby improving contrast of a display apparatus.

The second bonding layer 55 couples the second LED stack 33 to the first LED stack 23. The second bonding layer 55 may be formed of a transparent organic material or a transparent inorganic material. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. In addition, the second bonding layer 55 may also be formed of transparent spin-on-glass. As shown in the drawings, the second bonding layer 55 may adjoin the first LED stack 23. In addition, the second bonding layer 55 may adjoin the first color filter 37. Here, the hydrophilic material layer 56 may be interposed between the second bonding layer 55 and the first color filter 37.

The hydrophilic material layer 56 may change the surface properties of the first color filter 37 from hydrophobic to hydrophilic, thereby improving adhesive strength of the second bonding layer 55 to prevent the second bonding layer 55 from being peeled off from the first color filter 37. In some exemplary embodiments, when the first color filter 37 has a hydrophilic lower surface, the hydrophilic material layer 56 may be omitted. The hydrophilic material layer 56 may be formed through deposition of $SiO_2$ on the surface of the first color filter 37 or through plasma modification of the surface of the first color filter 37, for example.

In some exemplary embodiments, a hydrophilic material layer may be formed on the surface of the first LED stack 23 to change surface properties of the first LED stack 23 from hydrophobic to hydrophilic. In addition, an additional hydrophilic material layer may be formed on the surface of the reflective electrode 25 before formation of the first bonding layer 53.

The ohmic electrode 29 may be covered by the second bonding layer 55. The second bonding layer 55 transmits light generated from the first LED stack 23.

The third bonding layer 57 couples the third LED stack 43 to the second LED stack 33. The third bonding layer 57 may be formed of a transparent organic material, a transparent inorganic material or transparent spin-on-glass, as in the second bonding layer 55. As shown in the drawings, the third bonding layer 57 may adjoin the second LED stack 33 and the second color filter 47. As described above, the hydrophilic material layer 58 may be formed on the second color filter 47, and the third bonding layer 57 may adjoin the hydrophilic material layer 58. In some exemplary embodiments, an additional hydrophilic material layer may be further formed on the surface of the second LED stack 33.

The first protective layer 61 covers the subpixels R, G, B. The first protective layer 61 may be formed of silicon oxide or silicon nitride.

The light blocking material 63 surrounds the subpixels R, G, B. The light blocking material 63 may be formed of a reflective white material or a light absorptive black material. For example, the light blocking material 63 may be formed of white PSR or a black epoxy resin. The light blocking material 63 may block light emitted through side surfaces of the subpixels R, G, B to prevent light interference between the subpixels.

The second protective layer 65 may be formed on the first protective layer 61 and the light blocking material 63, and the third protective layer 67 may be formed on the second protective layer 65.

As shown in FIG. 4 and FIG. 5, the interconnection lines 71, 73, 75 may be disposed to be substantially orthogonal to the reflective electrode 25. The interconnection lines 71, 75 may be disposed on the third protective layer 67 and may be connected to the third-1 ohmic electrode 49 and the first-1 ohmic electrode 29 through the connecting portions 71a, 75a, respectively. In the illustrated exemplary embodiment, the first protective layer 61, the second protective layer 65, and the third protective layer 67 may have openings that expose the third-1 ohmic electrode 49 and the first-1 ohmic electrode 29.

The interconnection line 73 may be disposed between the second protective layer 65 and the third protective layer 67, and may be connected to the second-1 ohmic electrode 39 through the connecting portion 73a. In this embodiment, the first protective layer 61 and the second protective layer 65 have openings that expose the second-1 ohmic electrode 39.

In addition, the connecting portions 77a, 77b are disposed between the second protective layer 65 and the third protective layer 67, and electrically connect the electrode pads 46, 36 to the reflective electrode 25. In the illustrated exemplary embodiment, the first protective layer 61 and the second protective layer 65 may have openings that expose the electrode pads 36, 46 and the reflective electrode 25.

The interconnection line 71 and the interconnection line 73 are insulated from each other by the third protective layer 67, and thus, may be disposed to overlap each other in the vertical direction.

Although the electrodes of each pixel are described as being connected to the data line and the scan lines, the interconnection lines 71, 75 are described as being disposed on the third protective layer 67, and the interconnection line 73 is described as being disposed between the second protective layer 65 and the third protective layer 67, the inventive concepts are not limited thereto. For example, all of the interconnection lines 71, 75 and the interconnection line 73 may be formed on the second protective layer 65 and covered by the third protective layer 67, and the connecting portions 71a, 75a may be formed on the third protective layer 67.

Next, a method of manufacturing the display apparatus 1000A according to an exemplary embodiment will be described.

FIGS. 7A, 7B, 7C, 8A, 8B, 9A, 9B, 10A, 10B, 11A, 11B, 12A, 12B, 13A, 13B, 14A, 14B, 15A, 15B, 16A, 16B, 17A, 17B, 18, 19A, and 19B are schematic plan view and cross-sectional views illustrating a method of manufacturing a display apparatus according to an exemplary embodiment.

Figure 7A:
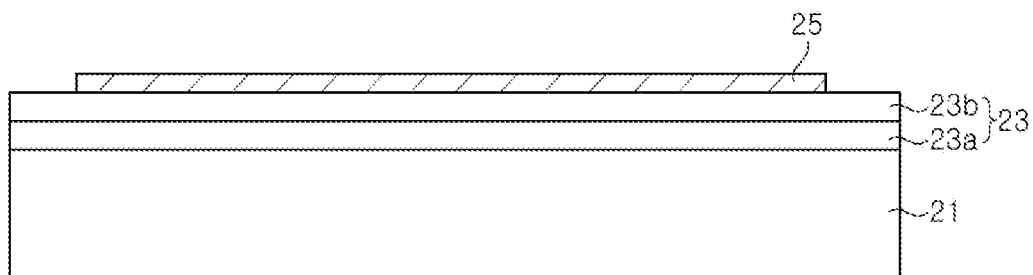
FIGS. 7A, 7B, 7C, 8A, 8B, 9A, 9B, 10A, 10B, 11A, 11B, 12A, 12B, 13A, 13B, 14A, 14B, 15A, 15B, 16A, 16B, 17A, 17B, 18, 19A, and 19B are schematic plan views and cross-sectional views illustrating a method of manufacturing a display apparatus according to an exemplary embodiment.

First, referring to FIG. 7A, a first LED stack 23 is grown on a first substrate 21. The first substrate 21 may be, for example, a GaAs substrate. In addition, the first LED stack 23 may be formed of AlGaInP-based semiconductor layers, and includes a first conductivity type semiconductor layer 23a, an active layer, and a second conductivity type semiconductor layer 23b.

Then, a reflective electrode 25 is formed on the first LED stack 23. The reflective electrode 25 may be formed of, for example, an Au—Zn alloy or an Au—Be alloy.

The reflective electrode 25 may be formed by a lift-off process, for example, and may be subjected to patterning to have a particular shape. For example, the reflective electrode 25 may be patterned to have a width corresponding to all of subpixels R, G, B and a length connecting a plurality of pixels. However, the inventive concepts are not limited thereto. In some exemplary embodiments, the reflective electrode 25 may be formed over the entire upper surface of the first LED stack 23 without patterning or may be subjected to patterning after being formation thereon.

The reflective electrode 25 may form ohmic contact with the second conductivity type semiconductor layer 23b of the first LED stack 23, for example, a p-type semiconductor layer.

Figure 7B:
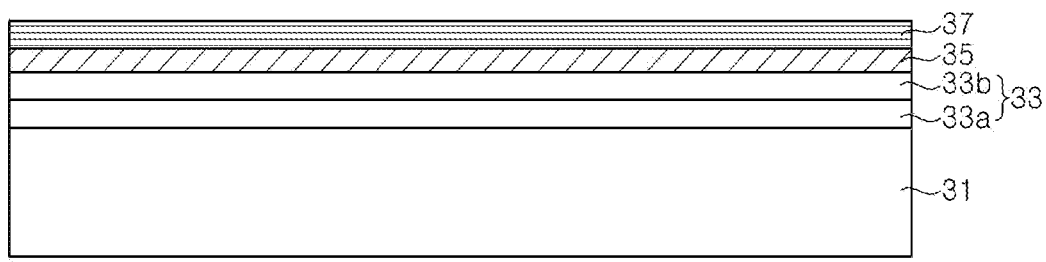

Referring to FIG. 7B, a second LED stack 33 is grown on a second substrate 31, and a second-2 ohmic electrode 35 and a first color filter 37 are formed on the second LED stack 33. The second LED stack 33 may be formed of GaN-based semiconductor layers, and may include a first conductivity type semiconductor layer 33a, a GaInN well layer, and a second conductivity type semiconductor layer 33b. The second substrate 31 is a substrate capable of growing the GaN-based semiconductor layers thereon, and may be different from the first substrate 21. The GaInN composition of the second LED stack 33 may be determined such that the second LED stack 33 may emit green light, for example. The second-2 ohmic electrode 35 forms ohmic contact with the second conductivity type semiconductor layer 33b of the second LED stack 33, for example, a p-type semiconductor layer.

Figure 7C:
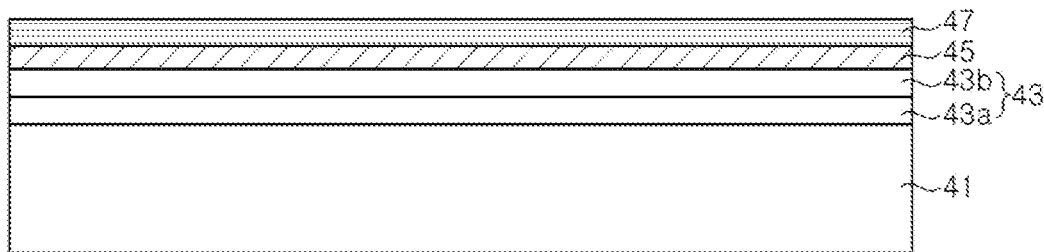

Referring to FIG. 7C, a third LED stack 43 is grown on a third substrate 41, and a third-2 ohmic electrode 45 and a second color filter 47 are formed on the third LED stack 43. The third LED stack 43 may be formed of GaN-based semiconductor layers, and may include a first conductivity type semiconductor layer 43a, a GaInN well layer, and a second conductivity type semiconductor layer 43b. The third substrate 41 is a substrate capable of growing the GaN-based semiconductor layers thereon, and may be different from the first substrate 21. The GaInN composition of the third LED stack 43 may be determined such that the third LED stack 43 may emit blue light, for example. The third-2 ohmic electrode 45 forms ohmic contact with the second conductivity type semiconductor layer 43b of the third LED stack 43, for example, a p-type semiconductor layer.

The first color filter 37 and the second color filter 47 may be substantially the same as those described above, and thus, detailed descriptions thereof will be omitted to avoid redundancy.

The first LED stack 23, the second LED stack 33, and the third LED stack 43 are grown on different substrates, respectively, and the sequence of forming the first to third LED stacks is not particularly limited.

Figure 8A:
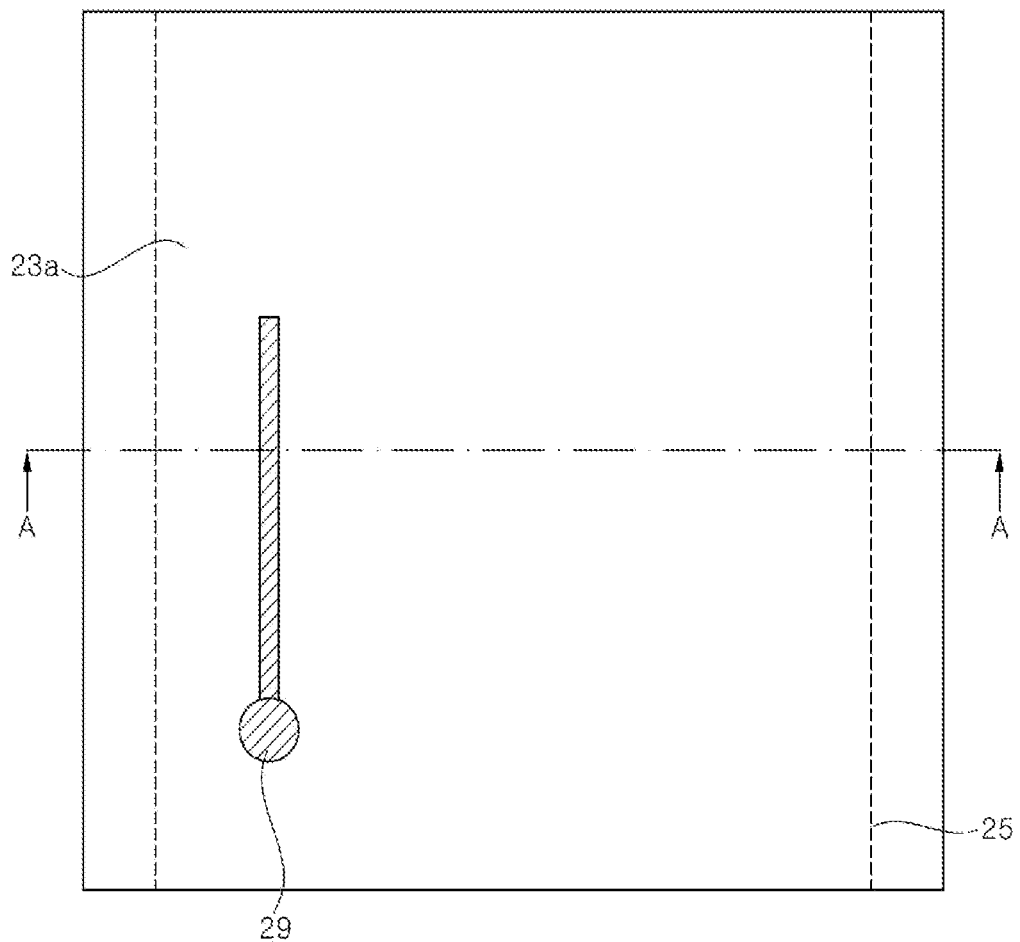
Figure 8B:
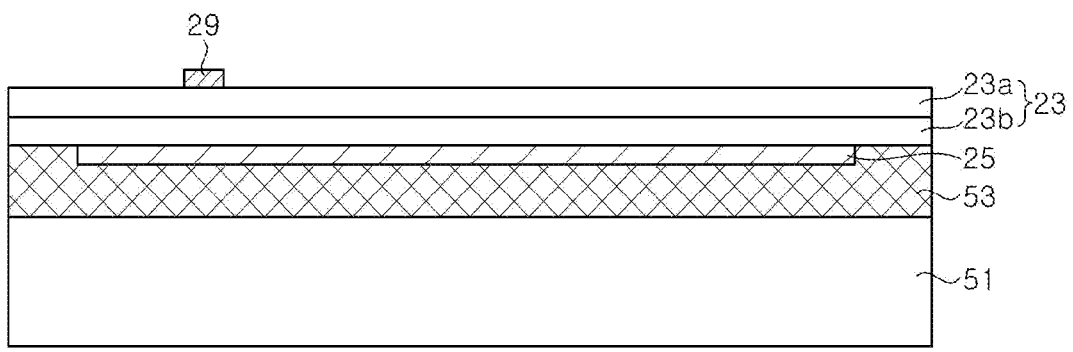

Referring to FIG. 8A and FIG. 8B, the first LED stack 23 of FIG. 7A is coupled to an upper side of a support substrate 51 via the first bonding layer 53. The reflective electrode 25 may be disposed to face the support substrate 51 and may be bonded to the first bonding layer 53. The first substrate 21 is removed from the first LED stack 23 by chemical etching or the like. As such, an upper surface of the first conductivity type semiconductor layer 23a of the first LED stack 23 is exposed. In some exemplary embodiments, a roughened surface may be formed on the exposed surface of the first conductivity type semiconductor layer 23a by surface texturing.

Then, a first-1 ohmic electrode 29 is formed on the exposed surface of the first LED stack 23. The ohmic electrode 29 may be formed of, for example, an Au—Te alloy or an Au—Ge alloy. The ohmic electrode 29 may be formed in each pixel region. Alternatively, the ohmic electrode 29 may be formed in the first subpixel R and may be omitted in the second subpixel G or in the second subpixel B. The ohmic electrode 29 may include a pad region and an extended portion, as shown in the drawings. The extended portion may extend substantially in the longitudinal direction of the reflective electrode 25, as shown in the drawings.

Figure 9A:
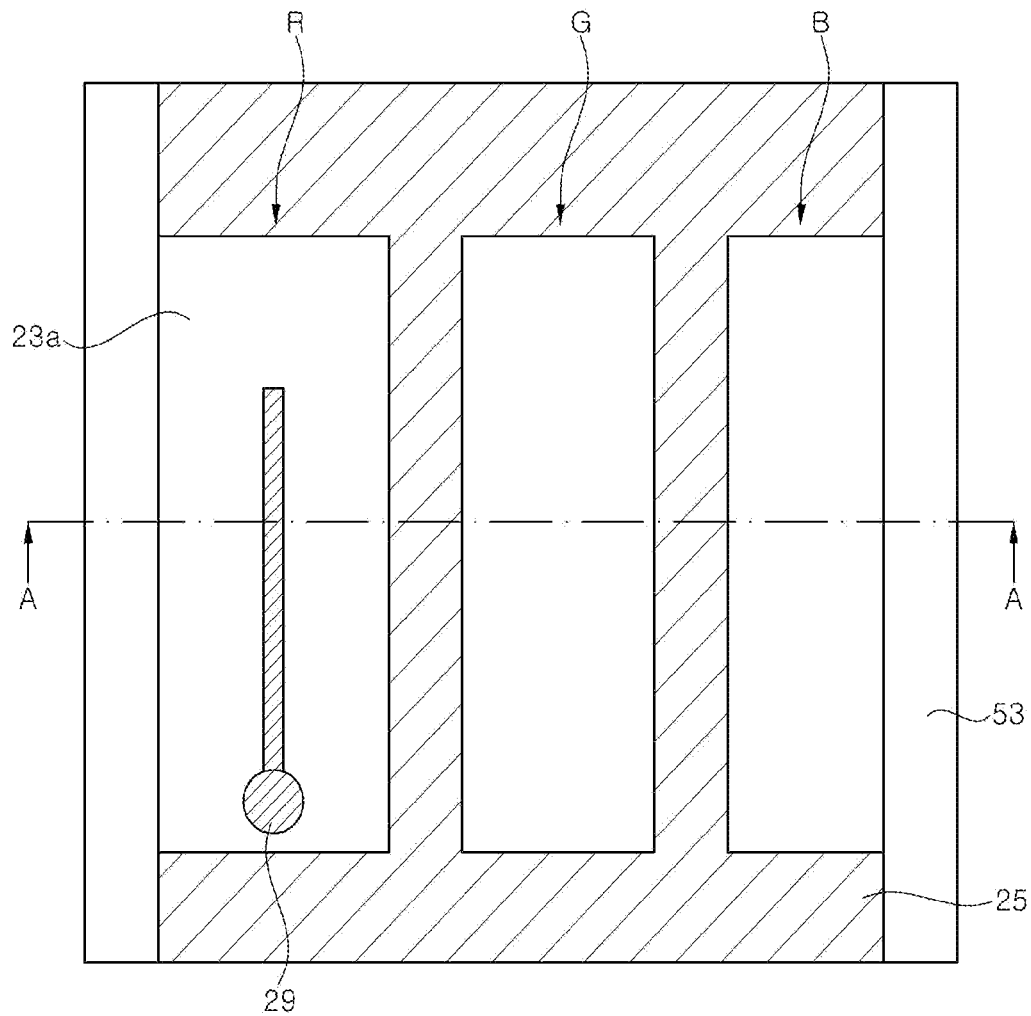
Figure 9B:
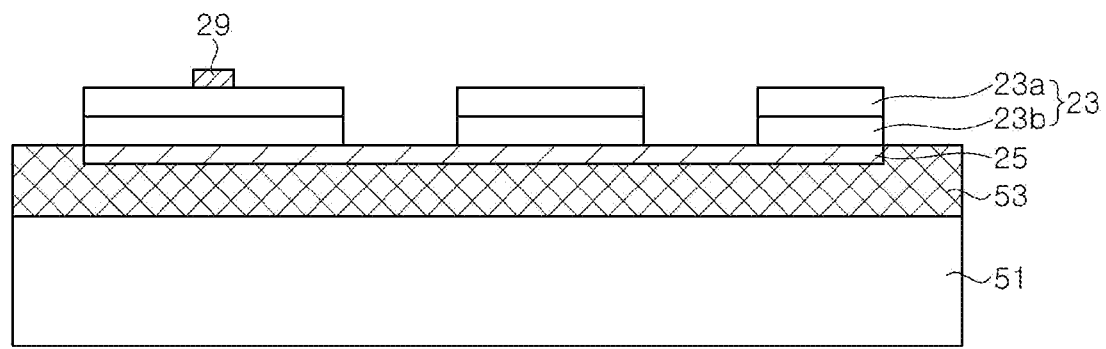

Referring to FIG. 9A and FIG. 9B, the first LED stack 23 is subjected to patterning to be divided into regions corresponding to the subpixels R, G, B. Each of the divided regions of the first LED stacks 23 may be disposed on the reflective electrode 25. The first-1 ohmic electrode 29 may be disposed in a region corresponding to the first subpixel R. By patterning the first LED stack 23, the reflective electrode 25 is exposed and the surface of the first bonding layer 53 may also be partially exposed. In other exemplary embodiments, an insulation layer may be disposed on the first bonding layer 53, and thus, the surface of the first bonding layer 53 may not be exposed.

Figure 10A:
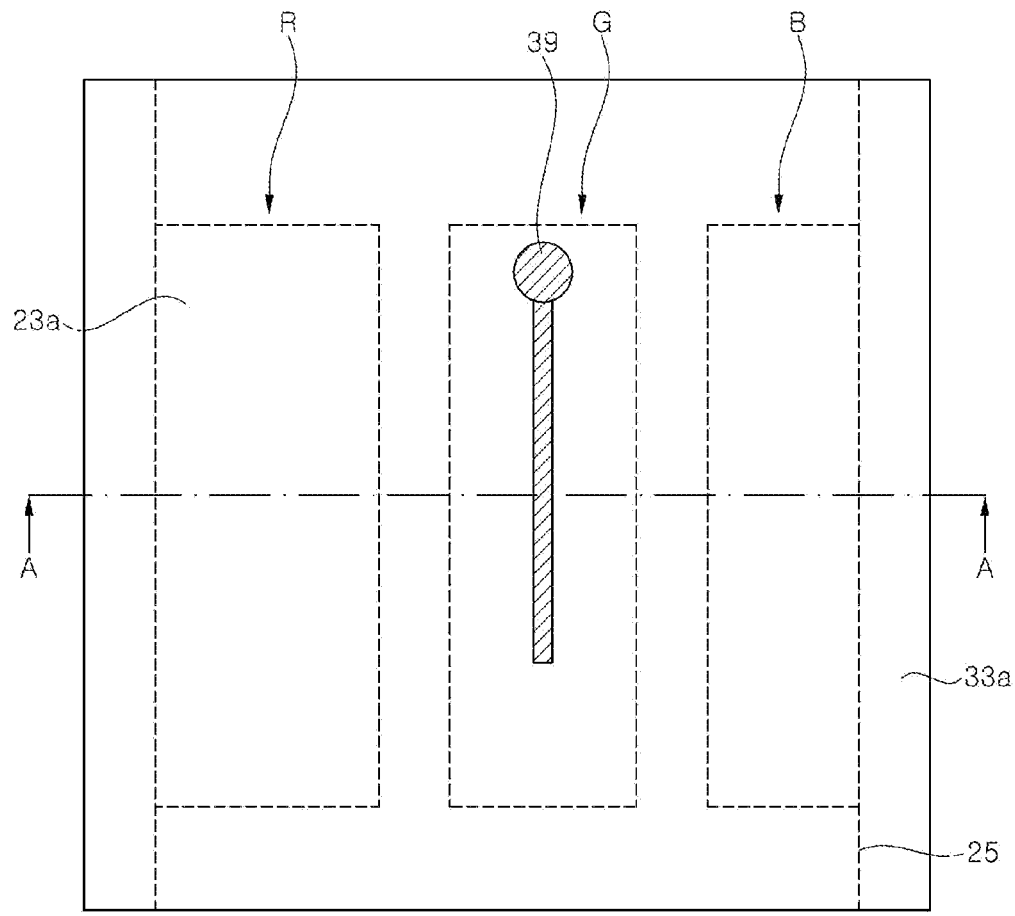
Figure 10B:
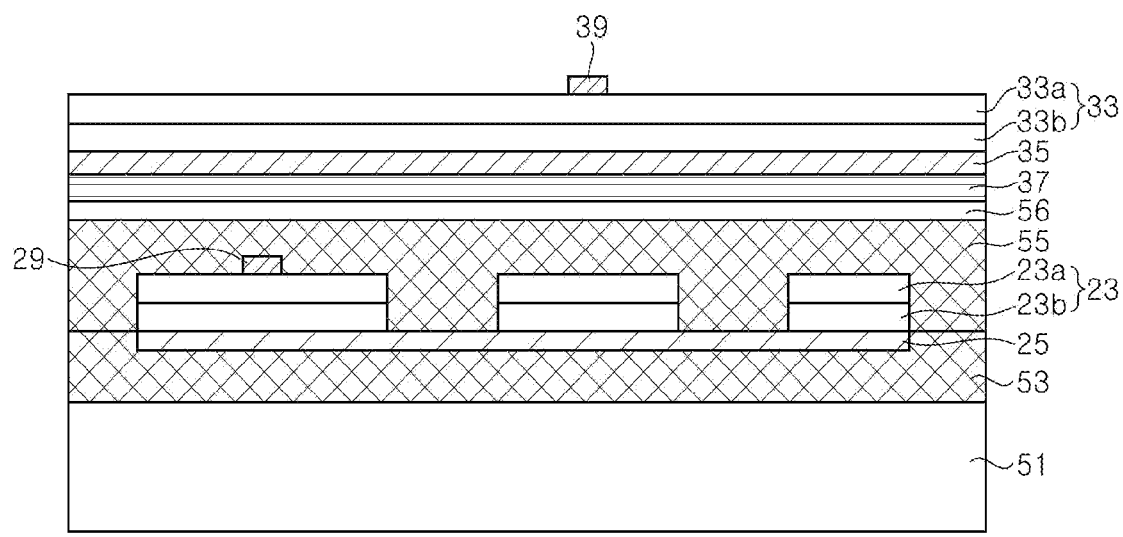

Referring to FIG. 10A and FIG. 10B, the second LED stack 33 of FIG. 7B is coupled to an upper sides of the first LED stack 23 via a second bonding layer 55. The first color filter 37 is disposed to face the first LED stacks 23 and is bonded to the second bonding layer 55. A hydrophilic material layer 56 may be formed on the first color filter 37, and the second bonding layer 55 may adjoin the hydrophilic material layer 56. In some exemplary embodiments, a hydrophilic material layer may be further formed on the first LED stacks 23. The second substrate 31 is removed from the second LED stack 33 by laser lift-off or chemical lift-off. As such, an upper surface of the first conductivity type semiconductor layer 33a of the second LED stack 33 is exposed. In some exemplary embodiments, a roughened surface may be formed on the exposed surface of the first conductivity type semiconductor layer 33a by surface texturing.

Next, a second-1 ohmic electrode 39 is formed on the first conductivity type semiconductor layer 33a. As shown in FIG. 10A, the second-1 ohmic electrode 39 may include a pad region and an extended portion, as shown in the drawings. The extended portion may extend substantially in the longitudinal direction of the reflective electrode 25. The second-1 ohmic electrode 39 forms ohmic contact with the first conductivity type semiconductor layer 33a.

The second-1 ohmic electrode 39 may be formed in a region corresponding to the second subpixel G, and may be omitted in the regions corresponding to the first and third subpixels R, B.

Figure 11A:
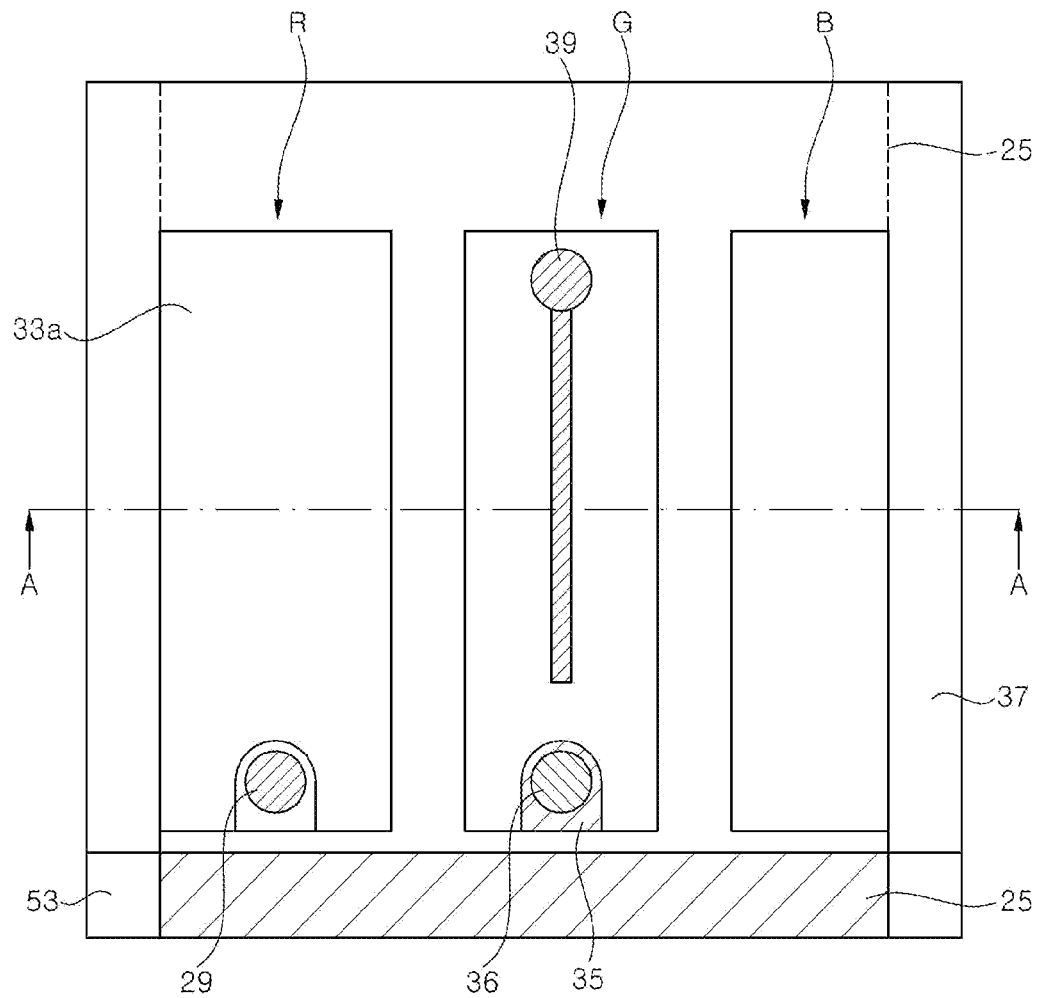
Figure 11B:
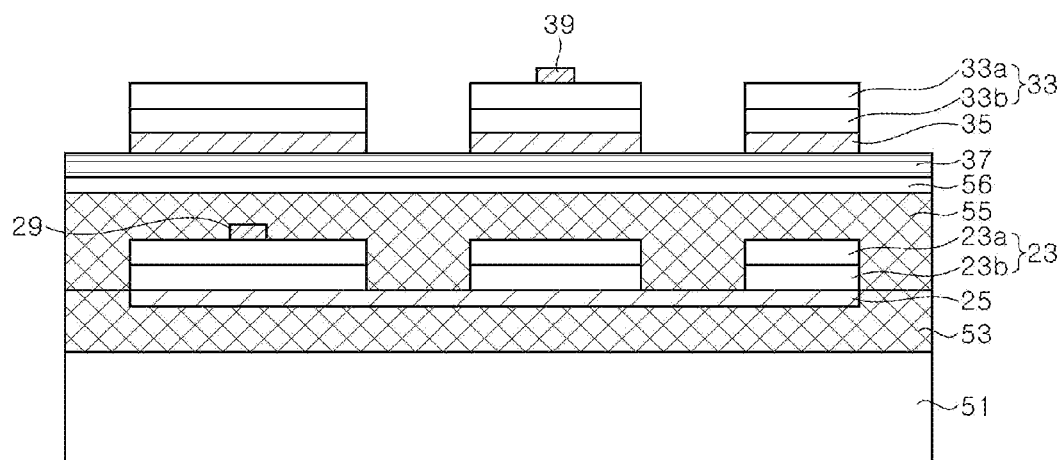

Referring to FIG. 11A and FIG. 11n, the second LED stack 33 is subjected to patterning to be divided into regions corresponding to the subpixels R, G, B. The divided second LED stacks 33 are arranged to correspond to the divided first LED stacks 23, respectively.

More particularly, as the second LED stack 33 is subjected to patterning, the second-2 ohmic electrode 35 is exposed. Then, an electrode pad 36 is formed on the second-2 ohmic electrode 35 in the region for the second subpixel G. The electrode pad 36 may be restrictively disposed in an upper region of the first LED stack 23 of the second subpixel G. In the illustrated exemplary embodiment, the second LED stack 33 is additionally removed from the regions corresponding to the first subpixel R and the second subpixel G.

As the exposed second-2 ohmic electrode 35 is removed in the first subpixel R, the first color filter 37 is exposed, and the pad region of the first-1 ohmic electrode 29 is exposed by patterning the exposed first color filter 37.

In addition, the first color filter 37 and the second bonding layer 55 may be removed to expose some region of the reflective electrode 25.

Figure 12A:
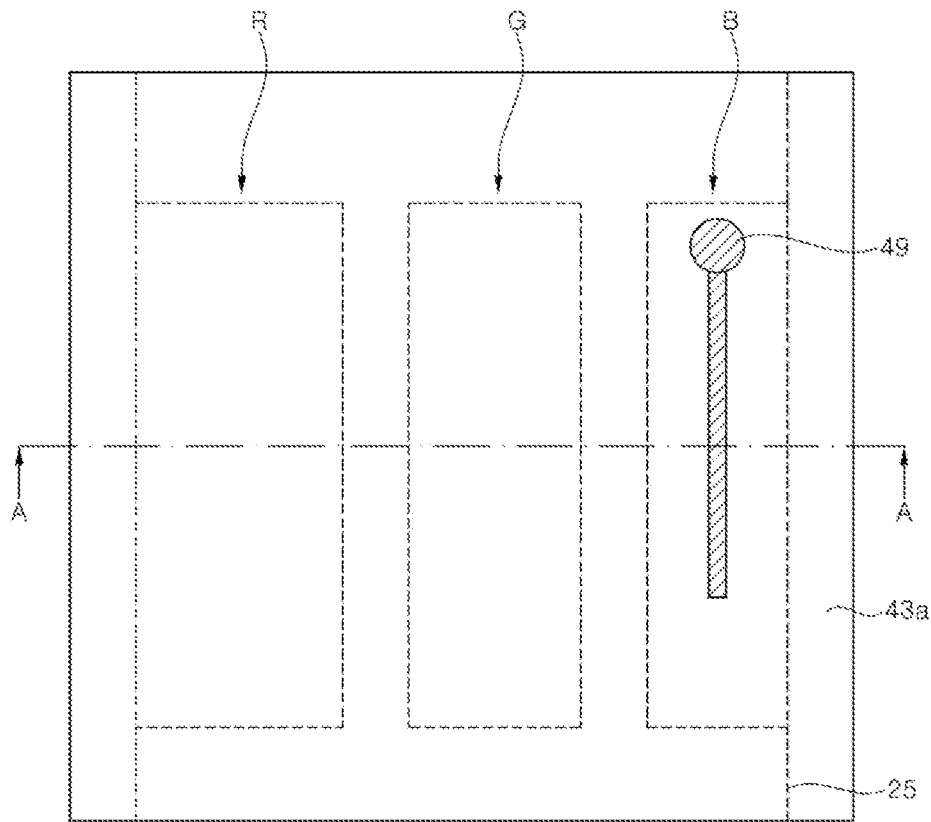
Figure 12B:
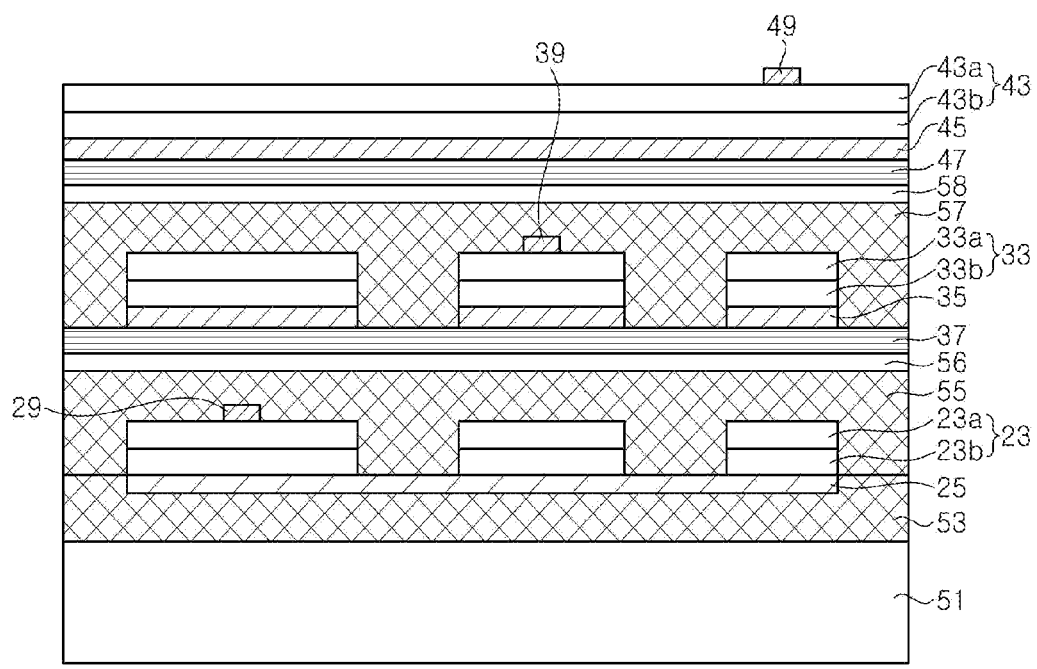

Referring to FIG. 12A and FIG. 12B, the third LED stack 43 of FIG. 7B is coupled to an upper side of the second LED stack 33 via a third bonding layer 57. The second color filter 47 is disposed to face the second LED stack 33 and is bonded to the third bonding layer 57. A hydrophilic material layer 58 may be formed on the second color filter 47 prior to other layers. In some exemplary embodiments, an additional hydrophilic material layer may be formed on the second LED stacks 33.

The third substrate 41 may be removed from the third LED stack 43 by laser lift-off or chemical lift-off. As such, an upper surface of the first conductivity type semiconductor layer 43a of the third LED stack 43 is exposed. In some exemplary embodiments, a roughened surface may be formed on the exposed surface of the first conductivity type semiconductor layer 43a by surface texturing.

Next, a third-1 ohmic electrode 49 is formed on the first conductivity type semiconductor layer 43a. The third-1 ohmic electrode 49 forms ohmic contact with the first conductivity type semiconductor layer 43a. As shown in FIG. 12A, the third-1 ohmic electrode 49 may include a pad region and an extended portion. Here, the extended portion may extend substantially in the longitudinal direction of the reflective electrode 25.

The third-1 ohmic electrode 49 may be formed in a region corresponding to the third subpixel B, and may be omitted in the regions for the first and second subpixels R, B.

Figure 13A:
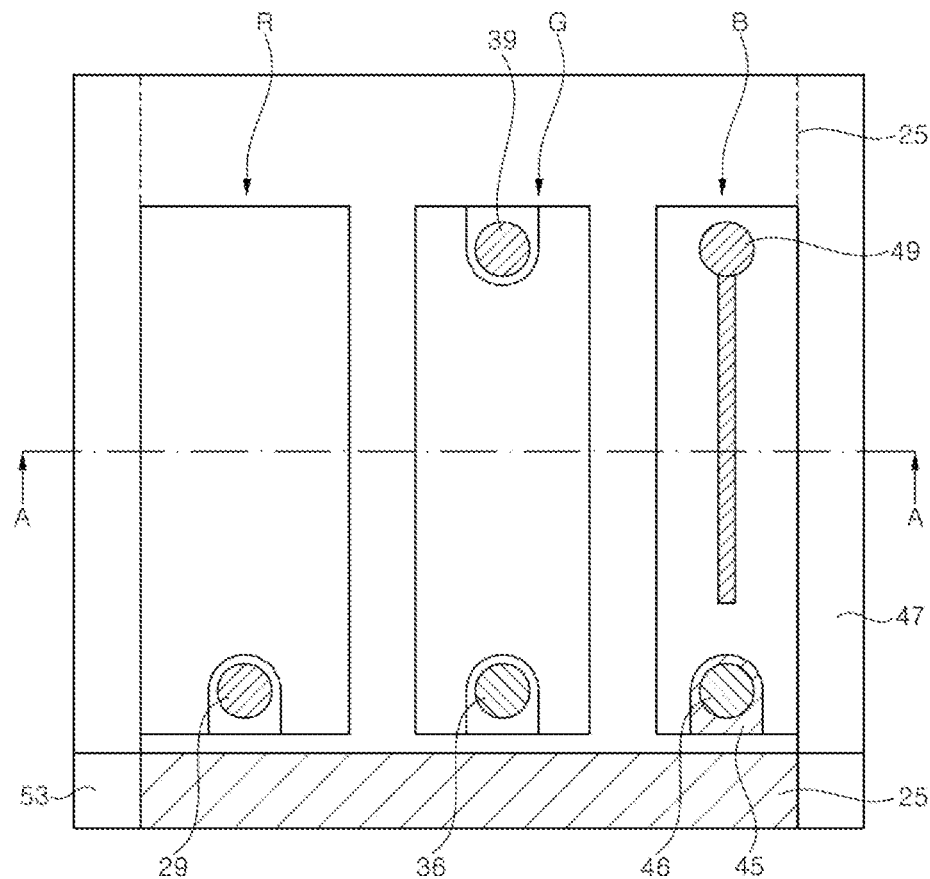
Figure 13B:
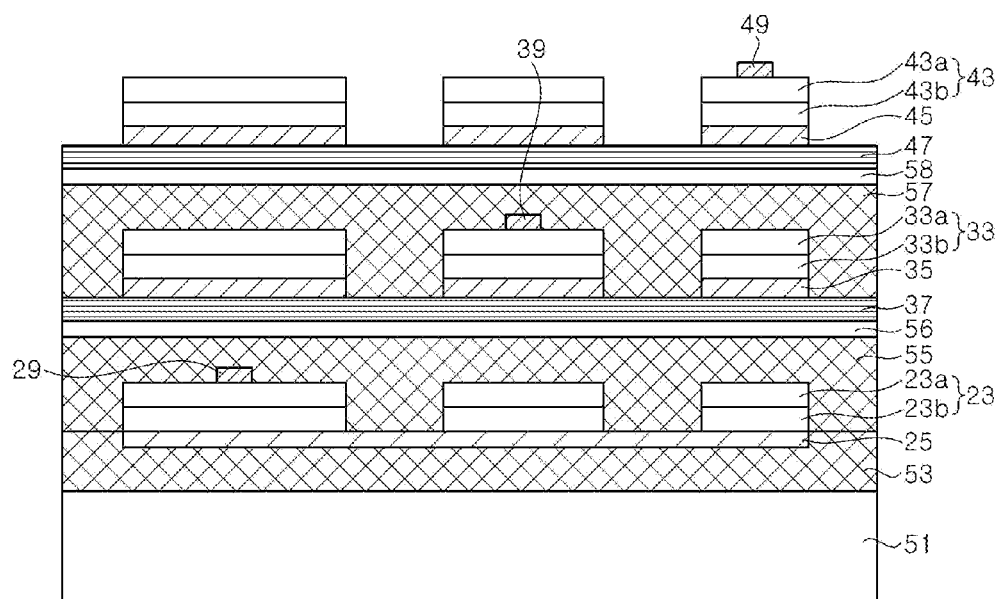

Referring to FIG. 13A and FIG. 13B, the third LED stack 43 is subjected to patterning to be divided in to regions corresponding to the subpixels R, G, B. The divided regions of the third LED stack 43 may correspond to the divided regions of the first LED stack 23, respectively.

More particularly, as the third LED stack 43 is subjected to patterning, the third-2 ohmic electrode 45 is exposed. Then, an electrode pad 46 is formed on the third-2 ohmic electrode 45 in the region for the third subpixel B. The electrode pad 46 may be restrictively disposed in an upper region of the first LED stack 23 of the third subpixel B. In the illustrated exemplary embodiment, the third LED stack 43 is additionally removed from the regions corresponding to the first and second subpixels R and G.

As the third-2 ohmic electrode 45 is removed, the second color filter 47 is exposed, and the pad region of the second-1 ohmic electrode 39, the electrode pad 36, and the pad region of the first-1 ohmic electrode 29 are exposed by sequentially patterning the exposed second color filter 47, the hydrophilic material layer 58, and the third bonding layer 57.

In addition, the second color filter 47 and the second bonding layer 55 may be removed to expose some region of the reflective electrode 25.

Figure 14A:
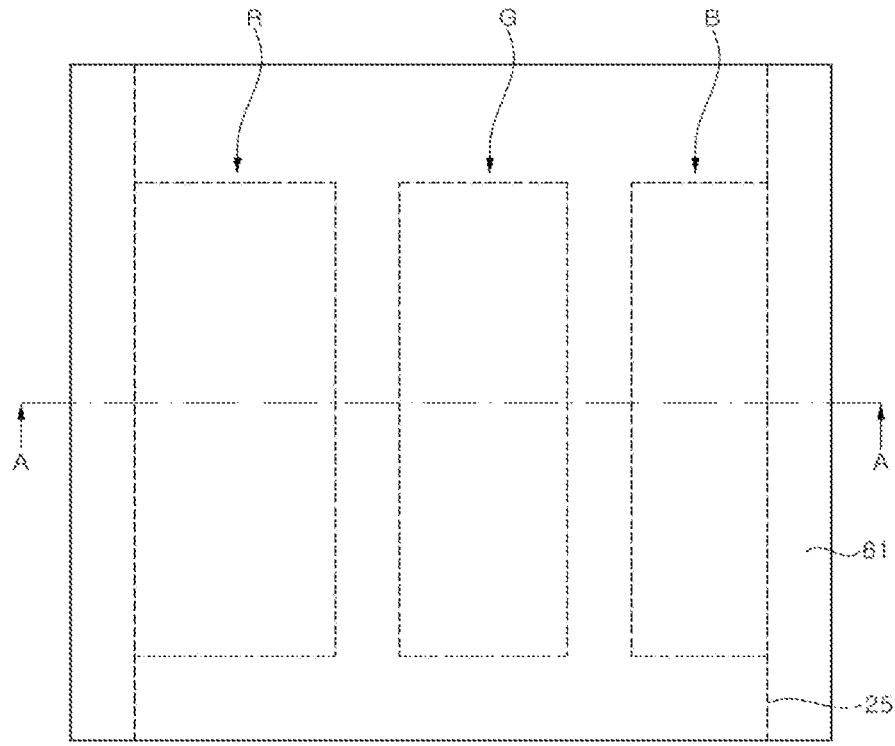
Figure 14B:
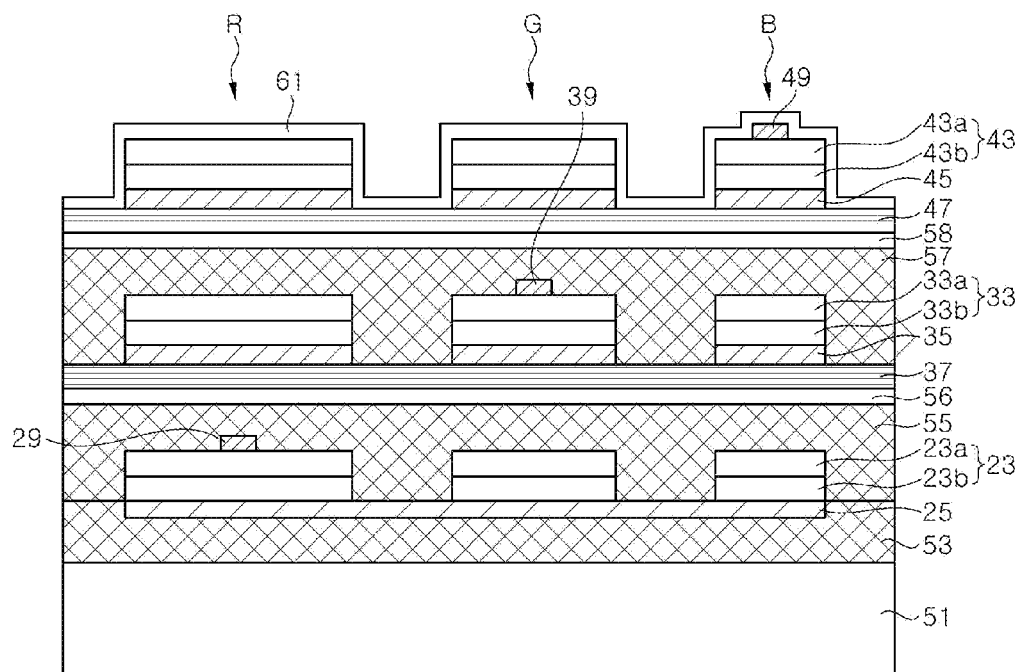

Then, referring to FIG. 14A and FIG. 14B, a first protective layer 61 is formed. The first protective layer 61 covers the third LED stacks 43 and the second color filter 47, and also covers the exposed reflective electrode 25, the electrode pad 46, the pad region of the second-1 ohmic electrode 39, the electrode pad 36, and the pad region of the first-1 ohmic electrode 29. The first protective layer 61 may cover substantially the entire upper portion of the support substrate 51.

Figure 15A:
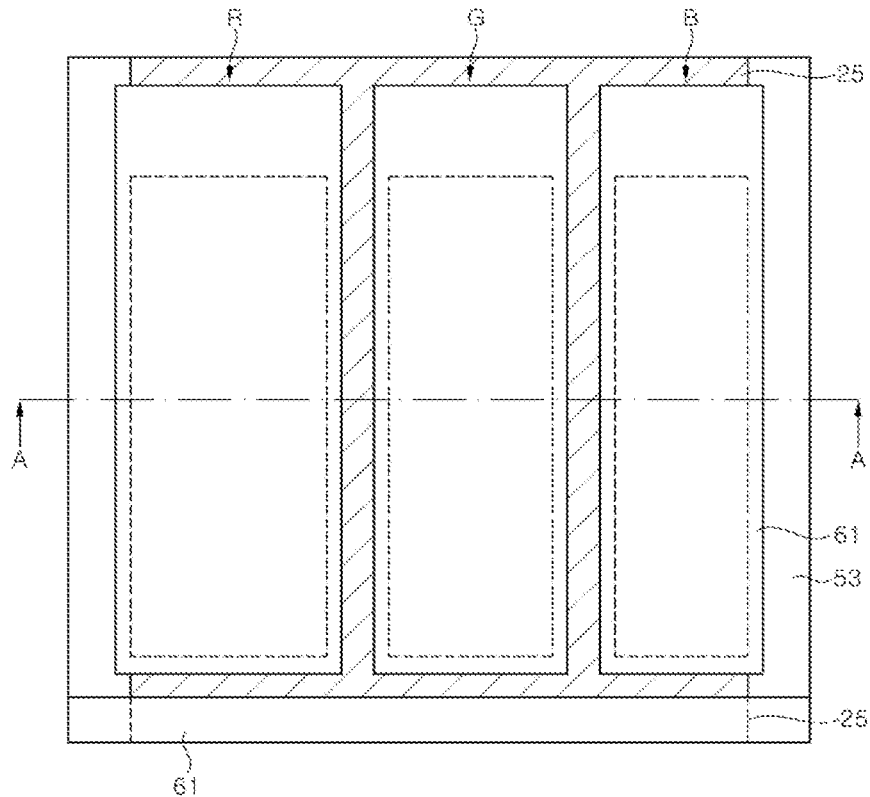
Figure 15B:
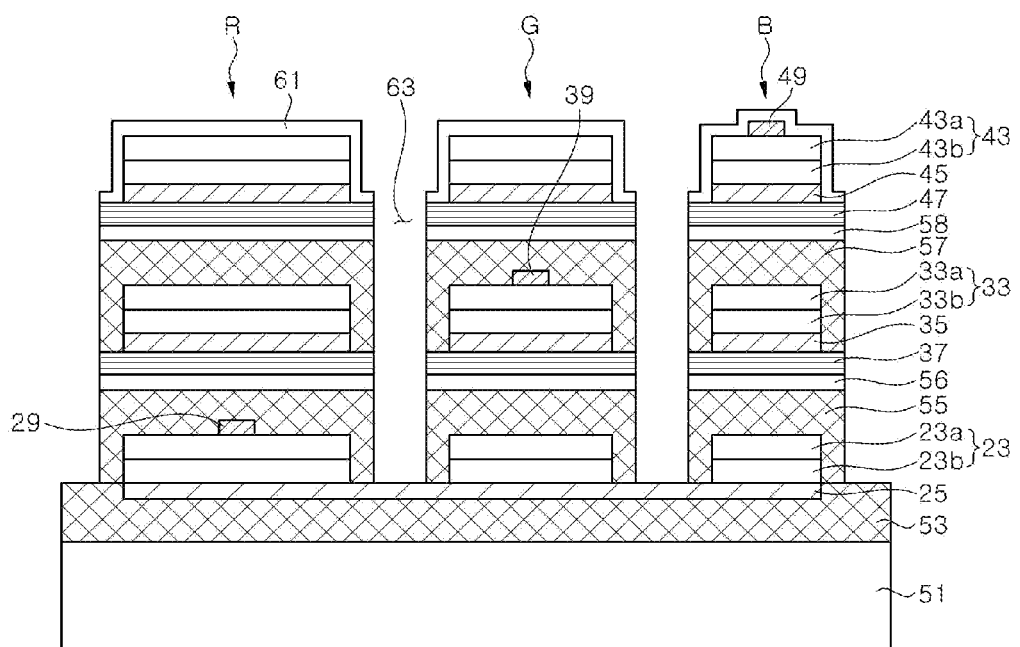

Then, referring to FIG. 15A and FIG. 15B, the second color filter 47 around the subpixels R, G, B is exposed by patterning the first protective layer 61. Then, the reflective electrode 25 is exposed by sequentially removing the second color filter 47, the hydrophilic material layer 58, the third bonding layer 57, the first color filter 37, the hydrophilic material layer 56, and the second bonding layer 55. The surface of the first bonding layer 53 may be exposed by sequentially removing the above layers in a region between pixels. In this manner, a trench is formed around the subpixels R, G, B to surround the subpixels.

Figure 16A:
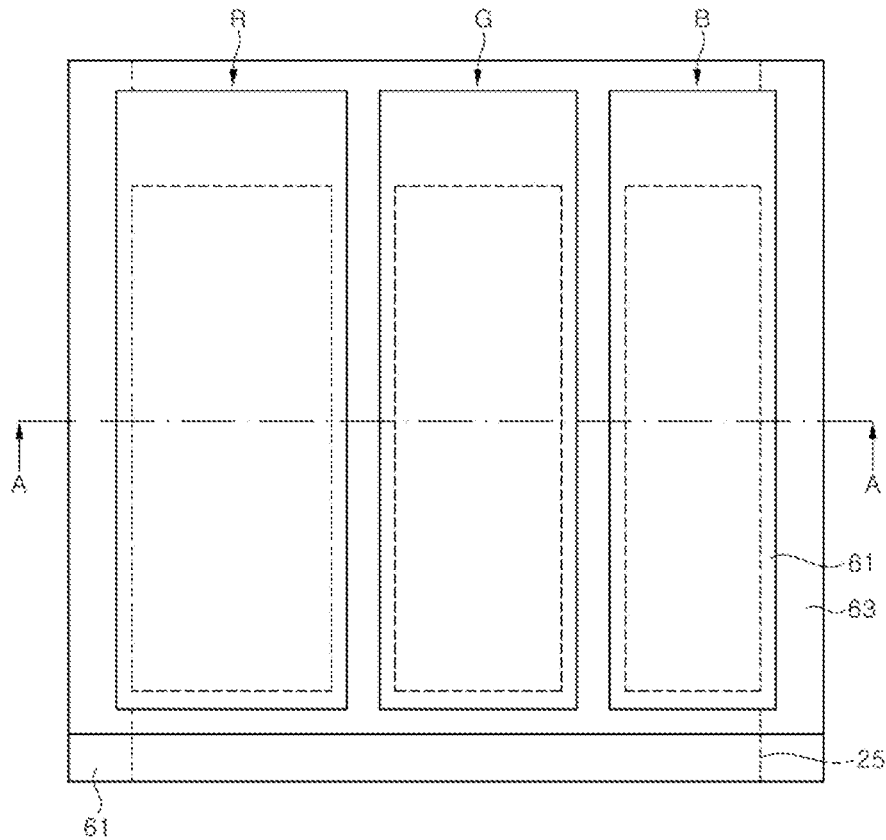
Figure 16B:
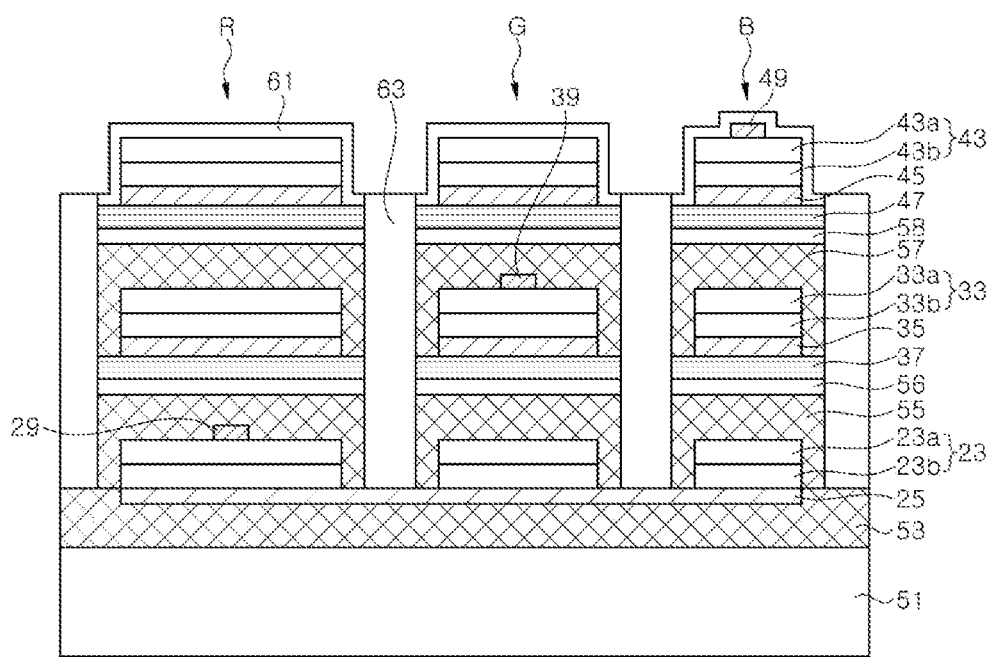

Referring to FIG. 16A and FIG. 16B, a light blocking material layer 63 may be formed in the trench surrounding the subpixels R, G, B. The light blocking material layer 63 is disposed to surround the subpixels R, G, B. The light blocking material layer 63 may be formed of, for example, a black epoxy resin or white PSR, and may prevent light interference between the subpixels and pixels by blocking light emitted through the side surface of each of the subpixels R, G, B.

Figure 17A:
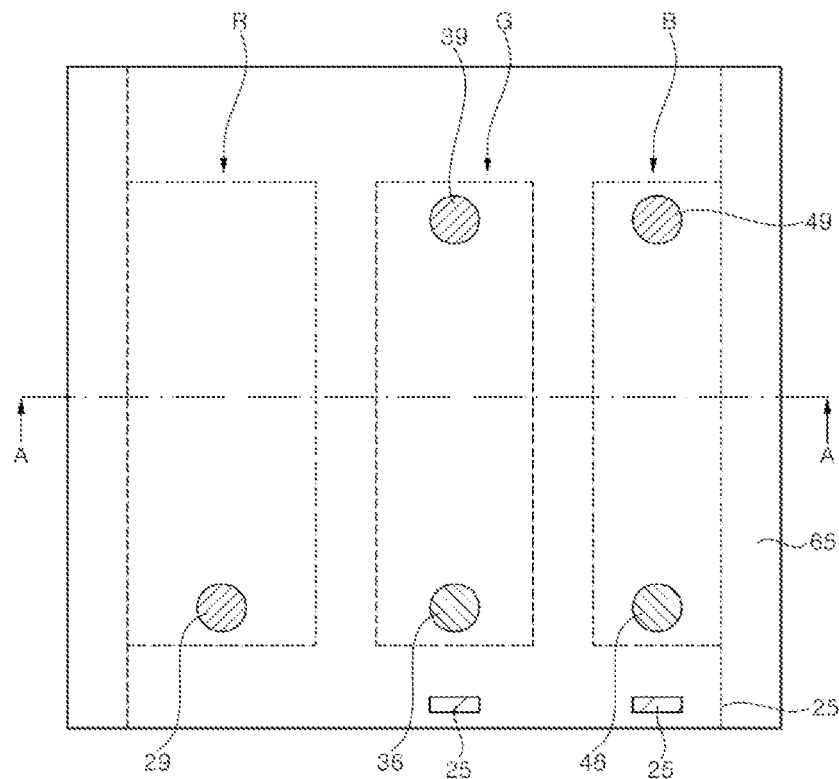
Figure 17B:
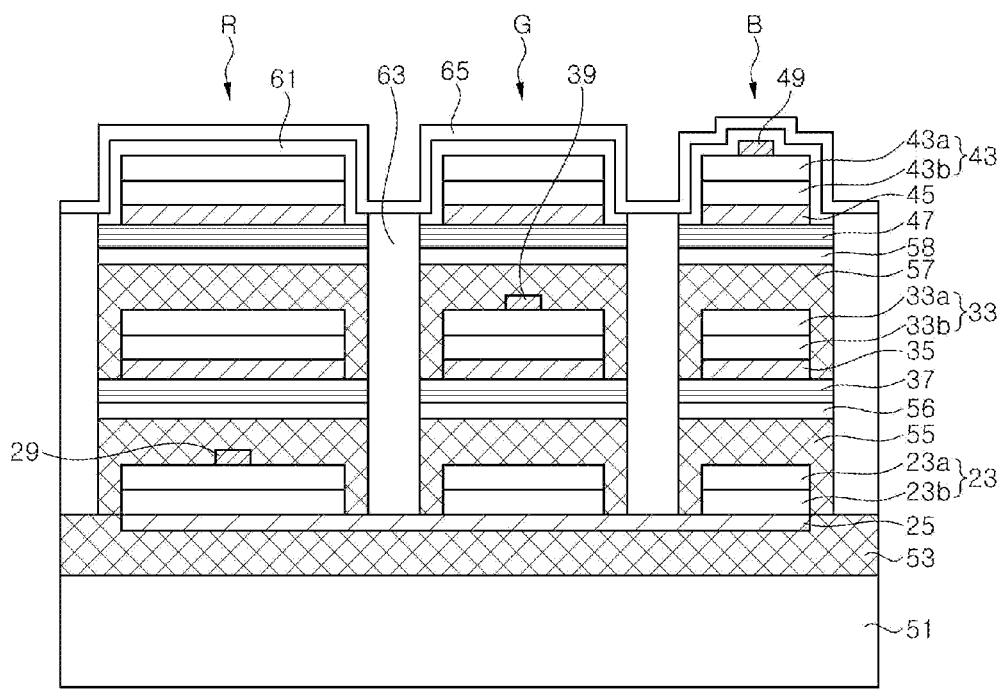

Then, referring to FIG. 17A and FIG. 17B, a second protective layer 65 is formed to cover the first protective layer 61 and the light blocking material layer 63. The first protective layer 61 and the second protective layer 65 are then subjected to patterning to expose the pad regions of the first-1 ohmic electrode 29, the second-1 ohmic electrode 39, and the third-1 ohmic electrode 49, in addition to exposing the electrode pads 36, 46. Furthermore, the reflective electrode 25 is exposed near the electrode pads 36, 46. In some exemplary embodiments, the second protective layer 65 may be omitted.

Figure 18:
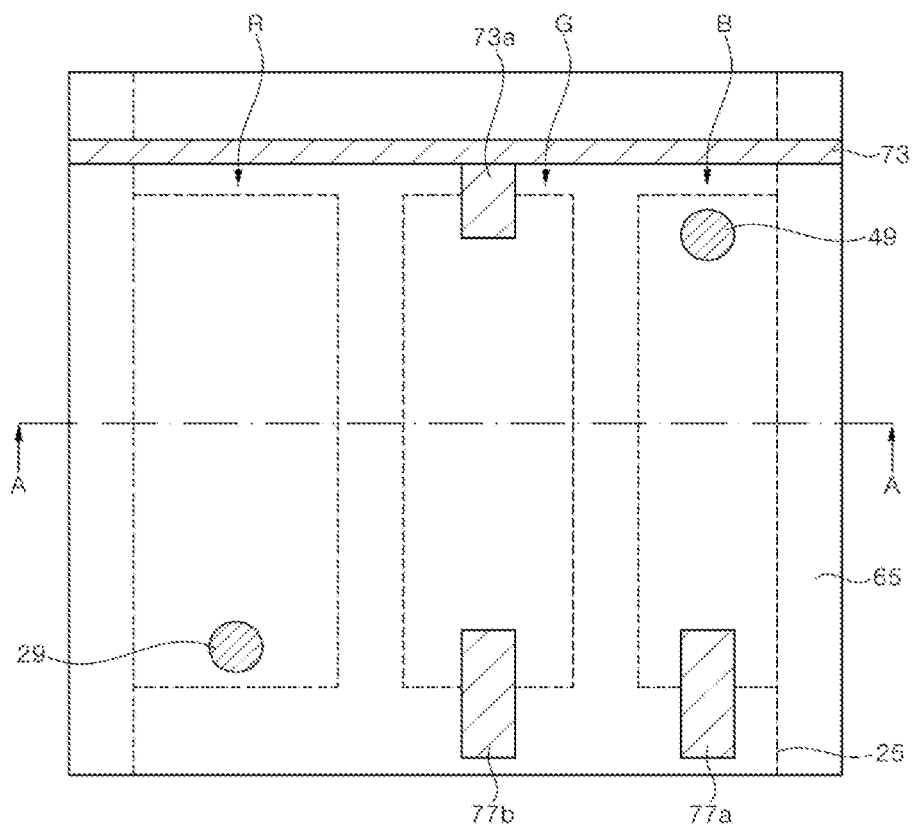

Referring to FIG. 18, an interconnection line 73 and connecting portions 73a, 77a, 77b are formed. The connecting portion 73a connects the second-1 ohmic electrode 39 to the interconnection line 73, the connecting portion 77a connects the electrode pad 46 to the reflective electrode 25, and the connecting portion 77b connects the electrode pad 36 to the reflective electrode 25.

Figure 19A:
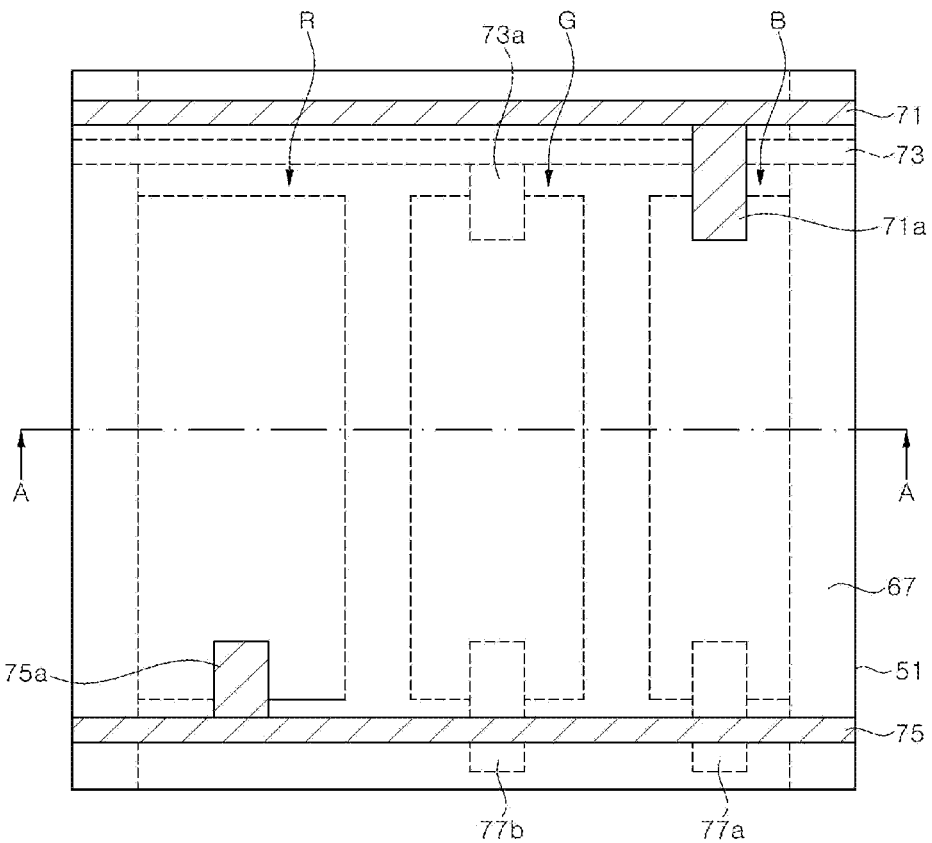
Figure 19B:
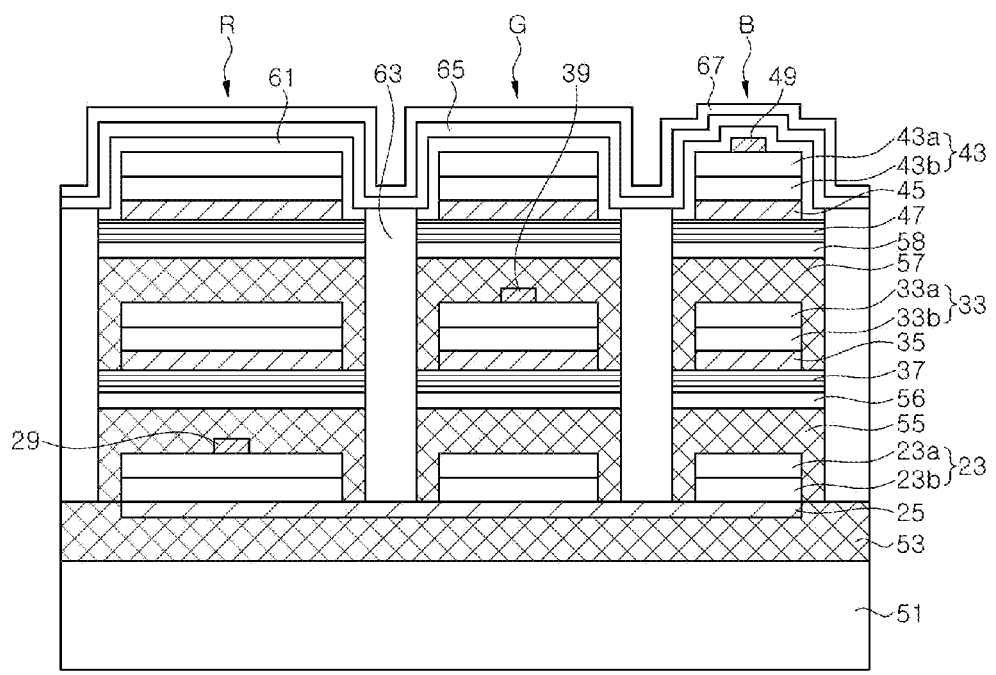

Then, FIG. 19A and FIG. 19B, a third protective layer 67 is formed. The third protective layer 67 covers the interconnection line 73 and the connecting portions 73a, 77a, 77b. Here, the third protective layer 67 exposes the pad regions of the first-1 ohmic electrode 29 and the third-1 ohmic electrode 49.

Next, interconnection lines 71, 75 and connecting portions 71a, 75a are formed on the third protective layer 67. The connecting portion 71a connects the interconnection line 71 to the third-1 ohmic electrode 4,9 and the connecting portion 75a connects the interconnection line 75 to the first-1 ohmic electrode 29.

In this manner, the display apparatus 1000A of FIG. 4 and FIG. 5 may be provided.

Although the pixels are described as being driven in a passive matrix manner, the inventive concepts are not limited thereto, and the pixels in some exemplary embodiments may be driven in an active matrix manner.

Figure 20:
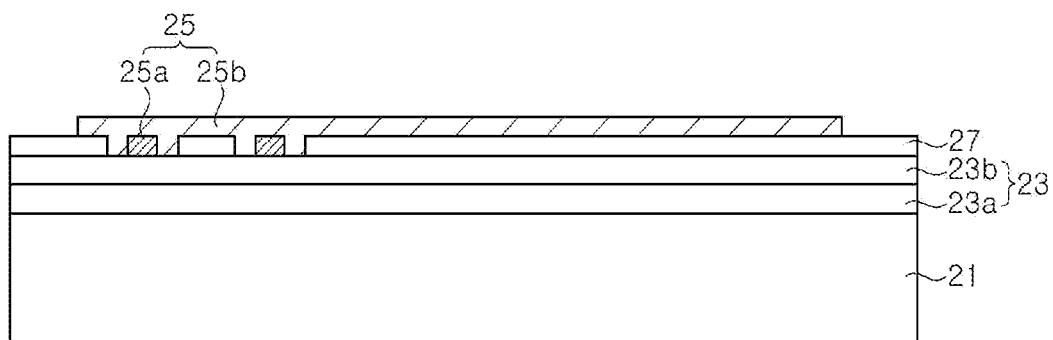
FIG. 20 is a schematic cross-sectional view of a display apparatus according to another exemplary embodiment.

FIG. 20 is a schematic cross-sectional view of a display apparatus according to another exemplary embodiment.

Referring back to FIG. 7A, the reflective electrode 25 is directly formed on the second conductivity type semiconductor layer 23b, however, the inventive concepts are not limited thereto. In particular, referring to FIG. 20, the reflective electrode 25 may include an ohmic contact layer 25a and a reflection layer 25b. The ohmic contact layer 25a may be formed of, for example, Au—Zn alloys or Au—Be alloys, and the reflection layer 25b may be formed of Al, Ag or Au. When the reflection layer 25b is formed of Au, the reflection layer 25b may exhibit relatively high reflectance with respect to light generated from the first LED stack 23, for example, red light, and may exhibit relatively low reflectance with respect to light generated from the second LED stack 33 and the third LED stack 43, for example, green light or blue light. Accordingly, the reflection layer 25b can reduce interference of light generated from the second and third LED stacks 33, 43 and traveling toward the support substrate 51, by absorbing light from the second and third LED stacks 33 and 43.

An insulation layer 27 may be disposed between the reflection layer 25b and the second conductivity type semiconductor layer 23b. The insulation layer 27 may have openings that expose the second conductivity type semiconductor layer 23b, and the ohmic contact layer 25a may be formed in the openings of the insulation layer 27.

Since the reflection layer 25b covers the insulation layer 27, an omnidirectional reflector can be formed by a stacked structure of the first LED stack 23 having a relatively high refractive index, the insulation layer 27 having a relatively low refractive index, and the reflection layer 25b. The reflection layer 25b covers 50% or more of the area of the first LED stack 23 or most of the first LED stack 23, thereby improving luminous efficacy.

In an exemplary embodiment, the reflective electrode 25 may be formed by the following process. First, the first LED stack 23 is grown on a substrate 21 and the insulation layer 27 is formed on the first LED stack 23. Then, opening(s) are formed by patterning the insulation layer 27. For example, $SiO_2$ is formed on the first LED stack 23 and a photoresist is deposited thereon, followed by forming a photoresist pattern through photolithography and development. Thereafter, the $SiO_2$ layer is subjected to patterning through the photoresist pattern as an etching mask, thereby forming the insulation layer 27 having the opening(s) formed therein.

Thereafter, the ohmic contact layer 25a is formed in the opening(s) of the insulation layer 27. The ohmic contact layer 25a may be formed by a lift-off process or the like. After formation of the ohmic contact layer 25a, the reflection layer 25b is formed to cover the ohmic contact layer 25a and the insulation layer 27. The reflection layer 25b may be formed by a lift-off process or the like. The reflection layer 25b may partially or completely cover the ohmic contact layer 25a, as shown in the drawings. The reflective electrode 25 is formed by the ohmic contact layer 25a and the reflection layer 25b. The shape of the reflective electrode 25 may be substantially the same as that of the reflective electrode described above, and thus, detailed descriptions thereof will be omitted to avoid redundancy.

According to the exemplary embodiments, a plurality of pixels may be formed at the wafer level, thereby eliminating a need for individual mounting of light emitting diodes.

Figure 21:
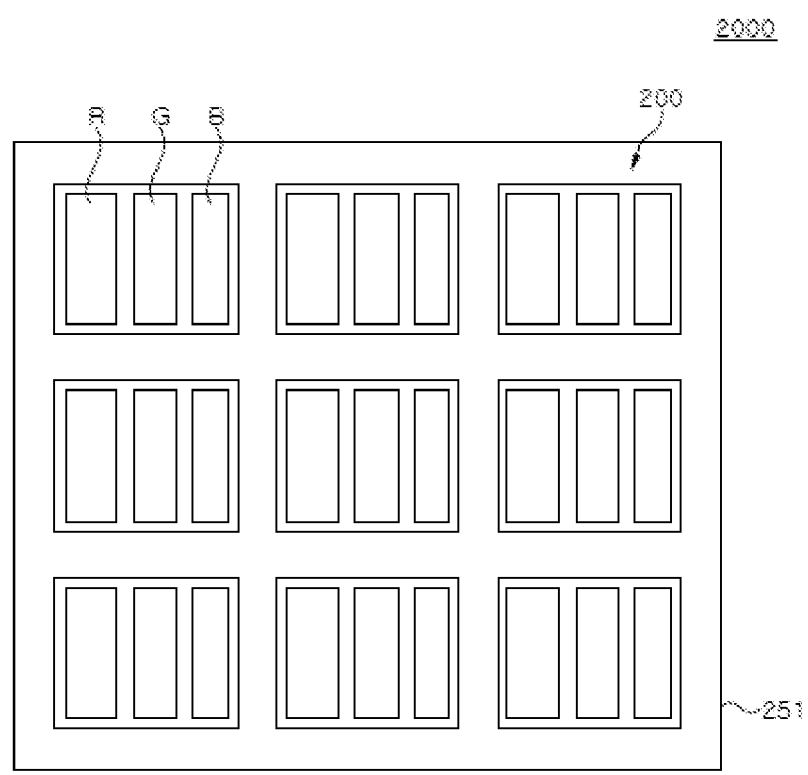
FIG. 21 is a schematic plan view of a display apparatus according to an exemplary embodiment.
Figure 22:
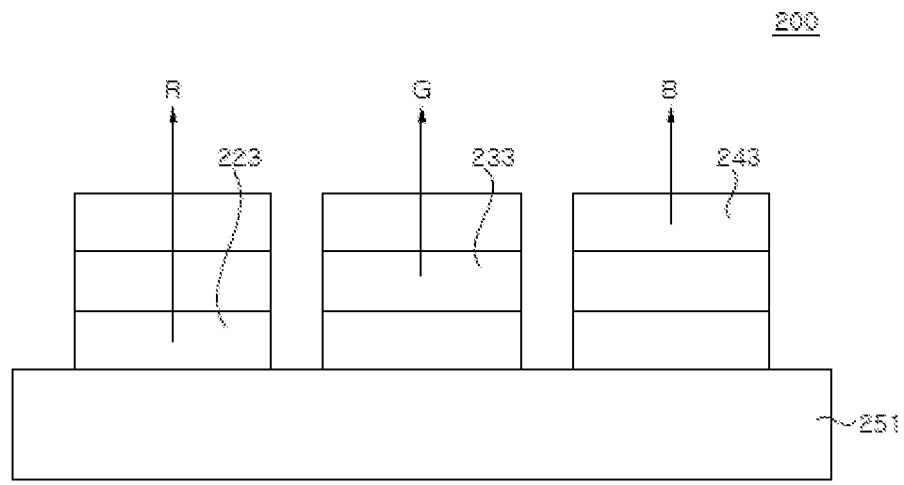
FIG. 22 is a schematic cross-sectional view of a light emitting diode pixel for a display according to an exemplary embodiment.

FIG. 21 is a schematic plan view of a display apparatus according to another exemplary embodiment, and FIG. 22 is a schematic cross-sectional view of a light emitting diode pixel for a display according to an exemplary embodiment.

Referring to FIG. 21, the display apparatus 2000 according to an exemplary embodiment includes a support substrate 251 and a plurality of pixels 200 arranged on the support substrate 251. Each of the pixels 200 includes first to third subpixels R, G, B.

Referring to FIG. 22, the support substrate 251 supports LED stacks 223, 233, 243. The support substrate 251 may include a circuit on a surface thereof or therein, but the inventive concepts are not limited thereto. The support substrate 251 may include, for example, a Si substrate or a Ge substrate.

The first subpixel R includes a first LED stack 223, the second subpixel G includes a second LED stack 233, and the third subpixel B includes a third LED stack 243. The first subpixel R may emit light through the first LED stack 223, the second subpixel G may emit light through the second LED stack 233, and the third subpixel B may emit light through the third LED stack 243. The first to third LED stacks 223, 233, 243 can be independently driven.

As shown in the drawings, the first LED stack 223, the second LED stack 233, and the third LED stack 243 may be disposed at different planes. As shown in the drawings, the second LED stack 233 may be disposed on a higher plane than the first LED stack 223, and the third LED stack 243 may be disposed at a higher plane than the second LED stack 233. In addition, the first LED stack 223, the second LED stack 233, and the third LED stack 243 are separated from each other in the horizontal direction and may not overlap each other. Accordingly, light generated from the first LED stack 223 may be emitted outside without passing through the second LED stack 233 and the third LED stack 243, and light generated from the second LED stack 233 may be emitted outside without passing through the third LED stack 243.

Each of the first LED stack 223, the second LED stack 233, and the third LED stack 243 includes an n-type semiconductor layer, a p-type semiconductor layer, and an active layer interposed therebetween. The active layer may have a multi-quantum well layer structure. The first to third LED stacks 223, 233, 243 may include different active layers to emit light having different wavelengths. For example, the first LED stack 223 may be an inorganic light emitting diode emitting red light, the second LED stack 233 may be an inorganic light emitting diode emitting green light, and the third LED stack 243 may be an inorganic light emitting diode emitting blue light. In an exemplary embodiment, the first LED stack 223 may include a GaInP-based well layer, and the second LED stack 233 and the third LED stack 243 may include GaInN-based well layers. However, the inventive concepts are not limited thereto, and the wavelengths of light emitted from the first LED stack 223, the second LED stack 233, and the third LED stack 243 may be changed. For example, the first LED stack 223, the second LED stack 233, and the third LED stack 243 may emit green light, blue light, and red light, or may emit blue light, green light and red light, respectively.

Figure 23:
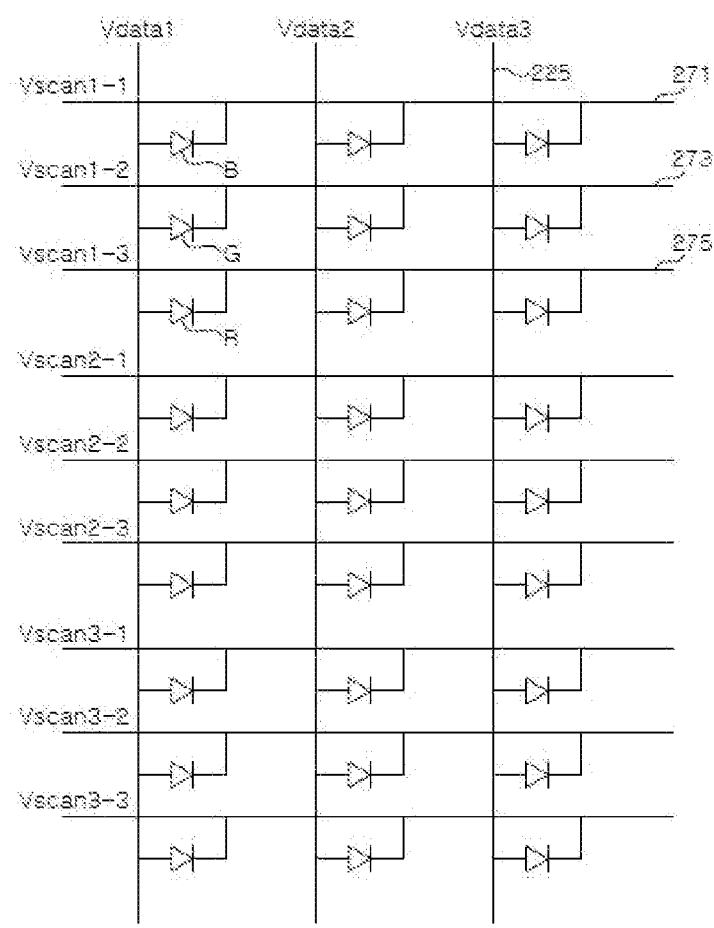
FIG. 23 is a schematic circuit diagram of a display apparatus according to an exemplary embodiment.

FIG. 23 is a schematic circuit diagram of a display apparatus according to an exemplary embodiment.

Referring to FIG. 23, the display apparatus according to an exemplary embodiment may be driven in a passive matrix manner. As described with reference to FIG. 21 and FIG. 22, one pixel includes first to third subpixels R, G, B. The first LED stack 223 of the first subpixel R emits light having a first wavelength, the second LED stack 233 of the second subpixel G emits light having a second wavelength, and the third LED stack 243 of the third subpixel B emits light having a third wavelength. Anodes of the first to third subpixels R, G, B may be connected to a common line, for example, a data line Vdata 225, and cathodes thereof may be connected to different lines, for example, scan lines Vscan 271, 273, 275.

For example, in the first pixel, the anodes of the first to third subpixels R, G, B are commonly connected to the data line Vdata1 and the cathodes thereof are connected to scan lines Vscan1-1, Vscan1-2, Vscan1-3, respectively. Accordingly, the subpixels R, G, B in the same pixel can be individually driven.

In addition, each of the LED stacks 223, 233, 243 may be driven by pulse width modulation or by changing the magnitude of electric current, thereby controlling the brightness of each subpixel. Alternatively, the brightness may be adjusted through adjustment of the areas of the first to third LED stacks 223, 233, 243. For example, an LED stack emitting light having low visibility, for example, the first LED stack 223, may be formed to have a larger area than the second LED stack 233 or the third LED stack 243.

Figure 24:
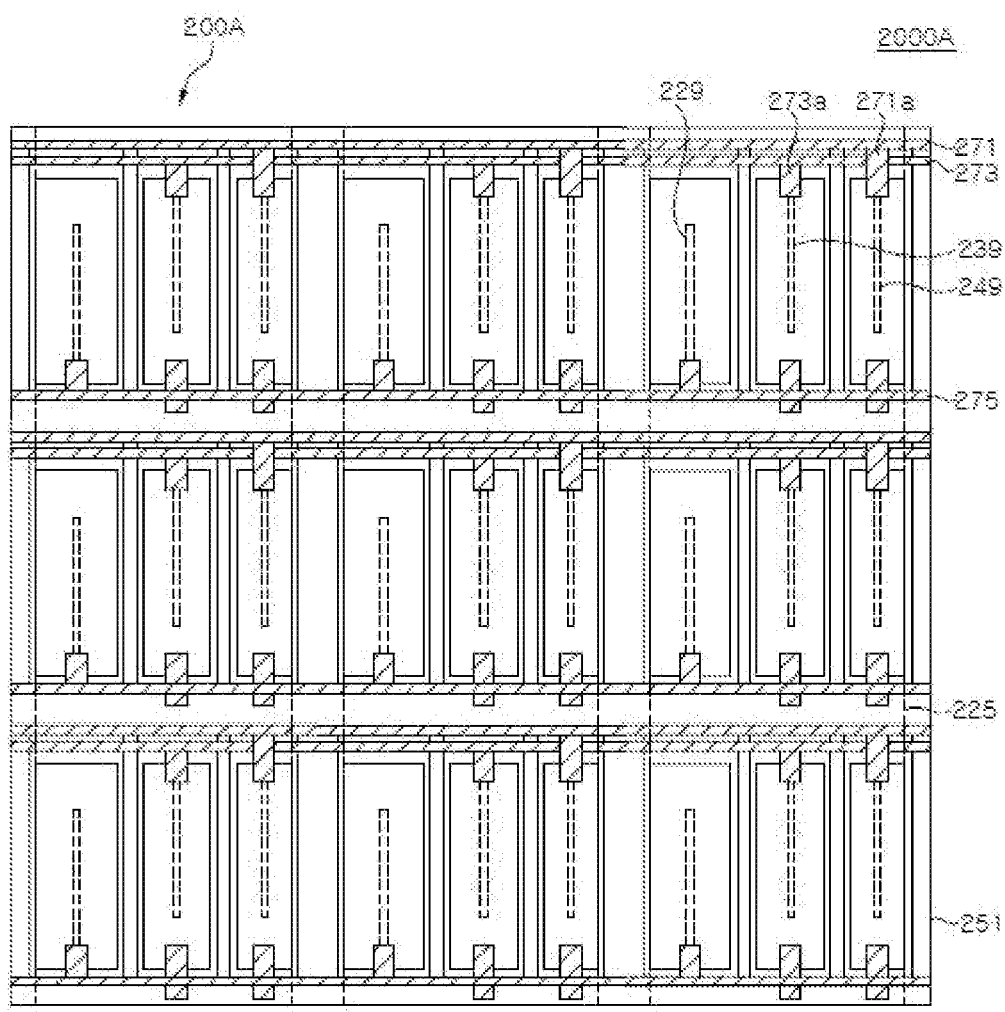
FIG. 24 is a schematic plan view of a display apparatus according to an exemplary embodiment.

FIG. 24 is a schematic plan view of a display apparatus according to an exemplary embodiment.

Referring to FIG. 24, the display apparatus 2000A according to an exemplary embodiment includes a plurality of pixels 200A arranged on a support substrate 251. Each of the subpixels R, G, B is connected to a reflective electrode 225 and interconnection lines 271, 273, 275. As shown in FIG. 23, the reflective electrode 225 may correspond to the data line Vdata and the interconnection lines 271, 273, 275 may correspond to the scan lines Vscan.

The pixels 200A may be arranged in a matrix form, in which anodes of the subpixels R, G, B in each pixel are commonly connected to the reflective electrode 225, and cathodes thereof are connected to the interconnection lines 271, 273, 275 separated from each other, respectively. The connecting portions 271a, 273a, 275a may connect the interconnection lines 271, 273, 275 to the subpixels R, G, B.

Figure 25:
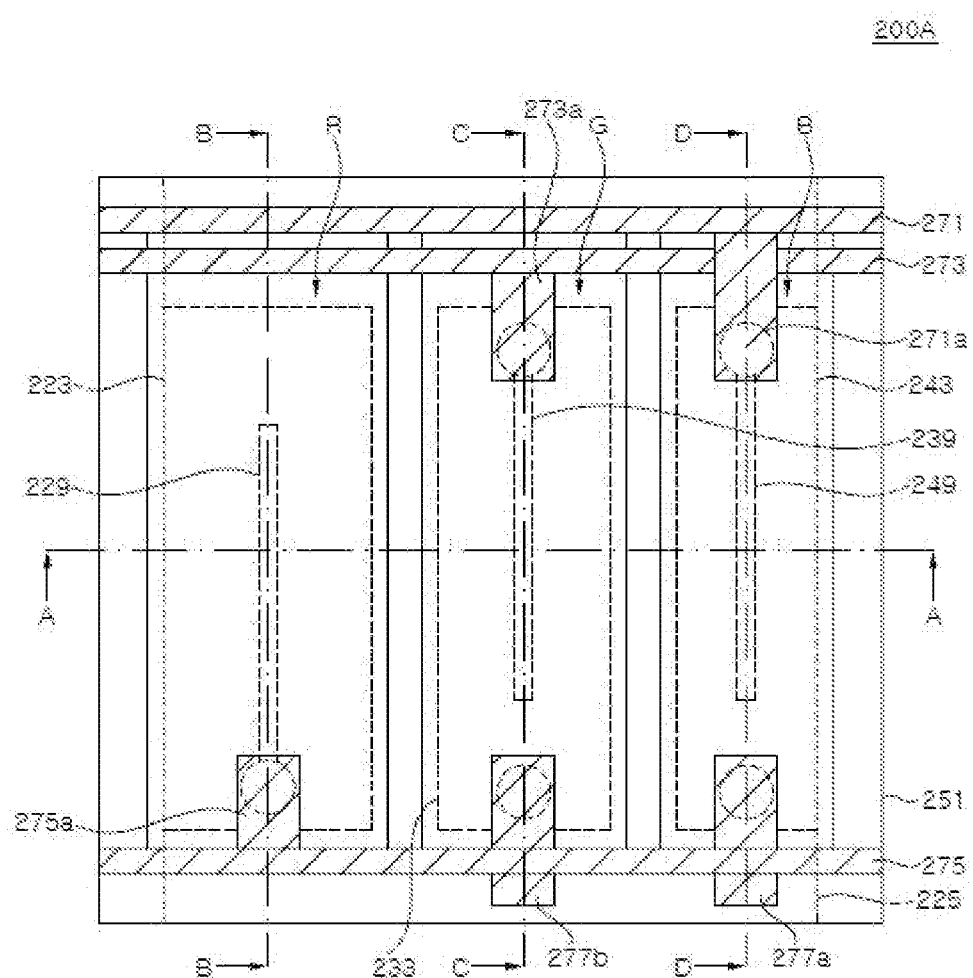
FIG. 25 is an enlarged plan view of one pixel of the display apparatus of FIG. 24.

FIG. 25 is an enlarged plan view of one pixel 200A of the display apparatus of FIG. 24, and FIG. 26A, FIG. 26B, FIG. 26C, and FIG. 26D are schematic cross-sectional views taken along lines A-A, B-B, C-C, and D-D of FIG. 25, respectively.

Referring to FIG. 24, FIG. 25, FIG. 26A, FIG. 26B, FIG. 26C, and FIG. 26D, the display apparatus 2000A may include a support substrate 251, a plurality of pixels 200A, first to third subpixels R, G, B, a first LED stack 223, a second LED stack 233, a third LED stack 243, a reflective electrode 225 (or a first-2 ohmic electrode), a first-1 ohmic electrode 229, a second-1 ohmic electrode 239, a second-2 ohmic electrode 235, a third-1 ohmic electrode 249, a third-2 ohmic electrode 245, hydrophilic material layers 256, 258, a first bonding layer 253, a second bonding layer 255, a third bonding layer 257, a first protective layer 261, a light blocking material 263, a second protective layer 265, interconnection lines 271, 273, 275, and connecting portions 271a, 273a, 275a, 277a, 277b.

The support substrate 251 supports the LED stacks 223, 233, 243. The support substrate 251 may include a circuit on a surface thereof or therein, without being limited thereto. The support substrate 251 may include, for example, a glass substrate, a sapphire substrate, a Si substrate, or a Ge substrate.

The first LED stack 223 includes a first conductivity type semiconductor layer 223a and a second conductivity type semiconductor layer 223b. The second LED stack 233 includes a first conductivity type semiconductor layer 233a and a second conductivity type semiconductor layer 233b. The third LED stack 243 includes a first conductivity type semiconductor layer 243a and a second conductivity type semiconductor layer 243b. In addition, active layers may be interposed between the first conductivity type semiconductor layers 223a, 233a, 243a and the second conductivity type semiconductor layers 223b, 233b, 243b, respectively.

In an exemplary embodiment, each of the first conductivity type semiconductor layers 223a, 233a, 243a may be an n-type semiconductor layer, and each of the second conductivity type semiconductor layers 223b, 233b, 243b may be a p-type semiconductor layer. In some exemplary embodiments, a roughened surface may be formed on the surfaces of the first conductivity type semiconductor layers 223a, 233a, 243a by surface texturing. However, the inventive concepts are not limited thereto, and the semiconductor types in each of the LED stacks may be changed.

The first LED stack 223 is disposed near the support substrate 251, the second LED stack 233 is disposed at a higher plane than the first LED stack 223, and the third LED stack 243 is disposed at a higher plane than the second LED stack 233. In addition, the second LED stack 233 is separated from the first LED stack 223 in the horizontal direction, and thus does not overlap the first LED stack 223. The third LED stack 243 is separated from the first and second LED stacks 223, 233 in the horizontal direction, and thus, does not overlap the first and second LED stacks 223, 233. Accordingly, light generated from the first LED stack 223 may be emitted outside without passing through the second and third LED stacks 33, 43. In addition, light generated from the second LED stack 233 may be emitted outside without passing through the third LED stack 243.

Materials forming the first LED stack 223, the second LED stack 233, and the third LED stack 243 are substantially the same as those described with reference to FIG. 22, and thus, detailed descriptions thereof will be omitted to avoid redundancy.

The reflective electrode 225 forms ohmic contact with a lower surface of the first LED stack 223, for example, the second conductivity type semiconductor layer 223b. The reflective electrode 225 may be continuously disposed under the first to third subpixels R, G, B. Furthermore, the reflective electrode 225 may be commonly connected to the plurality of pixels 200a and may be used as the data line Vdata.

The reflective electrode 225 may be formed of, for example, a material layer forming ohmic contact with the second conductivity type semiconductor layer 223b of the first LED stack 223, and may include a reflection layer that may reflect light generated from the first LED stack 223, for example, red light.

The reflective electrode 225 may include an ohmic reflection layer and may be formed of, for example, an Au—Zn alloy or an Au—Be alloy. These alloys have high reflectance to light in the red range and form ohmic contact with the second conductivity type semiconductor layer 223b.

Figure 26A:
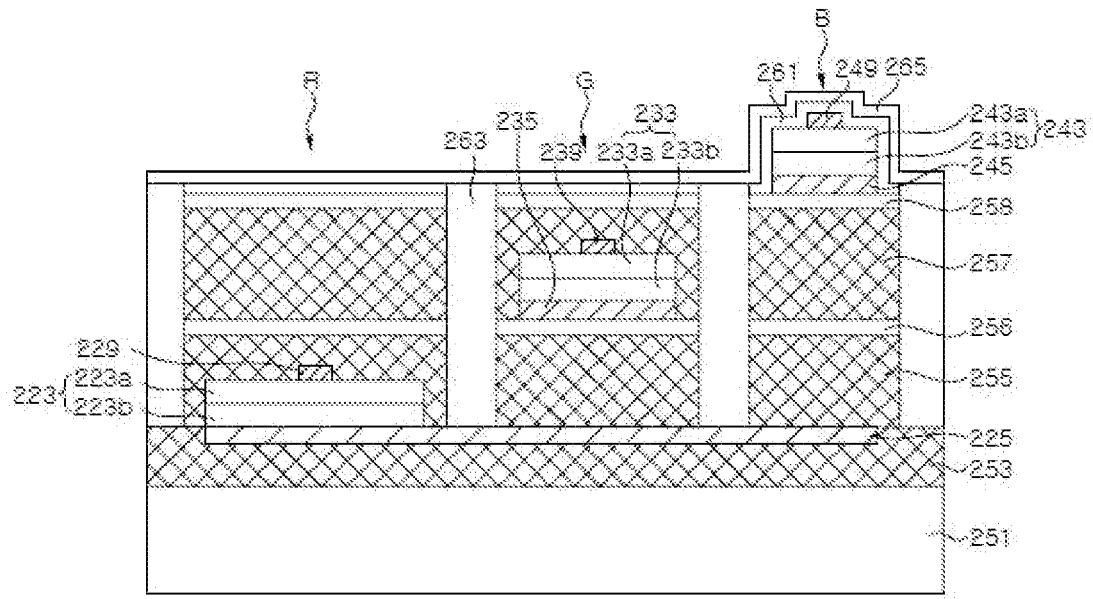
FIG. 26A is a schematic cross-sectional view taken along line A-A of FIG. 25.
Figure 26B:
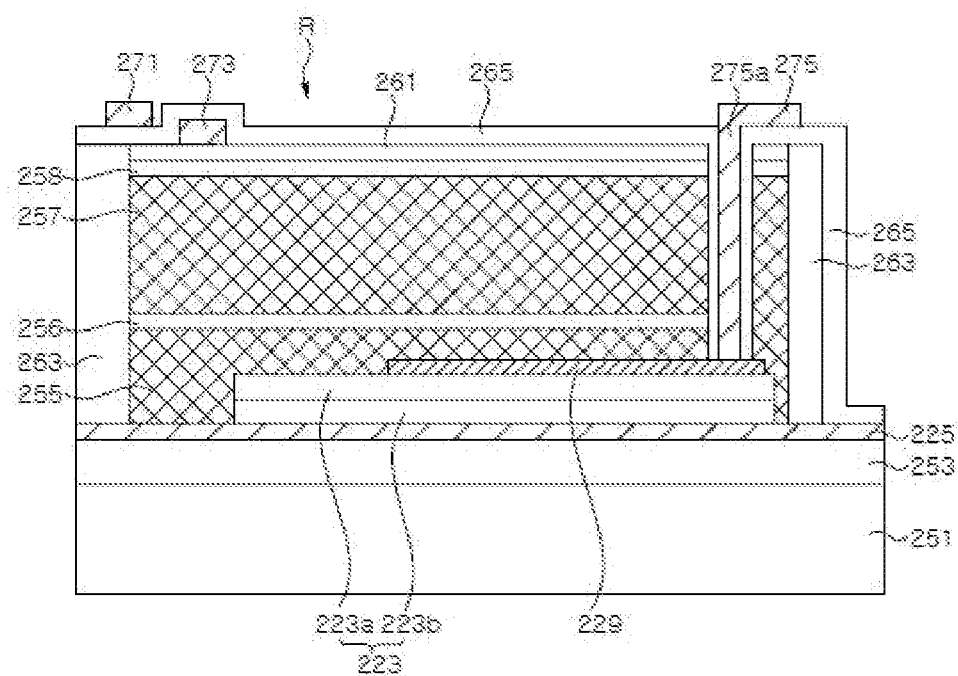
FIG. 26B is a schematic cross-sectional view taken along line B-B of FIG. 25.

The first-1 ohmic electrode 229 forms ohmic contact with the first conductivity type semiconductor layer 223a of the first subpixel R. The first-1 ohmic electrode 229 may include a pad region and an extended portion (see FIG. 28A), and the connecting portion 275a may be connected to the pad region of the first-1 ohmic electrode 229, as shown in FIG. 26B.

Figure 26C:
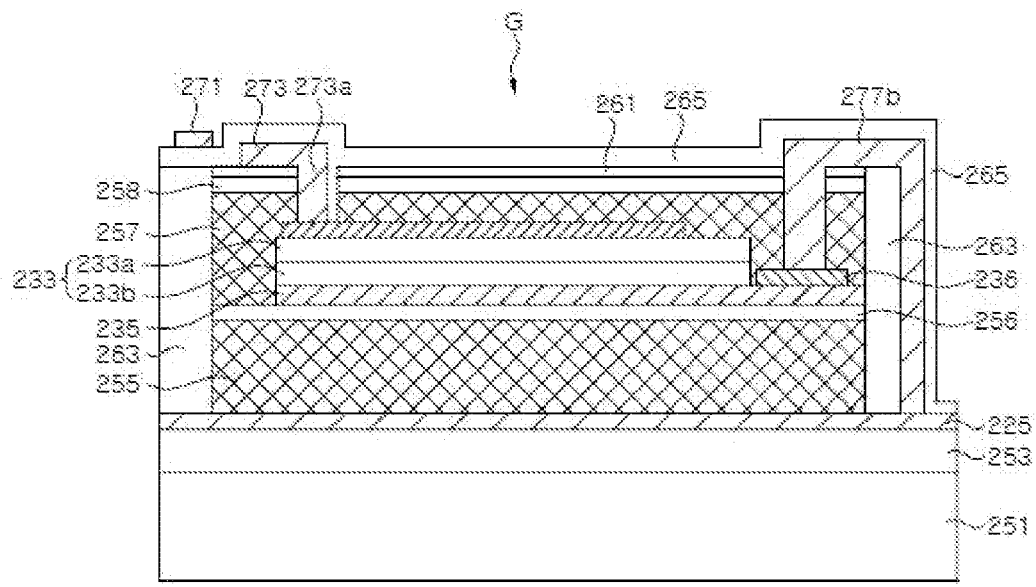
FIG. 26C is a schematic cross-sectional view taken along line C-C of FIG. 25.

The second-1 ohmic electrode 239 forms ohmic contact with the first conductivity type semiconductor layer 233a of the second LED stack 233. The second-1 ohmic electrode 239 may include a pad region and an extended portion (see FIG. 30A), and the connecting portion 273a may be connected to the pad region of the second-1 ohmic electrode 239, as shown in FIG. 26C.

The second-2 ohmic electrode 235 forms ohmic contact with the second conductivity type semiconductor layer 233b of the second LED stack 233. The second-2 ohmic electrode 235 may be transparent to light generated from the first LED stack 223 and may be formed of, for example, a metal layer or a conductive oxide layer. Alternatively, the second-2 ohmic electrode 235 may not be transparent and may include a reflective metal layer.

An electrode pad 236 may be formed on the second-2 ohmic electrode 235. The electrode pad 236 is disposed in a restricted area of the second-2 ohmic electrode 235, and the connecting portion 277b may be connected to the electrode pad 236.

Figure 26D:
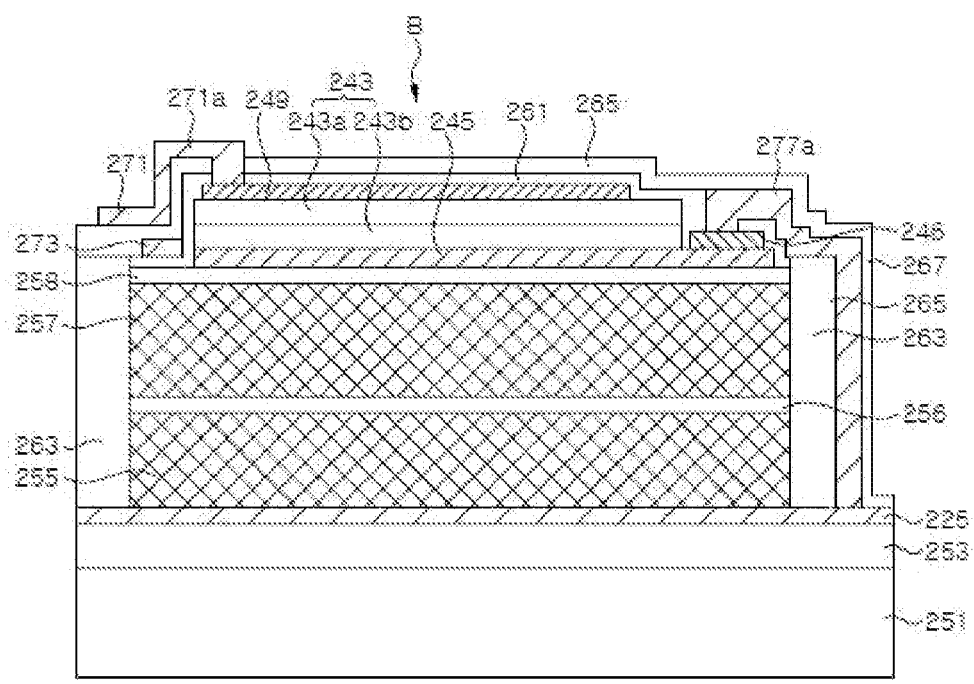
FIG. 26D is a schematic cross-sectional view taken along line D-D of FIG. 25.

The third-1 ohmic electrode 249 forms ohmic contact with the first conductivity type semiconductor layer 243a of the third LED stack 243. The third-1 ohmic electrode 249 may include a pad region and an extended portion (see FIG. 32A), and the connecting portion 271a may be connected to the pad region of the third-1 ohmic electrode 249, as shown in FIG. 26D.

The third-2 ohmic electrode 245 forms ohmic contact with the second conductivity type semiconductor layer 243b of the third LED stack 243. The third-2 ohmic electrode 245 may be transparent to light generated from the second LED stack 233 and may be formed of, for example, a metal layer or a conductive oxide layer. Alternatively, the third-2 ohmic electrode 245 may not be transparent and may include a reflective metal layer.

An electrode pad 246 is formed on the third-2 ohmic electrode 245. The electrode pad 246 is disposed in a restricted area of the third-2 ohmic electrode 245. The connecting portion 277a may be connected to the electrode pad 246.

The reflective electrode 225, the second-2 ohmic electrode 235, and the third-2 ohmic electrode 245 may assist in current spreading through ohmic contact with the p-type semiconductor layer of each LED stack, and the first-1 ohmic electrode 229, the second-1 ohmic electrode 239 and the third-1 ohmic electrode 249 may assist in current spreading through ohmic contact with the n-type semiconductor layer of each LED stack.

The first bonding layer 253 couples the first LED stack 223 to the support substrate 251. As shown in the drawings, the reflective electrode 225 may adjoin the first bonding layer 253. The first bonding layer 253 may be continuously disposed under the first subpixel R, the second subpixel G, and the third subpixel B. The first bonding layer 253 may be a light transmissive or opaque layer. The first bonding layer 253 may be formed of an organic or inorganic material. Examples of the organic material may include SU8, poly (methyl methacrylate) (PMMA), polyimide, Parylene, benzocyclobutene (BCB), or others, and examples of the inorganic material may include $Al_2O_3$, $SiO_2$, $SiN_x$, or others. The organic material layers may be bonded under high vacuum and high pressure conditions, and the inorganic material layers may be bonded under high vacuum after changing the surface energy using plasma through, for example, chemical mechanical polishing, to flatten the surfaces of the inorganic material layers. In particular, the first bonding layer 253 may include a black epoxy resin capable of absorbing light to improve contrast of a display apparatus. The first bonding layer 253 may also be formed of transparent spin-on-glass.

The second bonding layer 255 may cover the first LED stack 223, and couple the second LED stack 233 to the reflective electrode 225. The second bonding layer 255 may also be disposed under the third LED stack 243. The second bonding layers 255 of the first to third subpixels R, G, B may be separated from each other.

The second bonding layer 255 may be formed of a transparent organic material or a transparent inorganic material. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. In addition, the second bonding layer 255 may also be formed of transparent spin-on-glass.

As shown in the drawings, in a region for the first subpixel R, the second bonding layer 255 may adjoin the first LED stack 223. Further, in a region for the second subpixel G, the second bonding layer 255 may adjoin the second-2 ohmic electrode 235. In addition, an additional hydrophilic material layer 256 may be further formed between the second bonding layer 255 and the second-2 ohmic electrode 235. The hydrophilic material layer 256 may remain in the regions for the first subpixel R and the third subpixel B.

The hydrophilic material layer 256 changes the surface properties of the second bonding layer 255 from hydrophobic to hydrophilic, thereby improving adhesive strength of the second bonding layer 255 to prevent the second bonding layer 255 from being peeled off during manufacture or use. In some exemplary embodiments, the hydrophilic material layer 256 may be omitted. The hydrophilic material layer 256 may be formed through depositing $SiO_2$ on the surface of second-2 ohmic electrode 235 or through plasma modification of the surface of the second-2 ohmic electrode 235.

In some exemplary embodiments, a hydrophilic material layer may also be formed on the surface of the first LED stack 223 or the reflective electrode 225. In addition, an additional hydrophilic material layer may be added to the surface of the reflective electrode 225 or the support substrate 251.

The ohmic electrode 229 may be covered by the second bonding layer 255. The second bonding layer 255 transmits light generated from the first LED stack 223.

The third bonding layer 257 couples the third LED stack 243 to the second LED stack 233. The third bonding layer 257 may be formed of a transparent organic material, a transparent inorganic material, or transparent spin-on-glass as in the second bonding layer 255. As shown in the drawings, the third bonding layer 257 may be disposed above the second bonding layer 255 in the region for the first subpixel R, and may cover the second LED stack 233 in the region for the second subpixel G. As described above, the hydrophilic material layer 258 is formed under the third-2 ohmic electrode 245, and the third bonding layer 257 may adjoin the hydrophilic material layer 258. In some exemplary embodiments, an additional hydrophilic material layer may be further formed on the second LED stack 233.

The first protective layer 261 covers the subpixels R, G, B. The first protective layer 261 may be formed of silicon oxide or silicon nitride.

The light blocking material 263 surrounds the subpixels R, G, B. The light blocking material 263 may be formed of a reflective white material or a light absorptive black material. For example, the light blocking material 263 may be formed of white PSR or a black epoxy resin. The light blocking material 263 blocks light emitted through side surfaces of the subpixels R, G, B to prevent light interference between the subpixels. The second protective layer 265 may be formed on the first protective layer 261 and the light blocking material 263.

As shown in FIG. 24 and FIG. 25, the interconnection lines 271, 273, 275 may be disposed to be substantially orthogonal to the reflective electrode 225. The interconnection lines 271, 275 may be disposed on the second protective layer 265, and may be connected to the third-ohmic electrode 249 and the first-1 ohmic electrode 229 through the connecting portions 271a, 275a, respectively. In an exemplary embodiment, the first protective layer 261 and the second protective layer 265 have openings that expose the third-1 ohmic electrode 249 and the first-1 ohmic electrode 229.

The interconnection line 273 may be disposed between the first protective layer 261 and the second protective layer 265, and may be connected to the second-1 ohmic electrode 239 through the connecting portion 273a. In the illustrated exemplary embodiment, the first protective layer 261 has openings that expose the second-1 ohmic electrode 239.

In addition, the connecting portions 277a, 277b are disposed between the first protective layer 261 and the second protective layer 265, and electrically connect the electrode pads 246, 236 to the reflective electrode 225. In the illustrated exemplary embodiment, the first protective layer 261 may have openings that expose the electrode pads 236, 246.

The interconnection line 271 and the interconnection line 273 are insulated from each other by the second protective layer 265, and thus, may be disposed to overlap each other in the vertical direction.

Although the electrodes of each pixel are described as being connected to the data line and the scan lines, and the interconnection lines 271, 275 are described as being disposed on the second protective layer 265, and the interconnection line 273 is described as being disposed between the first protective layer 261 and the second protective layer 265, the inventive concepts are not limited thereto. For example, all of the interconnection lines 271, 275, 273 may be formed on the first protective layer 261 and covered by the second protective layer 265, and the connecting portions 271a, 275a may be formed on the second protective layer 265.

Next, a method of manufacturing the display apparatus 2000A according to an exemplary embodiment will hereinafter be described.

FIG. 27 to FIG. 39 are schematic plan view and cross-sectional views illustrating a method of manufacturing a display apparatus according to an exemplary embodiment.

Figure 27A:
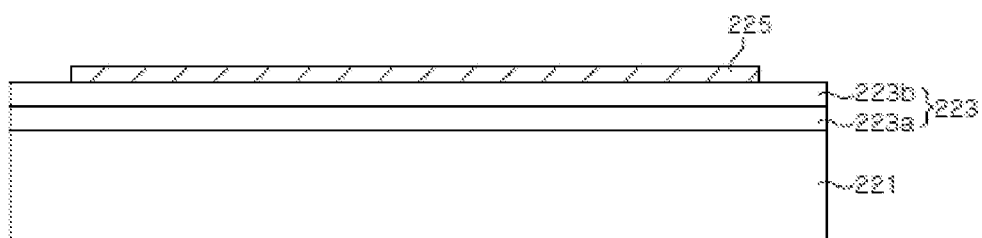
FIGS. 27A, 27B, 27C, 28A, 28B, 29A, 29B, 30A, 30B, 31A, 31B, 32A, 32B, 33A, 33B, 34A, 34B, 35A, 35B, 36A, 36B, 37A, 37B, 38, 39A, and 39B are schematic plan views and cross-sectional views illustrating a method of manufacturing a display apparatus according to an exemplary embodiment.

First, referring to FIG. 27A, a first LED stack 223 is grown on a first substrate 221. The first substrate 221 may be, for example, a GaAs substrate. The first LED stack 223 may be formed of AlGaInP-based semiconductor layers, and includes a first conductivity type semiconductor layer 223a, an active layer, and a second conductivity type semiconductor layer 223b.

Then, a reflective electrode 225 is formed on the first LED stack 223. The reflective electrode 225 may be formed of, for example, an Au—Zn alloy or an Au—Be alloy.

The reflective electrode 225 may be formed by a lift-off process, or the like, and may be subjected to patterning to have a particular shape. For example, the reflective electrode 225 may be patterned to have a width corresponding to all of subpixels R, G, B and a length connecting a plurality of pixels. However, the inventive concepts are not limited thereto. Alternatively, the reflective electrode 225 may be formed over the upper surface of the first LED stack 223 without patterning or may be subjected to patterning after formation thereon.

The reflective electrode 225 may form ohmic contact with the second conductivity type semiconductor layer 223b of the first LED stack 223, for example, a p-type semiconductor layer.

Figure 27B:
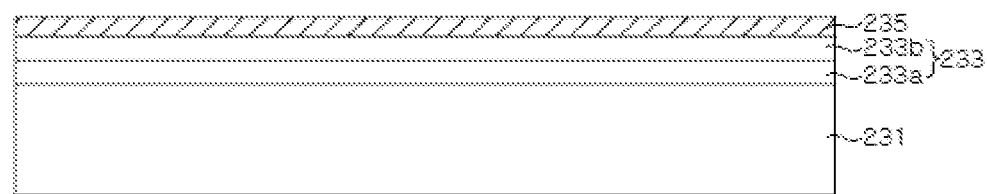

Referring to FIG. 27B, a second LED stack 233 is grown on a second substrate 231, and a second-2 ohmic electrode 235 is formed on the second LED stack 233. The second LED stack 233 may be formed of GaN-based semiconductor layers, and may include a first conductivity type semiconductor layer 233a, a GaInN well layer, and a second conductivity type semiconductor layer 233b. The second substrate 231 is a substrate capable of growing the GaN-based semiconductor layers thereon, and may be different from the first substrate 221. The GaInN composition of the second LED stack 233 may be determined such that the second LED stack 233 may emit green light, for example. The second-2 ohmic electrode 235 forms ohmic contact with the second conductivity type semiconductor layer 233b, for example, a p-type semiconductor layer.

Figure 27C:
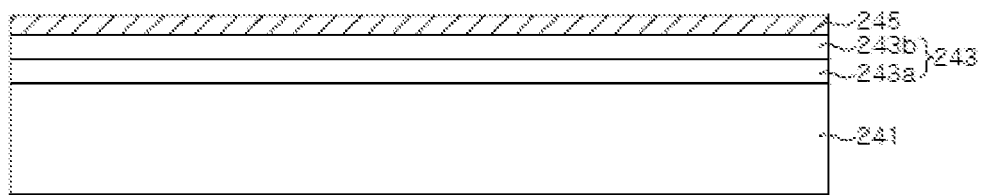

Referring to FIG. 27C, a third LED stack 243 is grown on a third substrate 241, and a third-2 ohmic electrode 245 is formed on the third LED stack 243. The third LED stack 243 may be formed of GaN-based semiconductor layers, and may include a first conductivity type semiconductor layer 243a, a GaInN well layer, and a second conductivity type semiconductor layer 243b. The third substrate 241 is a substrate capable of growing the GaN-based semiconductor layers thereon, and may be different from the first substrate 221. The GaInN composition of the third LED stack 243 may be determined such that the third LED stack 243 may emit blue light, for example. The third-2 ohmic electrode 245 forms ohmic contact with the second conductivity type semiconductor layer 243b, for example, a p-type semiconductor layer.

Since the first LED stack 223, the second LED stack 233, and the third LED stack 243 may be grown on different substrates, the sequence of forming the first to third LED stacks not particularly limited.

Figure 28A:
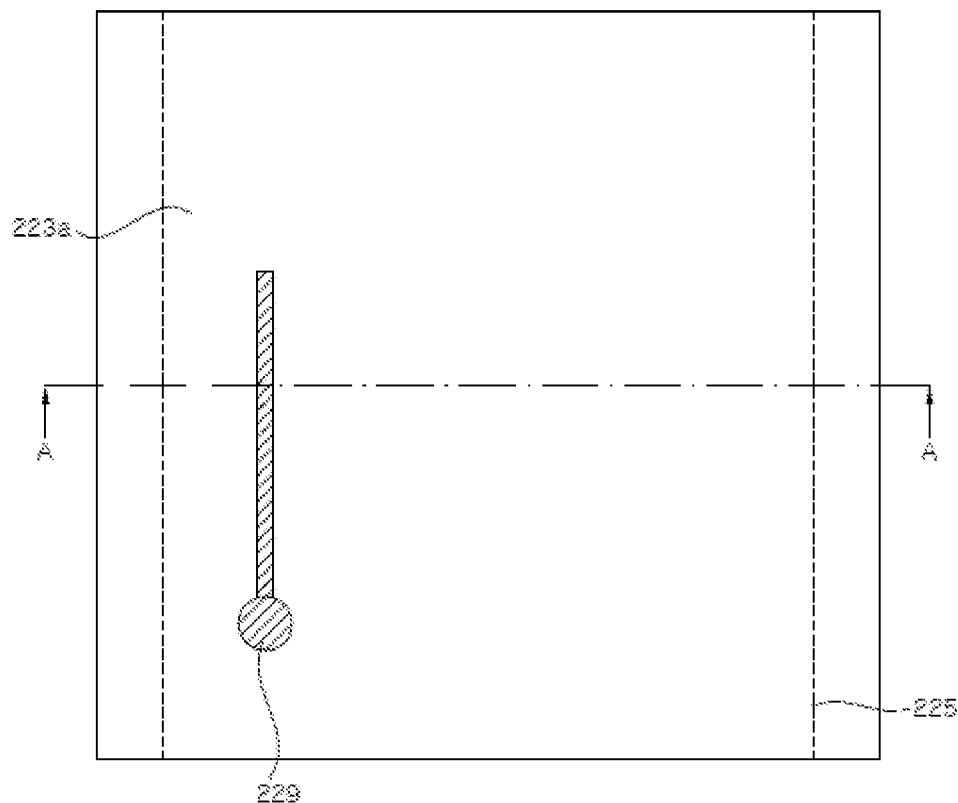
Figure 28B:
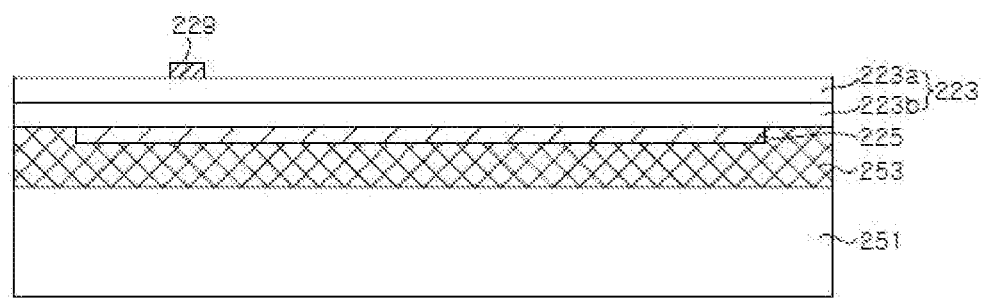

Referring to FIG. 28A and FIG. 28B, the first LED stack 223 of FIG. 27A is coupled to an upper side of a support substrate 251 via a first bonding layer 253. The reflective electrode 225 may be disposed to face the support substrate 251 and may be bonded to the first bonding layer 253. The first substrate 221 is removed from the first LED stack 223 by chemical etching or the like. As such, an upper surface of the first conductivity type semiconductor layer 223a of the first LED stack 223 is exposed. In some exemplary embodiments, a roughened surface may be formed on the exposed surface of the first conductivity type semiconductor layer 223a by surface texturing or the like.

Then, a first-1 ohmic electrode 229 is formed on the exposed surface of the first LED stack 223. The ohmic electrode 229 may be formed of, for example, an Au—Te alloy or an Au—Ge alloy. The ohmic electrode 229 may be formed in each pixel region. The ohmic electrode 229 may be formed in a first subpixel R. The ohmic electrode 229 may include a pad region and an extended portion, as shown in the drawings. The extended portion may extend substantially in the longitudinal direction of the reflective electrode 225, as shown in the drawings.

Figure 29A:
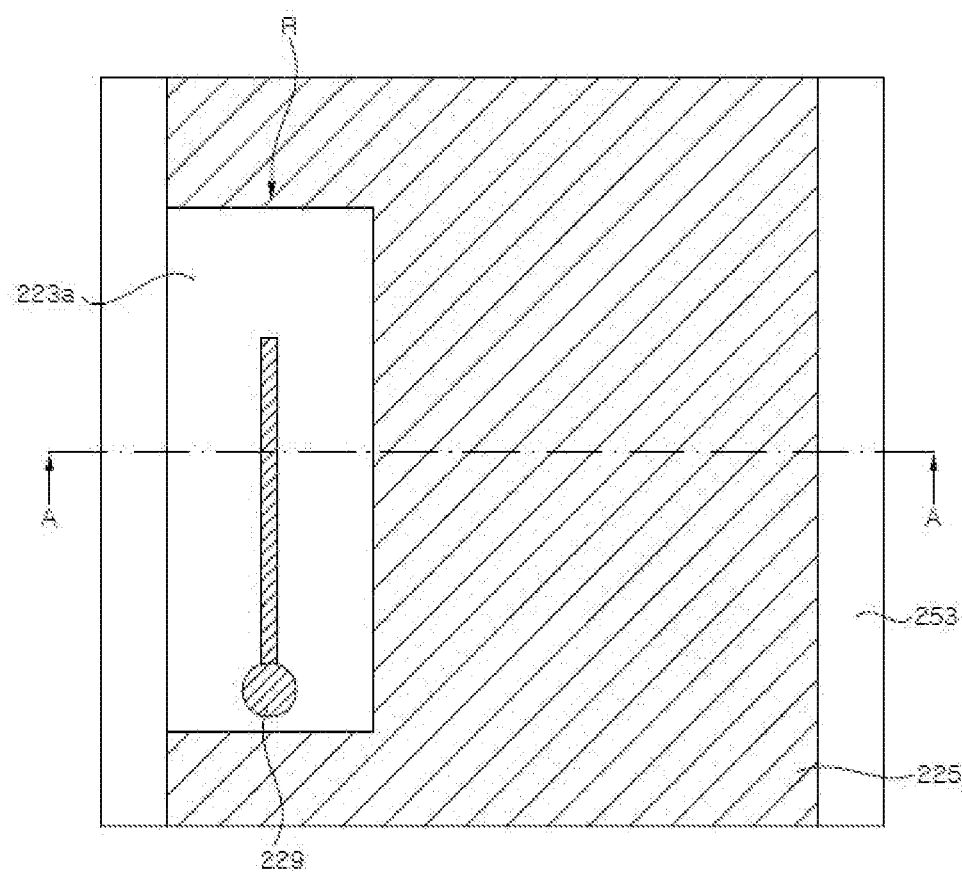
Figure 29B:
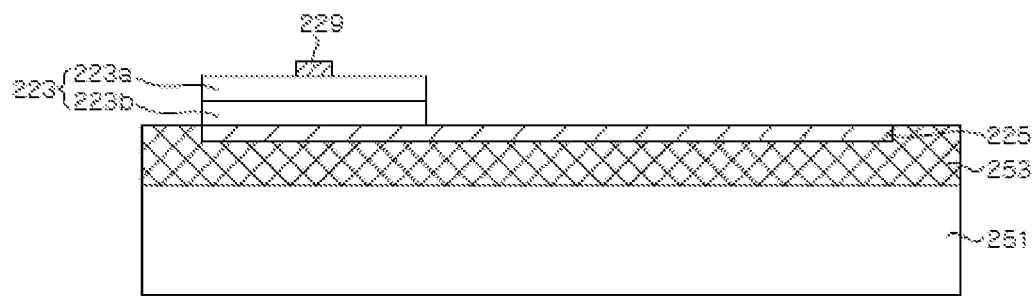

Referring to FIG. 29A and FIG. 29B, the first LED stack 223 is removed from a region excluding the region corresponding to the first subpixel R by patterning the first LED stack 223. The first-1 ohmic electrode 229 remains in the region for the first subpixel R. As the first LED stack 223 is subjected to patterning, the reflective electrode 225 is exposed, and the surface of the first bonding layer 253 may also be partially exposed. In other exemplary embodiments, an insulation layer may be disposed on the first bonding layer 253, and thus, the surface of the first bonding layer 253 may not be exposed.

Figure 30A:
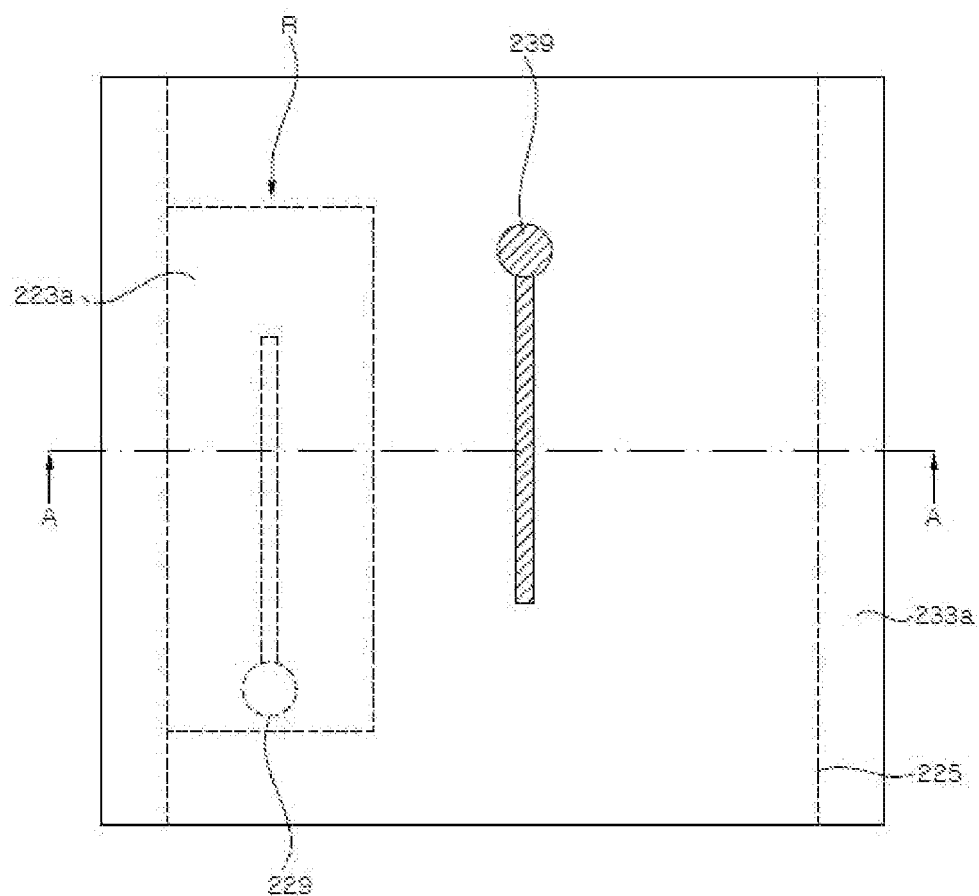
Figure 30B:
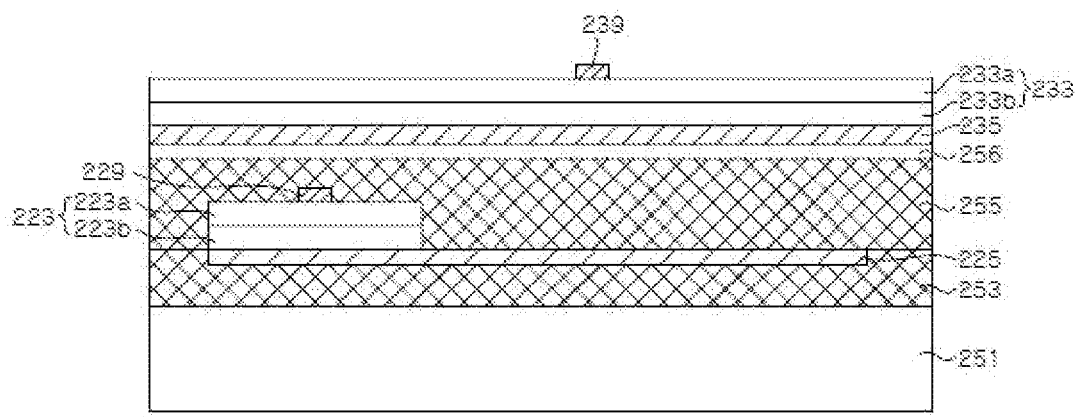

Referring to FIG. 30A and FIG. 30B, the second LED stack 233 of FIG. 27B is coupled to an upper side of the first LED stack 223 via a second bonding layer 255. The second-2 ohmic electrode 235 is disposed to face the first LED stack 23 and is bonded to the second bonding layer 255. A hydrophilic material layer 256 may be formed on the second-2 ohmic electrode 235, and the second bonding layer 255 may adjoin the hydrophilic material layer 256. In some exemplary embodiments, a hydrophilic material layer may be further formed on the first LED stack 23. The second substrate 231 may be removed from the second LED stack 233 by laser lift-off or chemical lift-off. As such, an upper surface of the first conductivity type semiconductor layer 233a of the second LED stack 233 is exposed. In some exemplary embodiments, a roughened surface may be formed on the exposed surface of the first conductivity type semiconductor layer 233a by surface texturing or the like.

Next, a second-1 ohmic electrode 239 is formed on the first conductivity type semiconductor layer 233a. The second-1 ohmic electrode 239 is formed in the region corresponding to the second subpixel G. As shown in FIG. 30A, the second-1 ohmic electrode 239 may include a pad region and an extended portion. The extended portion may extend substantially in the longitudinal direction of the reflective electrode 225. The second-1 ohmic electrode 239 forms ohmic contact with the first conductivity type semiconductor layer 233a.

Figure 31A:
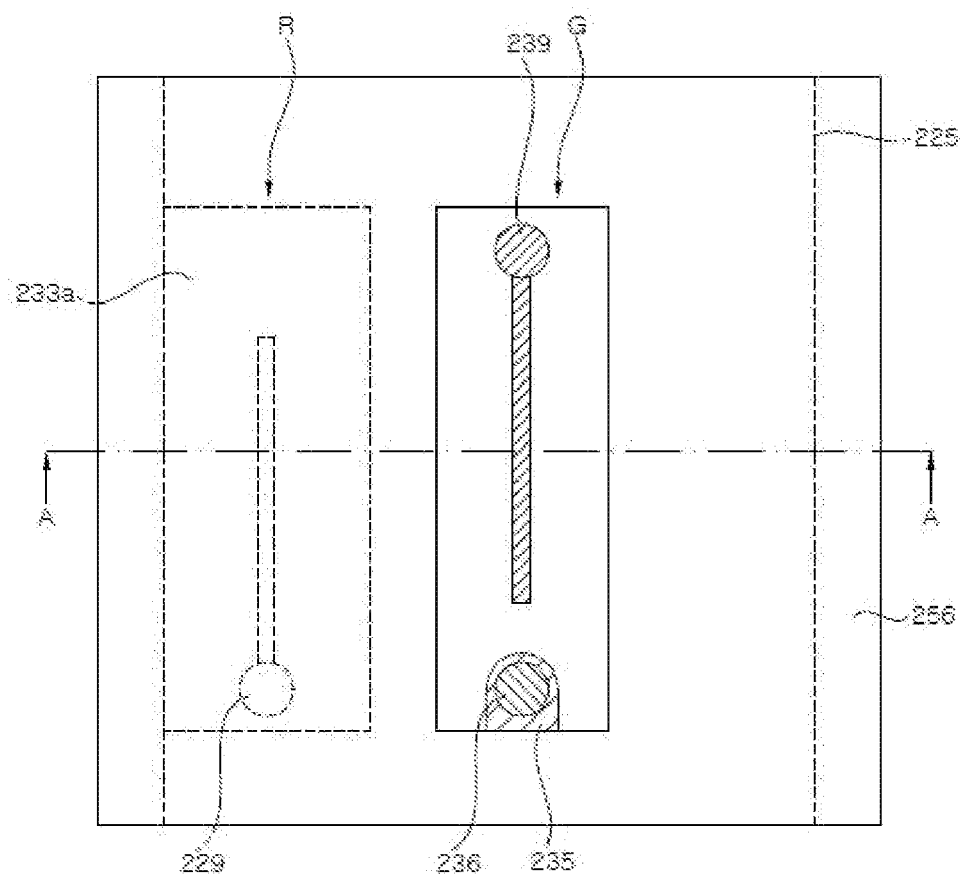
Figure 31B:
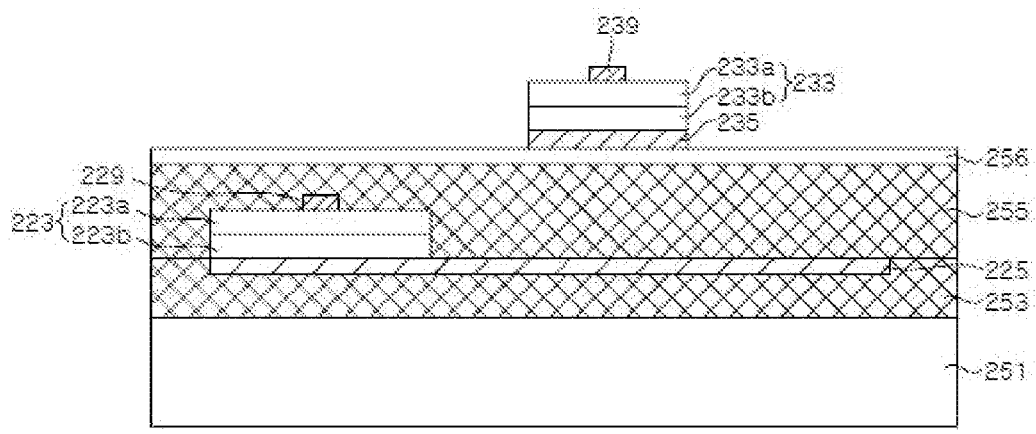

Referring to FIG. 31A and FIG. 31B, the second LED stack 233 is removed from a region excluding the region corresponding to the second subpixel G in each pixel by patterning the second LED stack 233. The second LED stack 233 in the region for the second subpixel G is separated from the first LED stack 223 in the horizontal direction so as not to overlap the first LED stack 223.

More particularly, as the second LED stack 233 is subjected to patterning, the second-2 ohmic electrode 235 is exposed. Then, an electrode pad 236 may be formed on the second-2 ohmic electrode 235 in the region for the second subpixel G. The electrode pad 236 may be restrictively disposed in the region for the second subpixel G. In an exemplary embodiment, the second LED stack 233 may be additionally removed from the region for the second subpixel G.

As the exposed second-2 ohmic electrode 235 is removed, the hydrophilic material layer 256 or the second bonding layer 255 can be exposed.

Figure 32A:
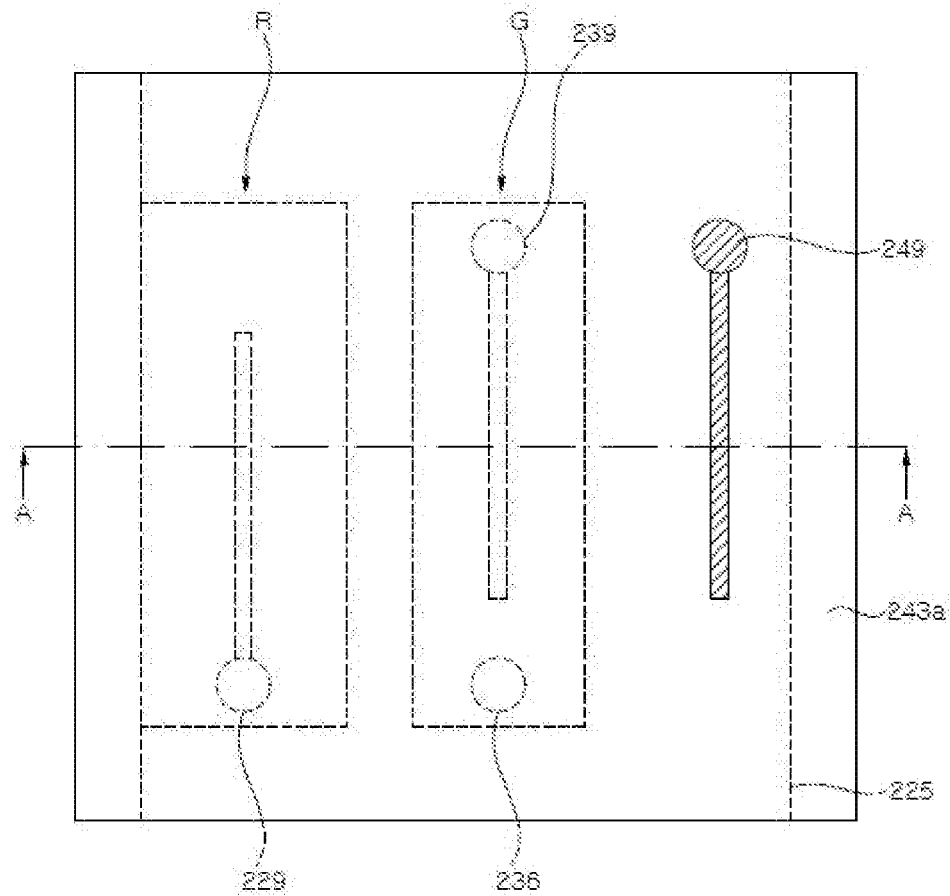
Figure 32B:
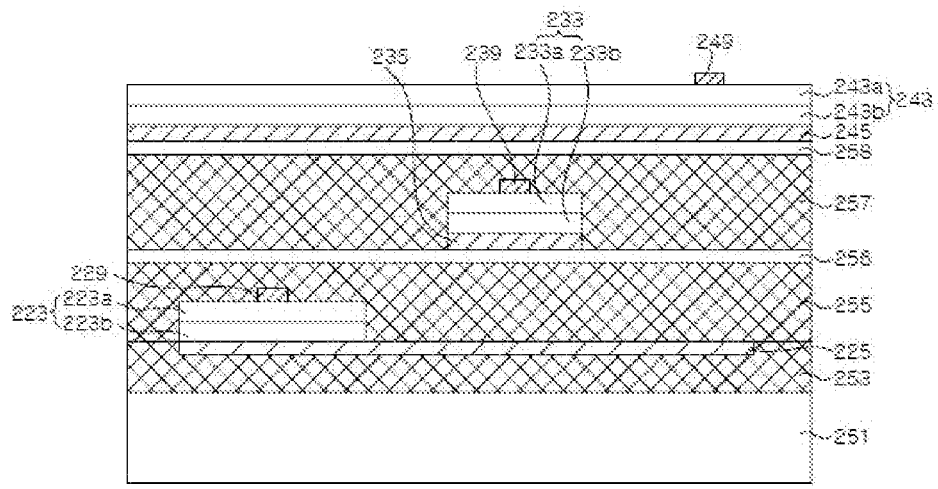

Referring to FIG. 32A and FIG. 32B, the third LED stack 243 of FIG. 27C is coupled to an upper side of the second LED stack 233 via a third bonding layer 257. The third-2 ohmic electrode 245 is disposed to face the support substrate 251 and is bonded to the third bonding layer 257. The hydrophilic material layer 258 may be formed on the third-2 ohmic electrode 245 prior to other layers. In some exemplary embodiments, an additional hydrophilic material layer may be formed on the second LED stack 233.

The third substrate 241 may be removed from the third LED stack 243 by laser lift-off or chemical lift-off. As such, an upper surface of the first conductivity type semiconductor layer 243a of the third LED stack 243 is exposed. In some exemplary embodiments, a roughened surface may be formed on the exposed surface of the first conductivity type semiconductor layer 243a by surface texturing or the like.

Next, a third-1 ohmic electrode 249 is formed on the first conductivity type semiconductor layer 243a. The third-1 ohmic electrode 249 is formed in the region corresponding to the third subpixel B. The third-1 ohmic electrode 249 forms ohmic contact with the first conductivity type semiconductor layer 243a. As shown in FIG. 32A, the third-1 ohmic electrode 249 may include a pad region and an extended portion, and the extended portion may extend substantially in the longitudinal direction of the reflective electrode 225.

Figure 33A:
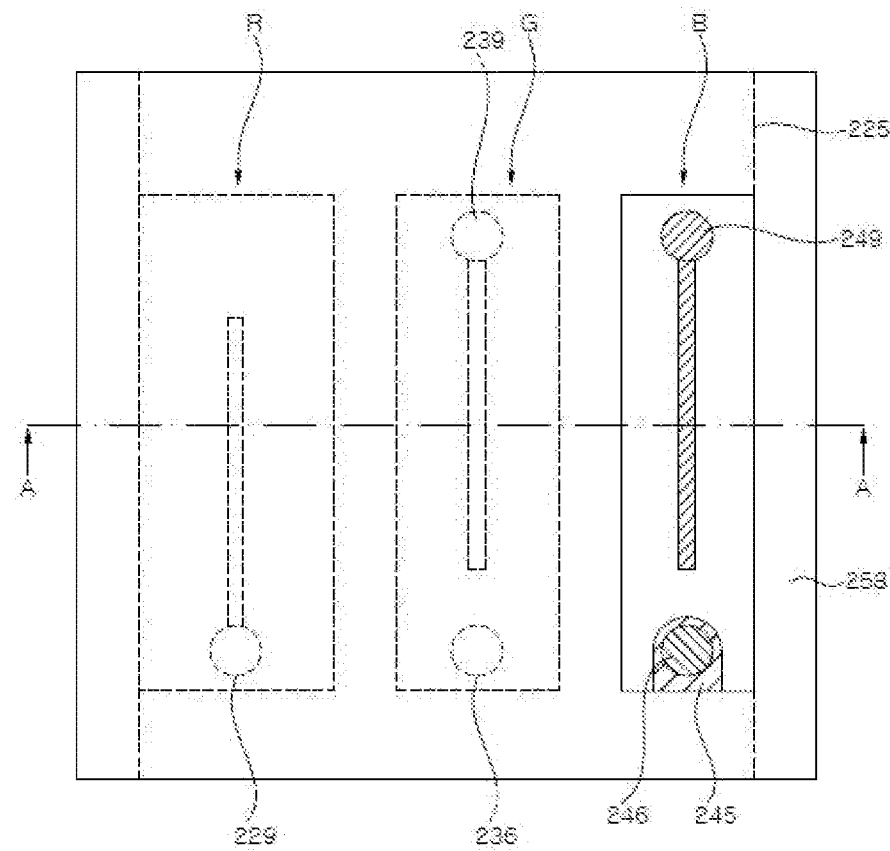
Figure 33B:
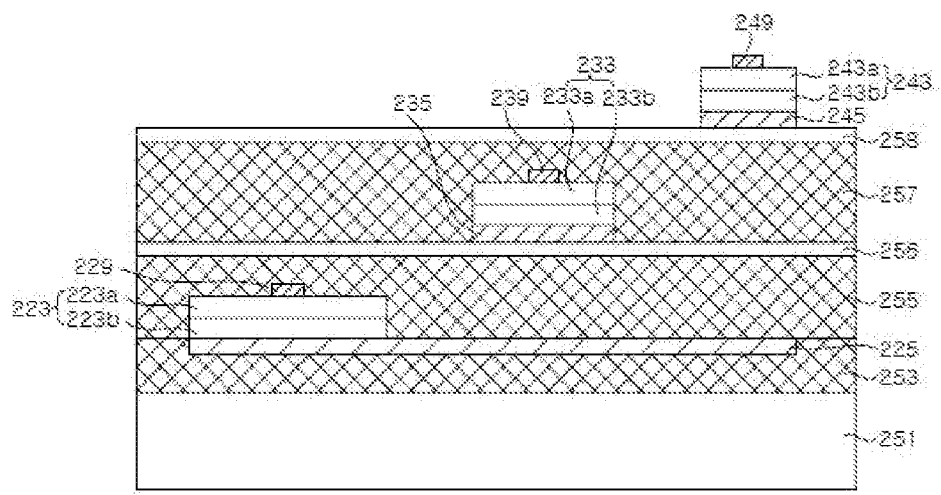

Referring to FIG. 33A and FIG. 33B, the third LED stack 243 is removed from a region excluding the region corresponding to the third subpixel B in each pixel by patterning the third LED stack 243. The third LED stack 243 is separated from the first LED stack 223 and the second LED stack 233 in the horizontal direction.

More particularly, as the third LED stack 243 is subjected to patterning, the third-2 ohmic electrode 245 is exposed. Then, an electrode pad 246 is formed on the third-2 ohmic electrode 245 in the region for the third subpixel B. The electrode pad 246 may be restrictively disposed in the region for the third subpixel B. In an exemplary embodiment, the third LED stack 243 is additionally removed from the region for the third subpixel B.

The exposed third-2 ohmic electrode 245 is removed to expose the hydrophilic material layer 258 or the third bonding layer 257.

Figure 34A:
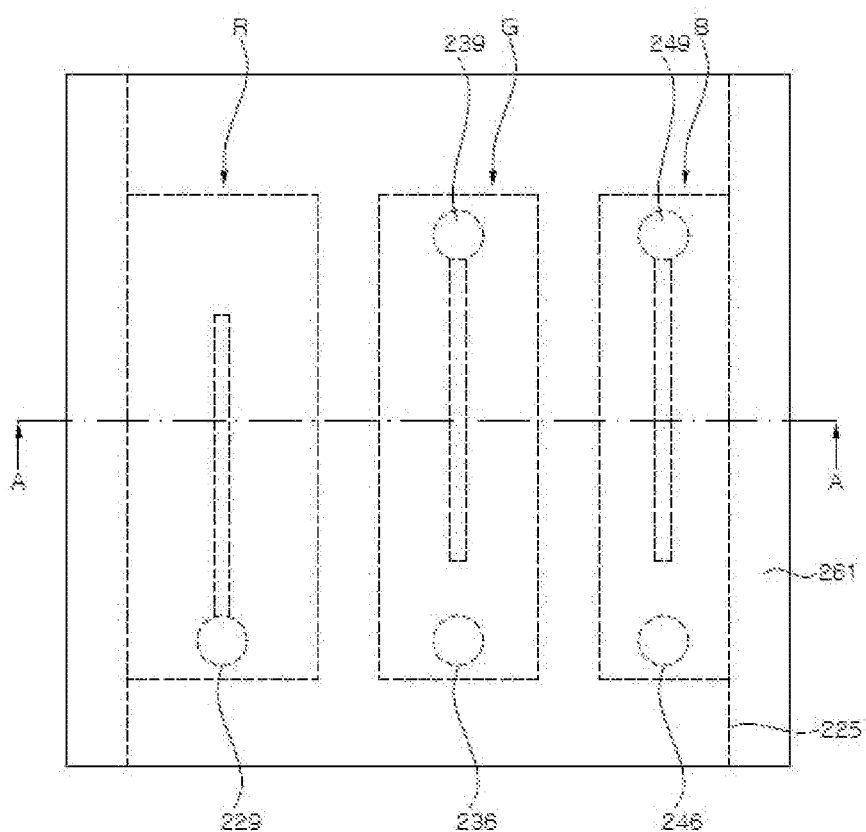
Figure 34B:
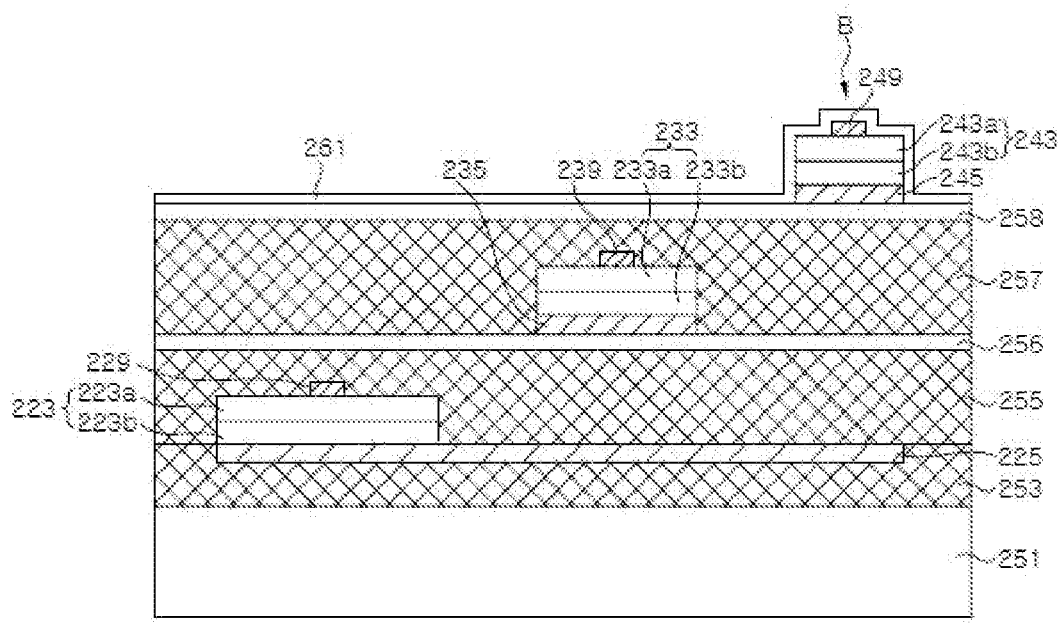

Then, referring to FIG. 34A and FIG. 34B, a first protective layer 261 is formed. The first protective layer 261 covers the third LED stack 243 and the hydrophilic material layer 258. The first protective layer 261 may cover substantially the entire upper portion of the support substrate 251.

Figure 35A:
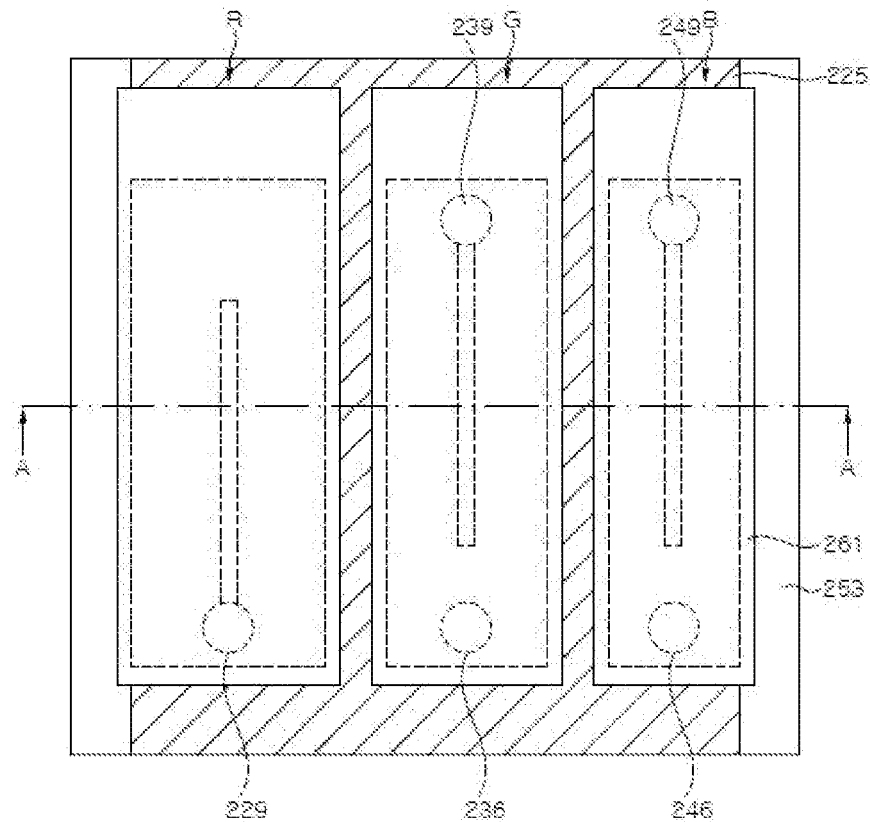
Figure 35B:
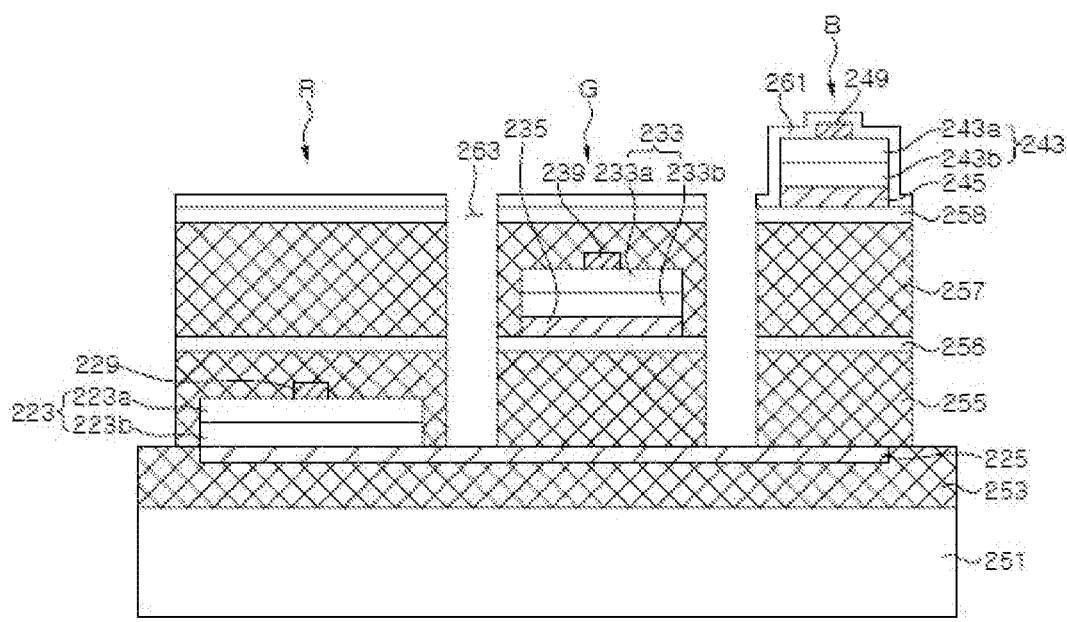

Then, referring to FIG. 35A and FIG. 35B, the hydrophilic material layer 258 around the subpixels R, G, B is exposed by patterning the first protective layer 261, and the reflective electrode 225 is then exposed by sequentially removing the hydrophilic material layer 258, the third bonding layer 257, the hydrophilic material layer 256, and the second bonding layer 255. The surface of the first bonding layer 253 may be exposed by sequentially removing the above layers in a region between pixels. As such, a trench is formed around the subpixels R, G, B to surround the subpixels.

Figure 36A:
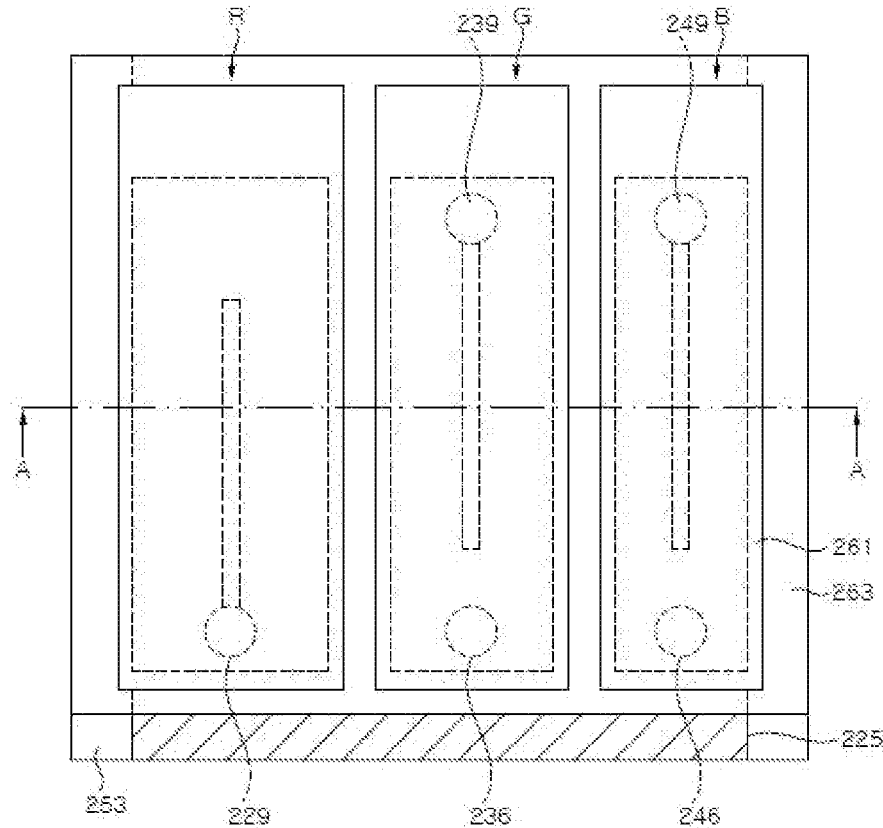
Figure 36B:
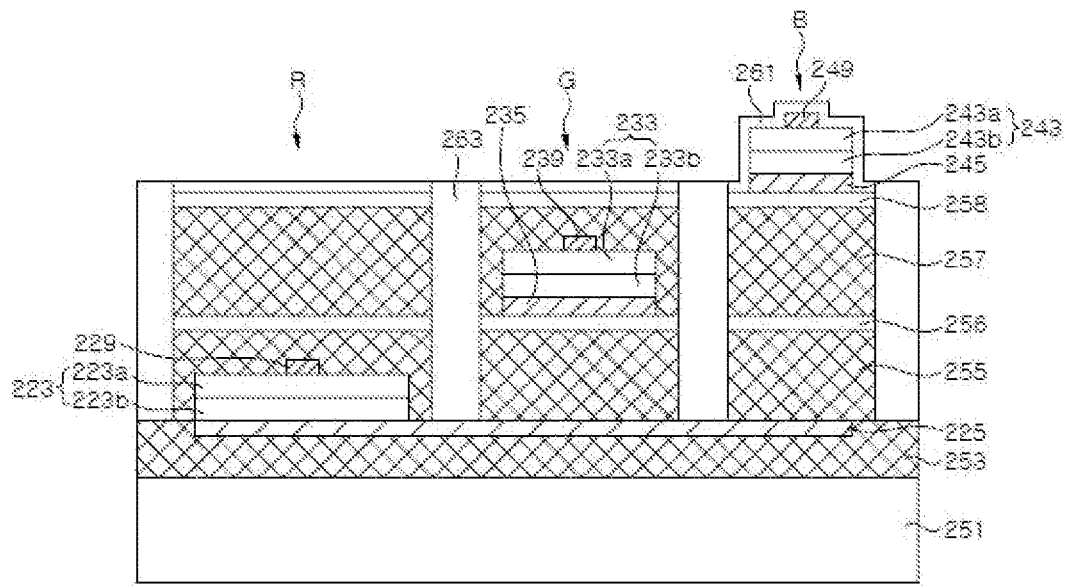

Referring to FIG. 36A and FIG. 36B, a light blocking material layer may be formed in the trench surrounding the subpixels R, G, B. The light blocking material is disposed to surround the subpixels R, G, B. The light blocking material layer 263 may be formed of, for example, a black epoxy resin or white PSR, and may prevent light interference between the subpixels and pixels by blocking light emitted through the side surface of each of the subpixels R, G, B.

Figure 37A:
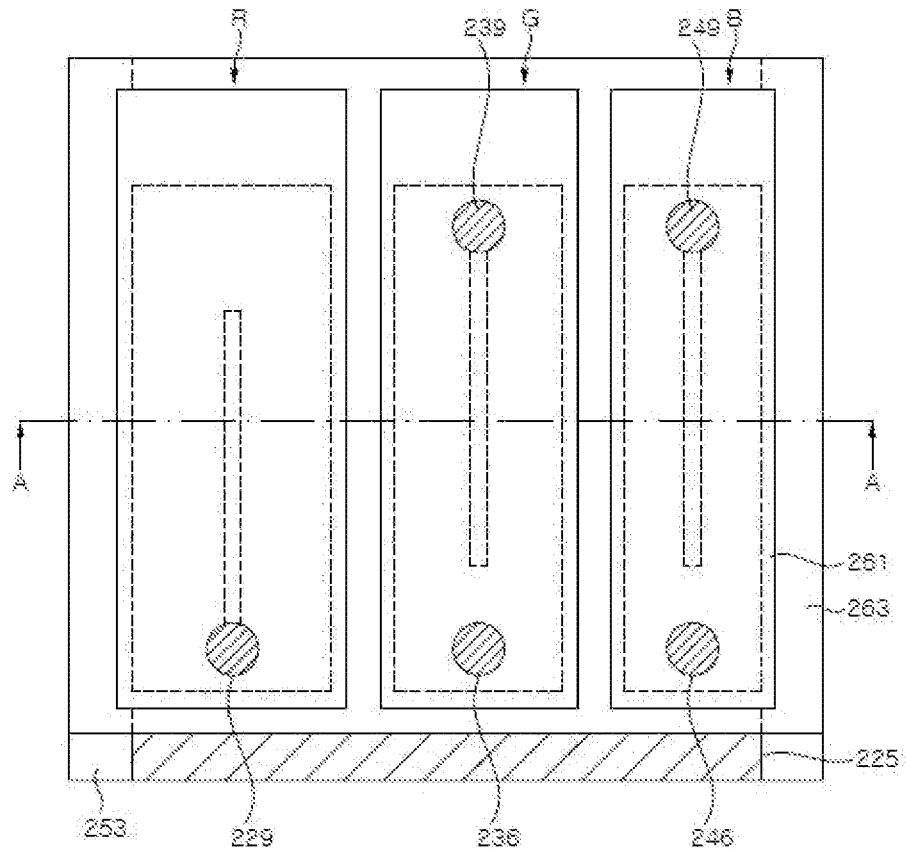
Figure 37B:
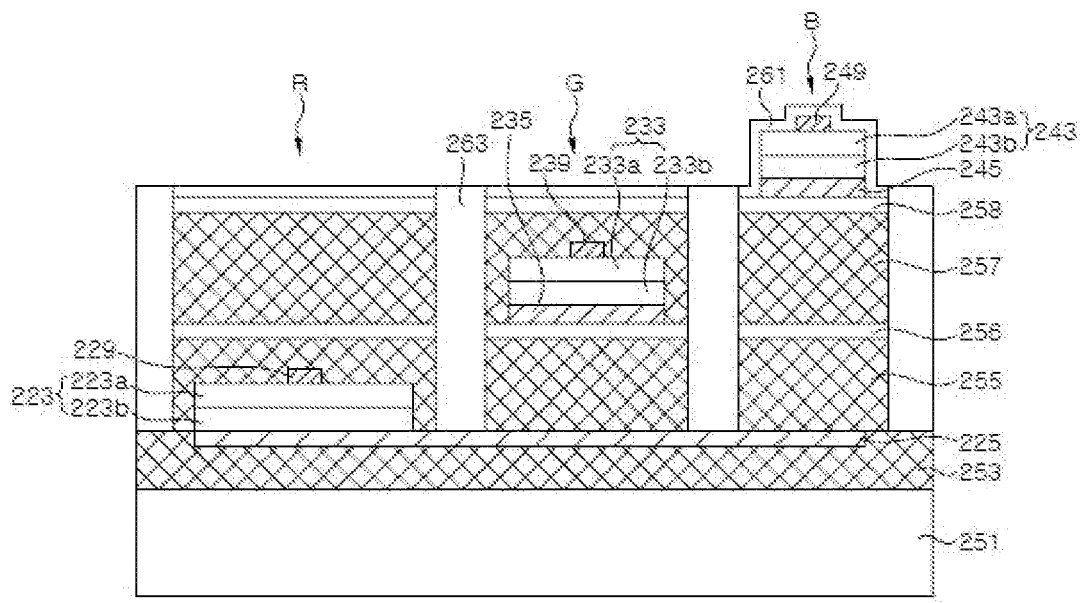

Then, referring to FIGS. 37A and 37B, the first protective layer 261, the hydrophilic material layer 258, the third bonding layer 257, the hydrophilic material layer 256, and the second bonding layer 255 are sequentially subjected to patterning to expose the pad regions of the first-1 ohmic electrode 229, the second-1 ohmic electrode 239 and the third-1 ohmic electrode 249, and the electrode pads 236, 246.

Figure 38:
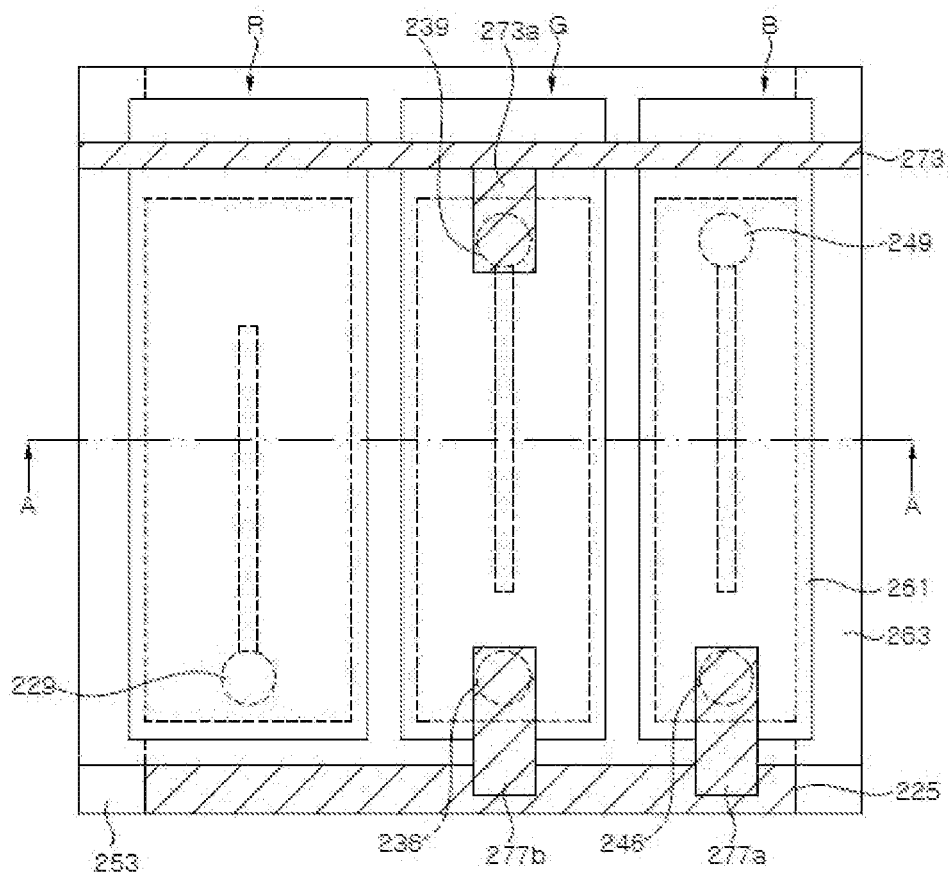

Referring to FIG. 38, an interconnection line 273 and connecting portions 273a, 277a, 277b are formed. The connecting portion 273a connects the second-1 ohmic electrode 239 to the interconnection line 273, the connecting portion 277a connects the electrode pad 246 to the reflective electrode 225, and the connecting portion 277b connects the electrode pad 236 to the reflective electrode 225.

Figure 39A:
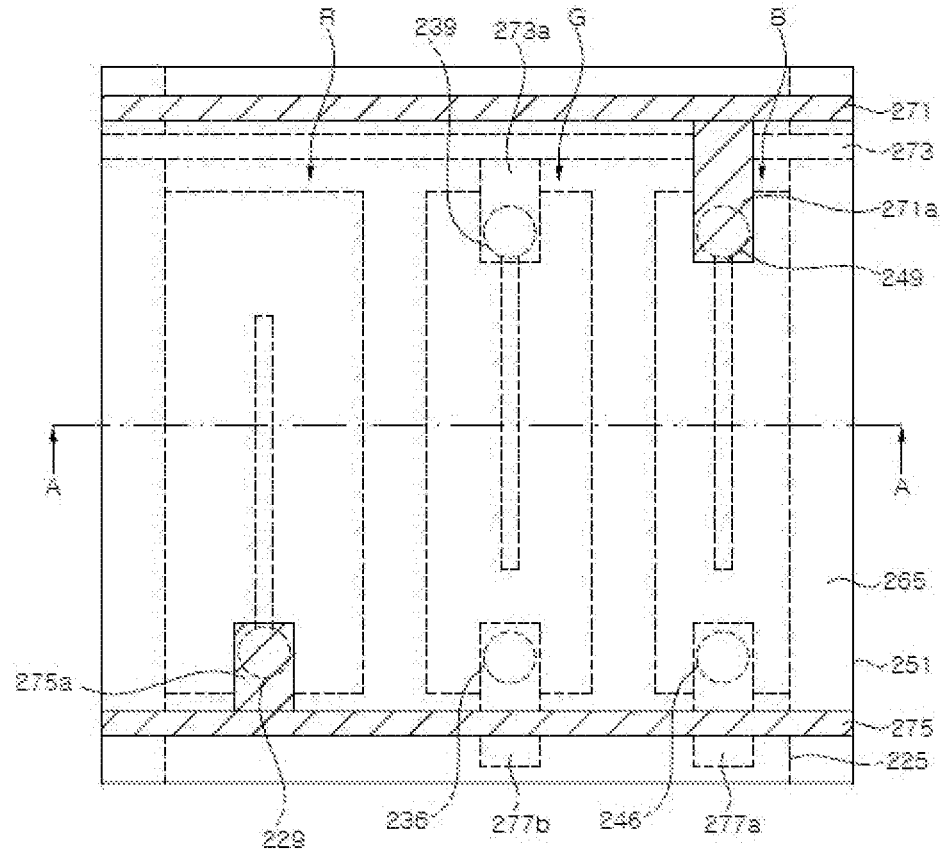
Figure 39B:
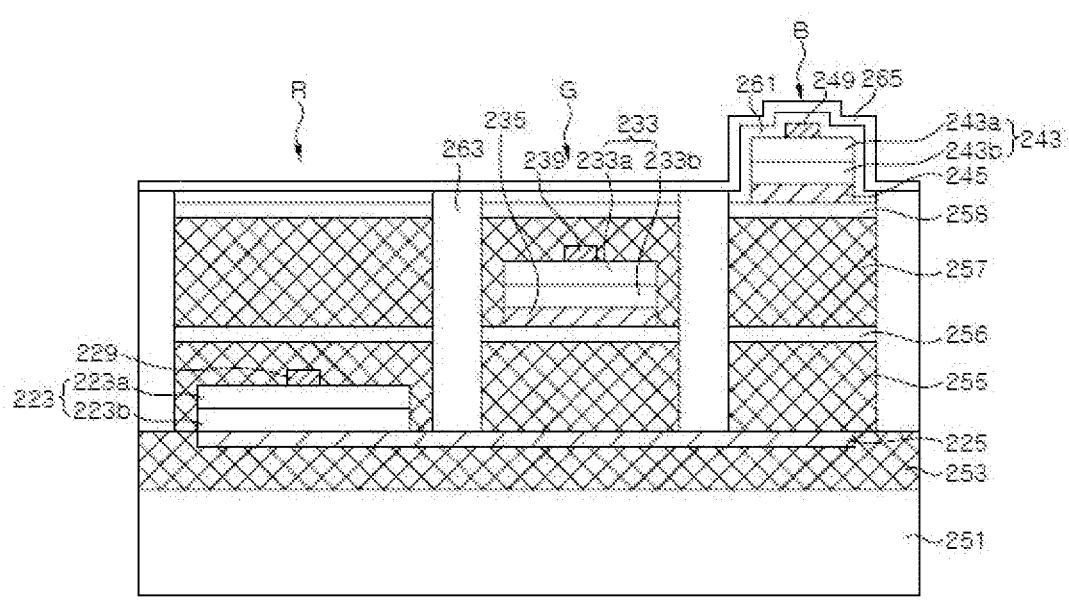

Then, referring to FIG. 39A and FIG. 39B, a second protective layer 265 is formed. The second protective layer 265 covers the interconnection line 273 and the connecting portions 273a, 277a, 277b. Here, the second protective layer 265 exposes the pad regions of the first-1 ohmic electrode 229 and the third-1 ohmic electrode 249.

Next, interconnection lines 271, 275 and connecting portions 271a, 275a are formed on the second protective layer 265. The connecting portion 271a connects the interconnection line 271 to the third-1 ohmic electrode 249 and the connecting portion 275a connects the interconnection line 275 to the first-1 ohmic electrode 229.

As such, the display apparatus 2000A described with reference to FIG. 24 and FIG. 25 is provided.

Although the pixels are described as being driven in a passive matrix manner, however, the inventive concepts are not limited thereto, and the pixels may be driven in an active matrix manner in some exemplary embodiments.

Figure 40:
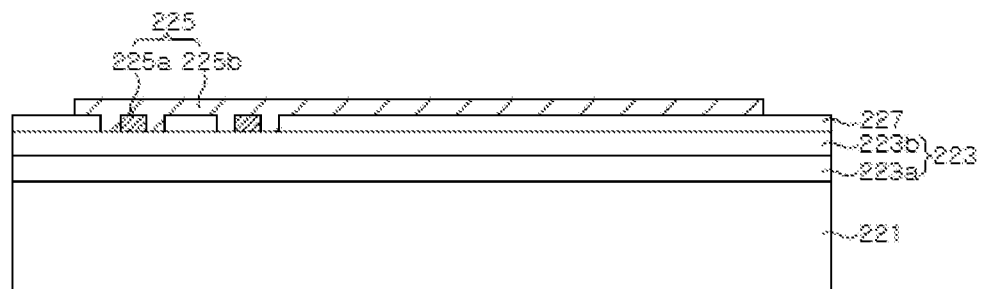
FIG. 40 is a schematic cross-sectional view of a display apparatus according to another exemplary embodiment.

FIG. 40 is a schematic cross-sectional view of a display apparatus according to another exemplary embodiment. Although the reflective electrode 225 is directly formed on the second conductivity type semiconductor layer 223b in FIG. 27A, the inventive concepts are not limited thereto.

In particular, referring to FIG. 40, the reflective electrode 225 may include an ohmic contact layer 225a and a reflection layer 225b. The ohmic contact layer 225a may be formed of, for example, Au—Zn alloys or Au—Be alloys, and the reflection layer 225b may be formed of Al, Ag or Au. In particular, when the reflection layer 225b is formed of Au, the reflection layer 225b may exhibit relatively high reflectance to light generated from the first LED stack 223, for example, red light, and may exhibit relatively low reflectance to light generated from the second LED stack 233 and the third LED stack 243, for example, green light or blue light. When the reflection layer 225b is formed of Al or Ag, the reflection layer 225b exhibits relatively high reflectance to red light, green light and blue light, thereby improving light extraction efficiency of the first to third LED stacks 223, 233, 243.

An insulation layer 227 may be disposed between the reflection layer 225b and the second conductivity type semiconductor layer 223b. The insulation layer 227 may have openings that expose the second conductivity type semiconductor layer 223b, and the ohmic contact layer 225a may be formed in the openings of the insulation layer 227.

Since the reflection layer 225b covers the insulation layer 227, an omnidirectional reflector can be formed by a stacked structure of the first LED stack 223 having a relatively high refractive index, the insulation layer 227 having a relatively low refractive index, and the reflection layer 225b.

In an exemplary embodiment, the reflective electrode 225 may be formed by the following process. First, the first LED stack 223 is grown on a substrate 221 and the insulation layer 227 is formed on the first LED stack 223. Then, opening(s) are formed by patterning the insulation layer 227. For example, $SiO_2$ is formed on the first LED stack 223 and a photoresist is deposited thereon, followed by forming a photoresist pattern through photolithography and development. Thereafter, the SiO$_2$ layer is subjected to patterning through the photoresist pattern as an etching mask, thereby forming the insulation layer 227 having the opening(s) formed therein.

Thereafter, the ohmic contact layer 225a is formed in the opening(s) of the insulation layer 227. The ohmic contact layer 225a may be formed by a lift-off process or the like. After formation of the ohmic contact layer 225a, the reflection layer 225b is formed to cover the ohmic contact layer 225a and the insulation layer 227. The reflection layer 225b may be formed by a lift-off process or the like. The reflection layer 225b may partially or completely cover the ohmic contact layer 225a, as shown in the drawings. The reflective electrode 225 is formed by the ohmic contact layer 225a and the reflection layer 225b. The shape of the reflective electrode 225 may be substantially the same as that of the reflective electrode described above, and thus, detailed descriptions thereof will be omitted.

Although the first LED stack 223 is described as being formed of AlGaInP-based semiconductor layers to emit red light, however, the inventive concepts are not limited thereto. For example, the first LED stack 223 may be adapted to emit green light or blue light. In this case, the first LED stack 223 may be formed of AlGaInN-based semiconductor layers. In addition, the second LED stack 233 or the third LED stack 243 may be formed of AlGaInP-based semiconductor layers.

Figure 41:
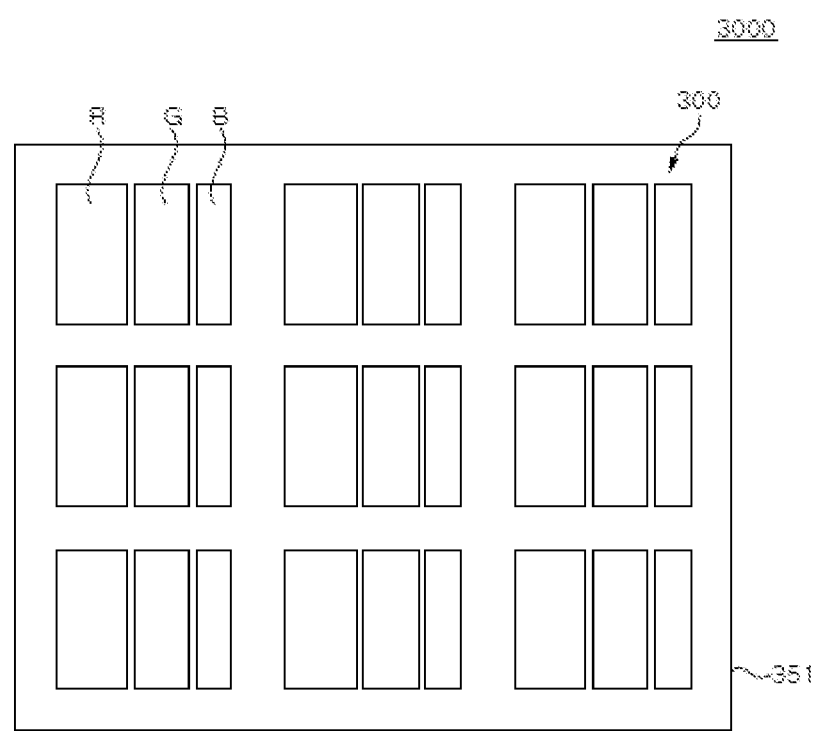
FIG. 41 is a schematic plan view of a display apparatus according to an exemplary embodiment.
Figure 42:
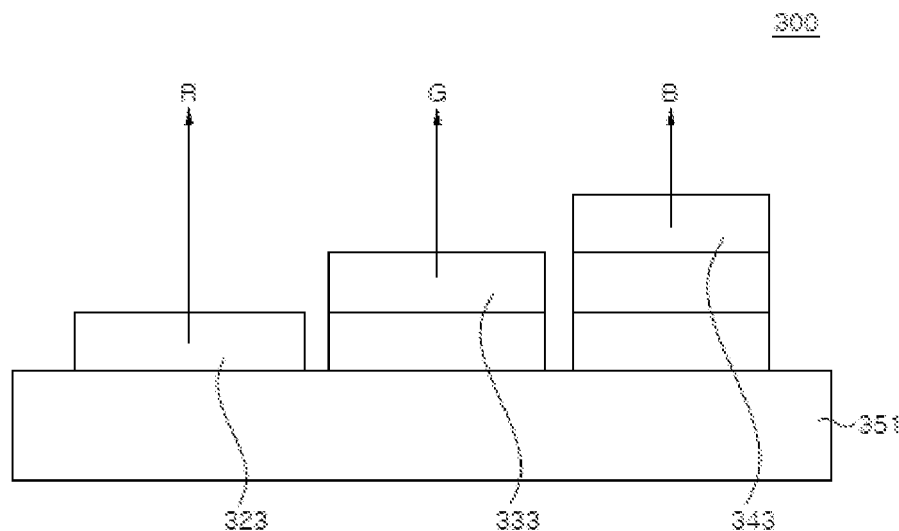
FIG. 42 is a schematic cross-sectional view of a light emitting diode pixel for a display according to an exemplary embodiment.

FIG. 41 is a schematic plan view of a display apparatus according to another exemplary embodiment, and FIG. 42 is a schematic cross-sectional view of a light emitting diode pixel for a display according to an exemplary embodiment.

Referring to FIG. 41, the display apparatus 3000 includes a support substrate 251 and a plurality of pixels 300 arranged on the support substrate 251. Each of the pixels 300 includes first to third subpixels R, G, B.

Referring to FIG. 42, the support substrate 251 supports LED stacks 323, 333, 343. The support substrate 251 may include a circuit on a surface thereof or therein, without being limited thereto. The support substrate 251 may include, for example, a Si substrate or a Ge substrate.

The first subpixel R includes a first LED stack 323, the second subpixel G includes a first LED stack 323 and a second LED stack 333, and the third subpixel B includes a first LED stack 323, a second LED stack 333 and a third LED stack 343. The first subpixel R is adapted to emit light through the first LED stack 323, the second subpixel G is adapted to emit light through the second LED stack 333, and the third subpixel B is adapted to emit light through the third LED stack 343. The first LED stack 323 of the second subpixel G and the first and second LED stacks 323, 333 of the third subpixel B may not emit light, and thus, may be electrically floated. Further, the first to third subpixels R, G, B may be independently driven.

As shown in the drawings, the first subpixel R does not include the second LED stack 333 and the third LED stack 343, and the second subpixel G does not include the third LED stack 343. As such, light generated from the first LED stack 323 may be emitted outside without passing through the second and third LED stacks 33, 43. In addition, light generated from the second LED stack 333 may be emitted outside without passing through the third LED stack 343.

In the second subpixel G, the first LED stack 323 overlaps the second LED stack 333 in the vertical direction, and in the third subpixel B, the first to third LED stacks 323, 333, 343 overlap each other in the vertical direction. However, the inventive concepts are not limited thereto, and the arrangement sequence of the subpixels may be variously modified.

Further, the first LED stacks 323 of the first to third subpixels R, G, B may have substantially the same stack structure of semiconductor layers and may be disposed on substantially the same plane. In addition, the second LED stacks 333 of the second and third subpixels G, B may have substantially the same stack structure of semiconductor layers and may be disposed on substantially the same plane. As such, the first subpixel R, the second subpixel G, and the third subpixel B have different numbers of LED stacks 323, 333, 343 therein, and thus, have different heights from each other.

Further, a region for the first LED stack 323 of the first subpixel R, a region for the second LED stack 333 of the second subpixel G, and a region for the third LED stack of the third subpixel B may have different areas from each other, and the luminous intensity of light emitted from each of the subpixels R, G, B may be adjusted through adjustment of the areas thereof.

Each of the first LED stack 323, the second LED stack 333, and the third LED stack 343 includes an n-type semiconductor layer, a p-type semiconductor layer, and an active layer interposed therebetween. The active layer may have a multi-quantum well structure. The first to third LED stacks 323, 333, 343 may include different active layers to emit light having different wavelengths from each other. For example, the first LED stack 323 may be an inorganic light emitting diode emitting red light, the second LED stack 333 may be an inorganic light emitting diode emitting green light, and the third LED stack 343 may be an inorganic light emitting diode emitting blue light. In particular, the first LED stack 323 may include an AlGaInP-based well layer, and the second LED stack 333 may include an AlGaInP or AlGaInN-based well layer. The third LED stack 343 may include an AlGaInN-based well layer. However, the inventive concepts are not limited thereto and the wavelengths of light emitted from the first LED stack 323, the second LED stack 333 and the third LED stack 343 may be changed. For example, the first LED stack 323, the second LED stack 333, and the third LED stack 343 may emit green light, blue light, and red light, or may emit blue light, green light and red light, respectively. As another example, when a light emitting diode pixel includes micro LEDs, the first LED stack 323 may emit any one of red, green, or blue color light, and the second and the third LED stacks 333 and 343 may emit the remaining one of the red, green, and blue color light, respectively, without adversely affecting operation due to the small form factor of the micro LEDs.

Figure 43:
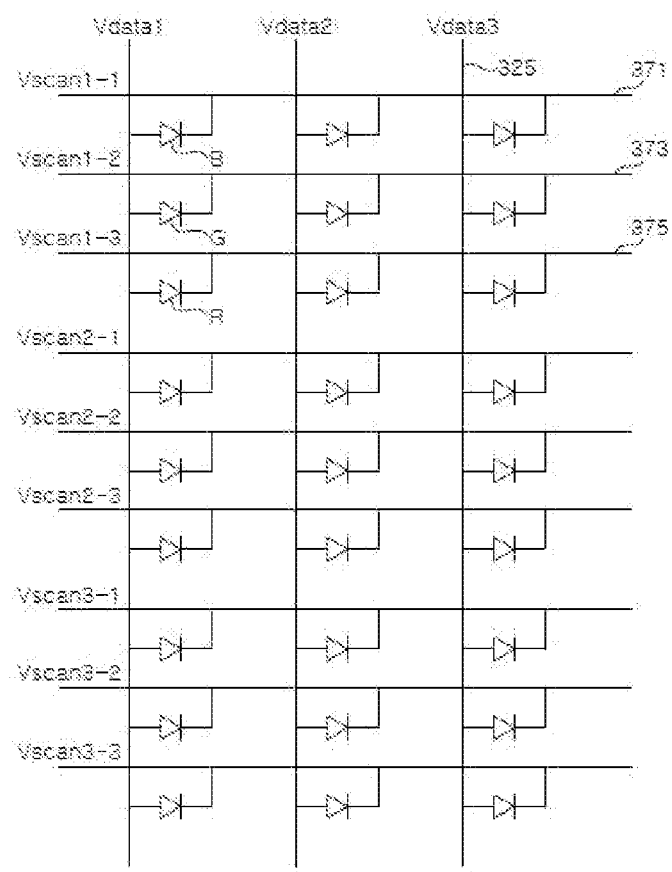
FIG. 43 is a schematic circuit diagram of a display apparatus according to an exemplary embodiment.

FIG. 43 is a schematic circuit diagram of a display apparatus according to an exemplary embodiment.

Referring to FIG. 43, the display apparatus according to an exemplary embodiment may be implemented to operate in a passive matrix manner. As described with reference to FIG. 41 and FIG. 42, one pixel includes first to third subpixels R, G, B. The first LED stack 323 of the first subpixel R emits light having a first wavelength, the second LED stack 333 of the second subpixel G emits light having a second wavelength, and the third LED stack 343 of the third subpixel B emits light having a third wavelength. Anodes of the first to third subpixels R, G, B may be connected to a common line, for example, a data line Vdata 325, and cathodes thereof may be connected to different lines, for example, scan lines Vscan 371, 373, 375.

For example, in the first pixel, the anodes of the first to third subpixels R, G, B are commonly connected to the data line Vdata1 and the cathodes thereof are connected to the scan lines Vscan1-1, Vscan1-2, Vscan1-3, respectively. Accordingly, the subpixels R, G, B in the same pixel can be individually driven.

In addition, each of the first to third subpixels R, G, B may be driven by pulse width modulation or by changing the magnitude of electric current, thereby controlling the brightness of each subpixel. Alternatively, the brightness may be adjusted by adjusting the area of the region for the first LED stack 323 of the first subpixel R, the area of the region for the second LED stack 333 of the second subpixel G, and the area of the region for the third LED stack 343 of the third subpixel B. For example, an LED stack emitting light having low visibility, for example, the first LED stack 323 of the first subpixel R, may be formed to have a larger area than the second LED stack 333 or the third LED stack 343 of the second subpixel G and the third subpixel B, and thus, can emit light having higher luminous intensity under the same current density. In addition, the second LED stack 333 and the third LED stack 343 of the second subpixel G and the third subpixel B may be formed to have different areas. In this manner, the luminous intensity of light emitted from each of the first to third subpixels R, G, B may be adjusted depending upon visibility thereof by adjusting the areas of the first to third LED stacks 323, 333, 343.

Figure 44:
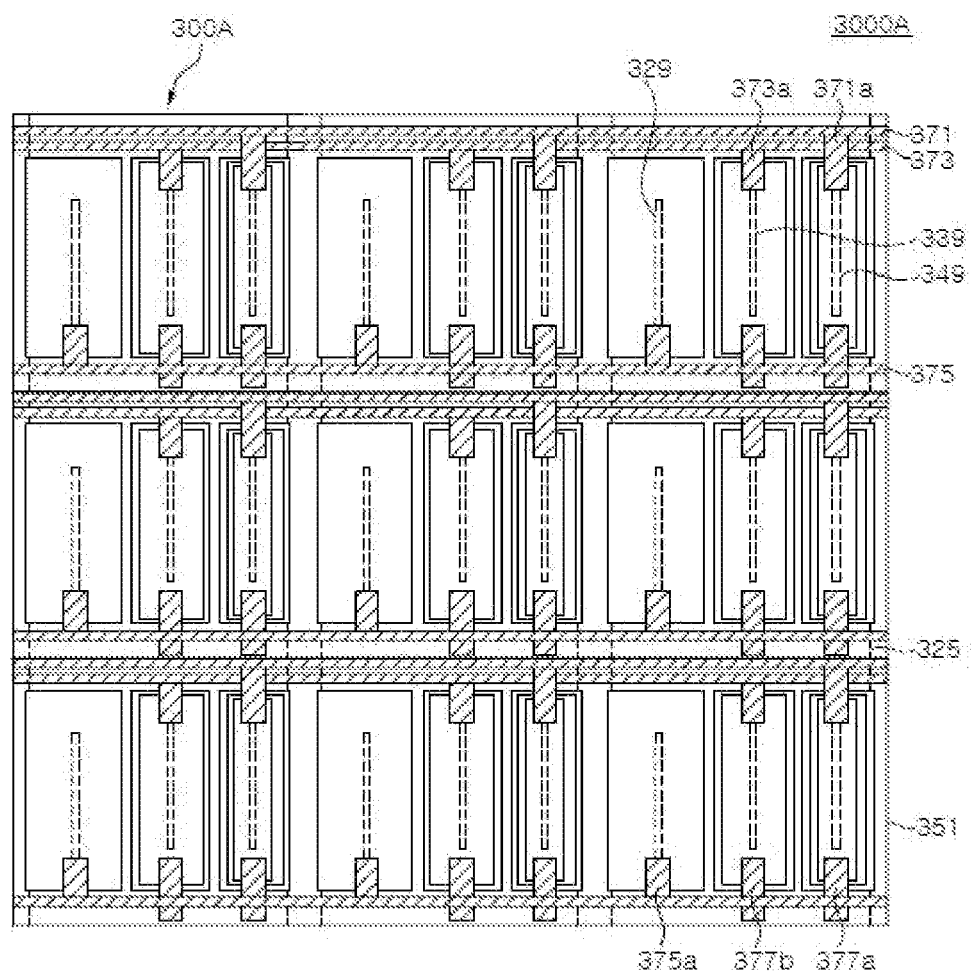
FIG. 44 is a schematic plan view of a display apparatus according to an exemplary embodiment.
Figure 45:
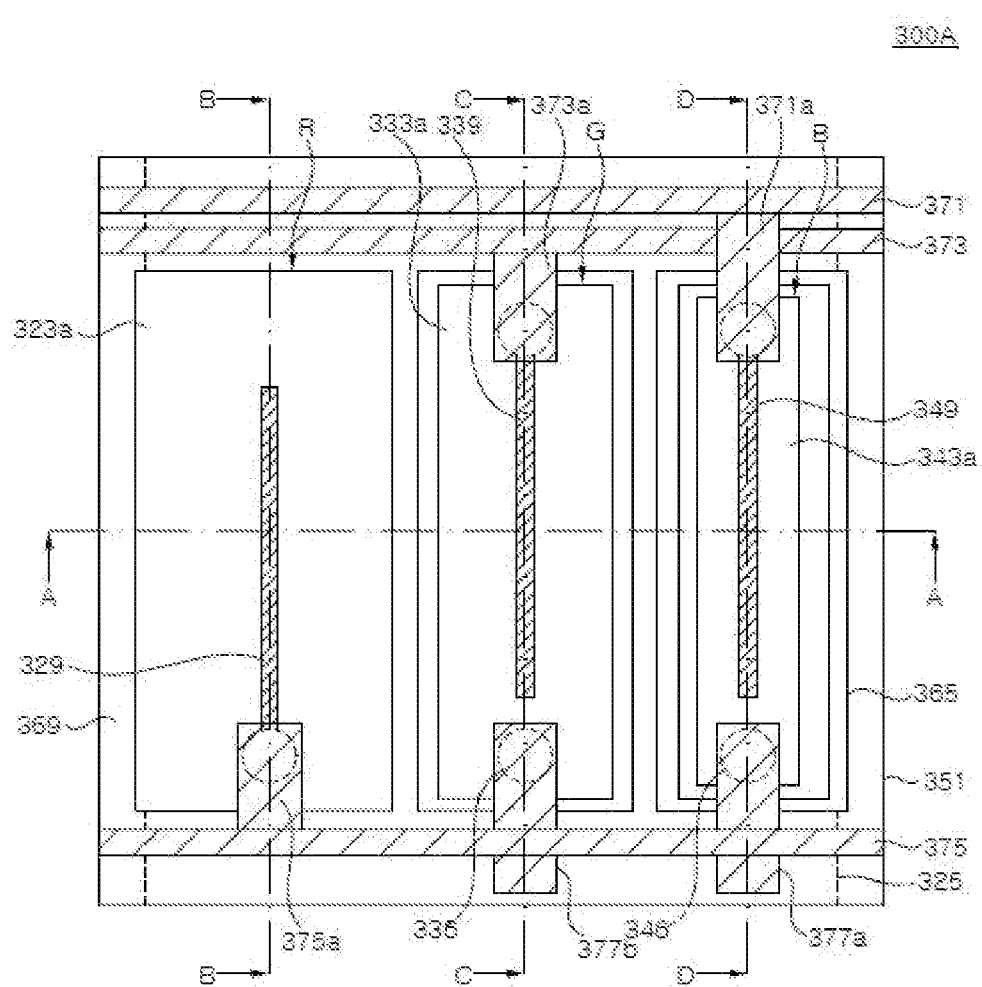
FIG. 45 is an enlarged plan view of one pixel of the display apparatus of FIG. 44.

FIG. 44 is a schematic plan view of a display apparatus according to an exemplary embodiment. FIG. 45 is an enlarged plan view of one pixel of the display apparatus of FIG. 44. FIG. 46A, FIG. 46B, FIG. 46C, and FIG. 46D are schematic cross-sectional views taken along lines A-A, B-B, C-C, and D-D of FIG. 45, respectively.

Referring to FIG. 44, FIG. 45, FIG. 46A, FIG. 46B, FIG. 46C, and FIG. 46D, the display apparatus 3000A includes a support substrate 251, a plurality of pixels 300A, first to third subpixels R, G, B, a first LED stack 323, a second LED stack 333, third LED stacks 343, a reflective electrode 325 (or a first-2 ohmic electrode), a first-1 ohmic electrode 329, a second-1 ohmic electrode 339, a second-2 ohmic electrode 335, a third-1 ohmic electrode 349, a third-2 ohmic electrode 345, electrode pads 336, 346, a first bonding layer 353, a second bonding layer 337, a third bonding layer 347, a first insulation layer 361, a first reflection layer 363, a second insulation layer 365, a second reflection layer 367, a lower insulation layer 368, an upper insulation layer 369, interconnection lines 371, 373, 375, and connecting portions 371a, 373a, 375a, 377a, 377b.

Each of the subpixels R, G, B is connected to the reflective electrode 325 and the interconnection lines 371, 373, 375. As shown in FIG. 43, the reflective electrode 325 may correspond to a data line Vdata and the interconnection lines 371, 373, 375 may correspond to scan lines Vscan.

As shown in FIG. 44, the pixels may be arranged in a matrix form, in which anodes of the subpixels R, G, B in each pixel are commonly connected to the reflective electrode 325, and cathodes thereof are connected to the interconnection lines 371, 373, 375 separated from each other. The connecting portions 371a, 373a, 375a may connect the interconnection lines 371, 373, 375 to the subpixels R, G, B.

The support substrate 251 supports the LED stacks 323, 333, 343. The support substrate 251 may include a circuit on a surface thereof or therein, without being limited thereto. The support substrate 251 may include, for example, a glass substrate, a sapphire substrate, a Si substrate, or a Ge substrate.

The first LED stack 323 includes a first conductivity type semiconductor layer 323a and a second conductivity type semiconductor layer 323b. The second LED stack 333 includes a first conductivity type semiconductor layer 333a and a second conductivity type semiconductor layer 333b. The third LED stack 343 includes a first conductivity type semiconductor layer 343a and a second conductivity type semiconductor layer 343b. In addition, active layers may be interposed between the first conductivity type semiconductor layers 323a, 333a, 343a and the second conductivity type semiconductor layers 323b, 333b, 343b, respectively.

In an exemplary embodiment, each of the first conductivity type semiconductor layers 323a, 333a, 343a may be an n-type semiconductor layer and each of the second conductivity type semiconductor layers 323b, 333b, 343b may be a p-type semiconductor layer. In some exemplary embodiments, a roughened surface may be formed on a surface of each of the first conductivity type semiconductor layers 323a, 333a, 343a by surface texturing. However, the inventive concepts are not limited thereto and the semiconductor types in each of the LED stacks may be changed.

The first LED stack 323 is disposed near the support substrate 251. The second LED stack 333 is disposed above the first LED stack 323. The third LED stack 343 is disposed above the second LED stack 333. In addition, in each pixel, the second LED stack 333 is disposed on the first LED stacks 323 of the second subpixel G and the third subpixel B. Further, in each pixel, the third LED stack 343 is disposed on the second LED stack 333 of the third subpixel B.

Accordingly, light generated from the first LED stack 323 of the first subpixel R may be emitted outside without passing through the second and third LED stacks 333, 343. In addition, light generated from the second LED stack 333 of the second subpixel G may be emitted outside without passing through the third LED stack 343. Further, light generated from the third LED stack 343 of the third subpixel B may also be emitted outside without passing through the first and second LED stacks 323, 333.

Materials forming the first LED stack 323, the second LED stack 333, and the third LED stack 343 are substantially the same as those described with reference to FIG. 42, and thus, detailed descriptions thereof will be omitted to avoid redundancy.

The reflective electrode 325 forms ohmic contact with a lower surface of the first LED stack 323, e.g., the second conductivity type semiconductor layer 323b thereof. The reflective electrode 325 includes a reflection layer that may reflect light emitted from the first LED stack 323. As shown in the drawings, the reflective electrode 325 may cover almost the entire lower surface of the first LED stack. Furthermore, the reflective electrode 325 may be commonly connected to the plurality of pixels 300a and may correspond to the data line Vdata.

The reflective electrode 325 may be formed of, for example, a material layer forming ohmic contact with the second conductivity type semiconductor layer 323b of the first LED stack 323, and may include a reflection layer that may reflect light generated from the first LED stack 323, for example, red light.

The reflective electrode 325 may include an ohmic reflection layer and may be formed of, for example, an Au—Zn alloy or an Au—Be alloy. These alloys have high reflectance with respect to light in the red range, and form ohmic contact with the second conductivity type semiconductor layer 323b.

Figure 46A:
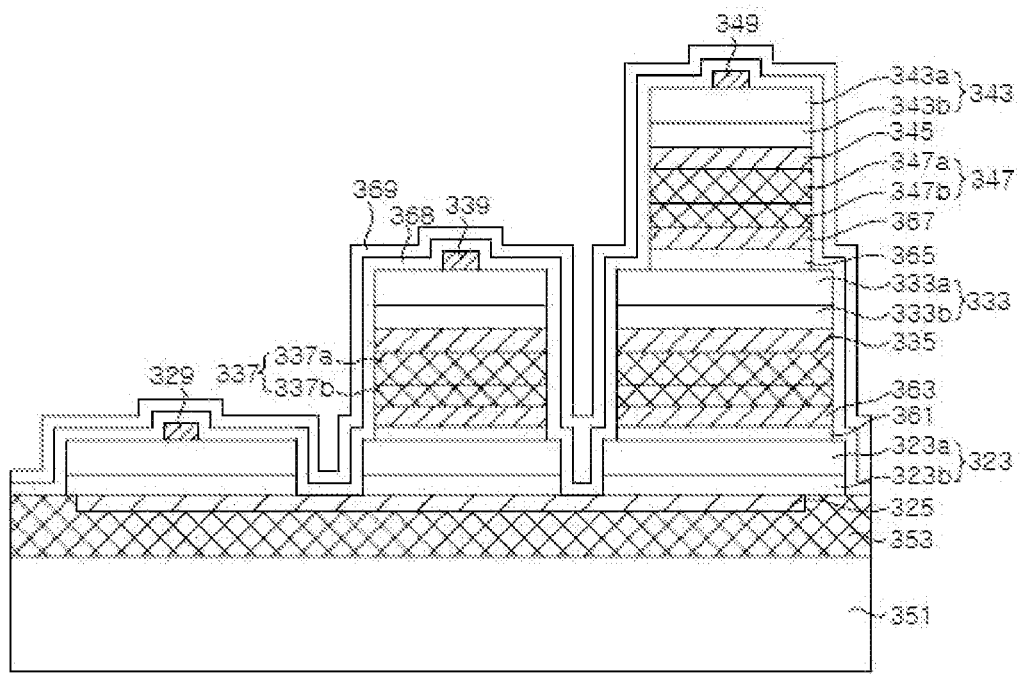
FIG. 46A is a schematic cross-sectional view taken along line A-A of FIG. 45.
Figure 46B:
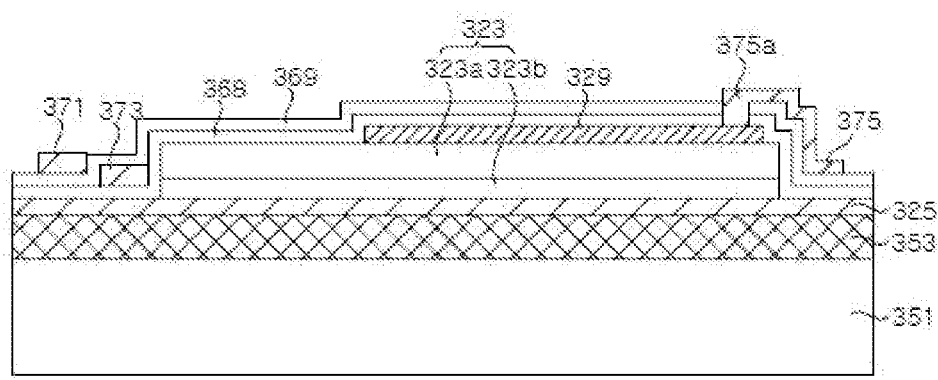
FIG. 46B is a schematic cross-sectional view taken along line B-B of FIG. 45.

The first-1 ohmic electrode 329 forms ohmic contact with the first conductivity type semiconductor layer 323a of the first subpixel R. The first-1 ohmic electrode 329 may include a pad region and an extended portion (see FIG. 48A), and the connecting portion 375a may be connected to the pad region of the first-1 ohmic electrode 329, as shown in FIG. 46B.

The first-1 ohmic electrode 329 is omitted on the first LED stacks 323 of the second subpixel G and the third subpixel B.

Figure 46C:
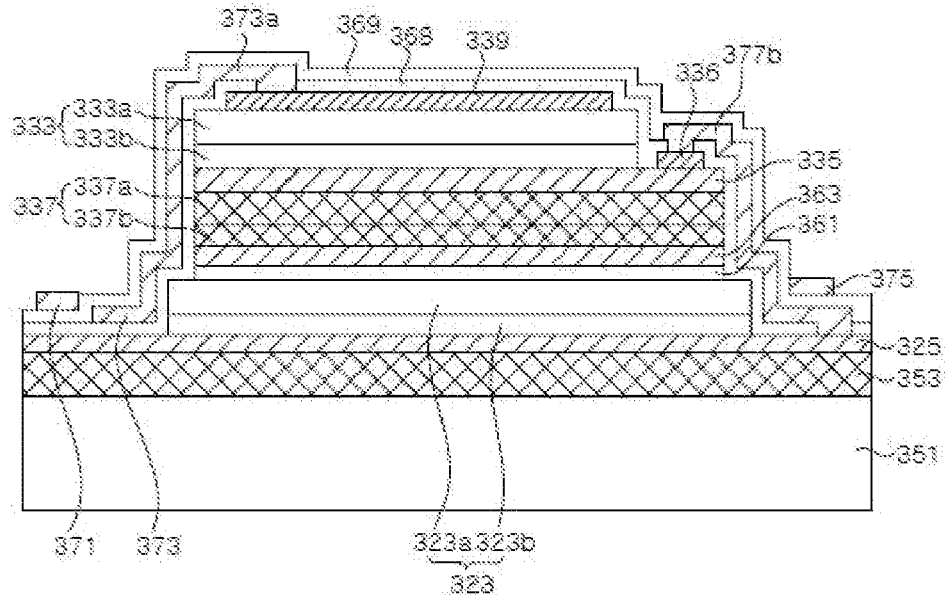
FIG. 46C is a schematic cross-sectional view taken along line C-C of FIG. 45.

The second-1 ohmic electrode 339 forms ohmic contact with the first conductivity type semiconductor layer 333a of the second LED stack 333 of the second subpixel G. The second-1 ohmic electrode 339 may also include a pad region and an extended portion (see FIG. 52A), and the connecting portion 373a may be connected to the pad region of the second-1 ohmic electrode 339, as shown in FIG. 46C. The second-1 ohmic electrode 339 may be spaced apart from the region, on which the third LED stack 343 is disposed.

The second-2 ohmic electrode 335 forms ohmic contact with the second conductivity type semiconductor layer 333b of the second LED stack 333 of the second subpixel G. The second-2 ohmic electrode 335 may also be disposed under the second conductivity type semiconductor layer 333b of the second LED stack 333 of the third subpixel B. The second-2 ohmic electrode 335 may include a reflection layer that may reflect light generated from the second LED stack 333. For example, the second-2 ohmic electrode 335 may include a metal reflection layer.

The electrode pad 336 may be formed on the second-2 ohmic electrode 335. The electrode pad 336 is restrictively disposed on the second-2 ohmic electrode 335, and the connecting portion 377b may be connected to the electrode pad 336.

Figure 46D:
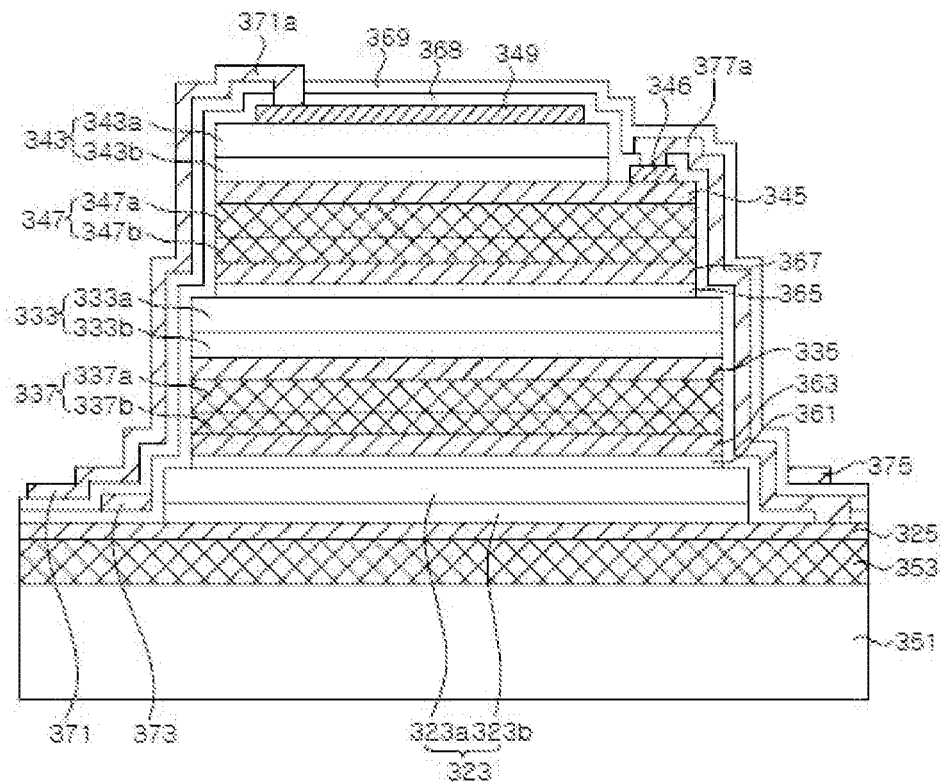
FIG. 46D is a schematic cross-sectional view taken along line D-D of FIG. 45.

The third-1 ohmic electrode 349 forms ohmic contact with the first conductivity type semiconductor layer 343a of the third LED stack 343. The third-1 ohmic electrode 349 may also include a pad region and an extended portion (see FIG. 50A), and the connecting portion 371a may be connected to the pad region of the third-1 ohmic electrode 349, as shown in FIG. 46D.

The third-2 ohmic electrode 345 forms ohmic contact with the second conductivity type semiconductor layer 343b of the third LED stack 343. The third-2 ohmic electrode 345 may include a reflection layer that may reflect light generated from the third LED stack 343. For example, the third-2 ohmic electrode 345 may include a metal layer.

The electrode pad 346 may be formed on the third-2 ohmic electrode 345. The electrode pad 346 is restrictively disposed on the third-2 ohmic electrode 345. The connecting portion 377a may be connected to the electrode pad 346.

The reflective electrode 325, the second-2 ohmic electrode 335, and the third-2 ohmic electrode 345 may assist in current spreading through ohmic contact with the p-type semiconductor layer of each of the LED stacks 323, 333, 343. The first-1 ohmic electrode 329, the second-1 ohmic electrode 339, and the third-1 ohmic electrode 349 may assist in current spreading through ohmic contact with the n-type semiconductor layer of each of the LED stacks 323, 333, 343.

The first bonding layer 353 couples the first LED stack 323 to the support substrate 251. As shown in the drawings, the reflective electrode 325 may adjoin the first bonding layer 353. The first bonding layer 353 may be a light transmissive or opaque layer. The first bonding layer 353 may be formed of organic or inorganic materials. Examples of the organic materials may include SU8, poly(methyl methacrylate) (PMMA), polyimide, Parylene, benzocyclobutene (BCB), or others, and examples of the inorganic materials may include $Al_2O_3$, $SiO_2$, $SiN_x$, or others. The organic material layers may be bonded under high vacuum and high pressure conditions, and the inorganic material layers may be bonded under high vacuum after changing the surface energy using plasma through, for example, chemical mechanical polishing, to flatten the surfaces of the inorganic material layers. In particular, a bonding layer formed of a black epoxy resin capable of absorbing light may be used as the first bonding layer 353, which may improve contrast of a display apparatus. The first bonding layer 353 may also be formed of spin-on-glass.

In the second subpixel G and the third subpixel B, the first reflection layer 363 may be interposed between the first LED stack 323 and the second LED stack 333. The first reflection layer 363 may block light, which is generated from the first LED stack 323 of the first subpixel R and entering the first LED stacks 323 of the second subpixel R and the third subpixel B, from entering the second LED stacks 333 of the second and third subpixels G and B, thereby preventing light interference between the subpixels.

The first reflection layer 363 may include a metal layer, such as an Au layer, an Al layer, or an Ag layer, which have high reflectance to light generated from the first LED stack 323 of the first subpixel R.

The second reflection layer 367 is interposed between the second LED stack 333 and the third LED stack 343. The second reflection layer 367 may block light, which is generated in the second LED stack 333 of the second subpixel G and entering the second LED stack 333 of the third subpixel B, from entering the third LED stack 343 of the third subpixel B, thereby preventing light interference between the subpixels. In particular, the second reflection layer 367 may include a metal layer, such as an Au layer, an Al layer, or an Ag layer, which have having high reflectance to light generated from the second LED stack 333 of the second subpixel G.

The first insulation layer 361 is interposed between the first reflection layer 363 and the first LED stack 323. The first insulation layer 361 insulates the first reflection layer 363 from the first LED stack 323. The first insulation layer 361 may include a dielectric layer, such as $SiO_2$, which has a lower refractive index than that of the first LED stack 323. Accordingly, the first LED stack 323 having a high refractive index, the first insulation layer 361 having a low refractive index, and the first reflection layer 363 are sequentially stacked one above another to form an omnidirectional reflector (ODR).

The second insulation layer 365 is interposed between the second reflection layer 367 and the second LED stack 333. The second insulation layer 365 insulates the second reflection layer 367 from the second LED stack 333. The second insulation layer 365 may include a dielectric layer, such as $SiO_2$, which has a lower refractive index than that of the second LED stack 333. Accordingly, the second LED stack 333 having a high refractive index, the second insulation layer 365 having a low refractive index, and the second reflection layer 367 are sequentially stacked one above another to form an omnidirectional reflector (ODR).

The second bonding layer 337 couples the first LED stacks 323 to the second LED stacks 333, respectively. The second bonding layer 337 may be interposed between the first reflection layer 363 and the second-2 ohmic electrode 335 to bond the first reflection layer 363 to the second-2 ohmic electrode 335. In some exemplary embodiments, the first reflection layer 363 may be omitted. In this case, the second bonding layer 337 may bond the first insulation layer 361 to the second-2 ohmic electrode 335. The second bonding layer 337 may include a metal bonding layer, such as AuSn, without being limited thereto. Alternatively, the second bonding layer 337 may include substantially the same bonding material as the first bonding layer 353.

The third bonding layer 347 couples the second LED stack 333 to the third LED stack 343. The third bonding layer 347 may be interposed between the second reflection layer 367 and the third-2 ohmic electrode 345 to bond the second reflection layer 367 to the third-2 ohmic electrode 345. In some exemplary embodiments, the second reflection layer 367 may be omitted. In this case, the second reflection layer 367 may bond the second insulation layer 365 to the third-2 ohmic electrode 345. The third bonding layer 347 may include a metal bonding layer, such as AuSn, without being limited thereto. Alternatively, the third bonding layer 347 may include substantially the same bonding material as the first bonding layer 353.

The lower insulation layer 368 may cover the first to third LED stacks 323, 333, 343. The lower insulation layer 368 may adjoin the upper surfaces of the first LED stack 323 of the first subpixel R, the second LED stack 333 of the second subpixel G, and the third LED stack 343 of the third subpixel B. In addition, the lower insulation layer 368 covers the reflective electrode 325 exposed around the first LED stacks 323. The lower insulation layer 368 may have openings to provide electrical connection passages.

The upper insulation layer 369 covers the lower insulation layer 368. The upper insulation layer 369 may have openings to provide electrical connection passages.

The lower insulation layer 368 and the upper insulation layer 369 may be formed of any insulation materials, for example, silicon oxide or silicon nitride, without being limited thereto.

As shown in FIG. 44 and FIG. 45, the interconnection lines 371, 373, 375 may be disposed to be substantially orthogonal to the reflective electrode 325. The interconnection lines 371, 375 are disposed on the upper insulation layer 369 and may be connected to the third-1 ohmic electrode 349 and the first-1 ohmic electrode 329 through the connecting portions 371a, 375a, respectively. To this end, the upper insulation layer 369 and the lower insulation layer 368 may have openings that expose the third-1 ohmic electrode 349 and the first-1 ohmic electrode 329.

The interconnection line 373 is disposed on the lower insulation layer 368 and is insulated from the reflective electrode 325. The interconnection line 373 may be disposed between the lower insulation layer 368 and the upper insulation layer 369, and may be connected to the second-1 ohmic electrode 339 through the connecting portion 373a. To this end, the lower insulation layer 368 has an opening that exposes the second-1 ohmic electrode 339.

The connecting portions 377a, 377b are disposed between the lower insulation layer 368 and the upper insulation layer 369, and electrically connect the electrode pads 46, 36 to the reflective electrode 325. To this end, the lower insulation layer 368 may have openings that expose the electrode pads 336, 346 and the reflective electrode 325.

The interconnection line 371 and the interconnection line 373 are insulated from each other by the upper insulation layer 369, and thus, may be disposed to overlap each other in the vertical direction.

Although the electrodes of each pixel are described as being connected to the data line and the scan lines, the interconnection lines 371, 375 are described as being formed on the lower insulation layer 368, and the interconnection line 373 is described as being disposed between the lower insulation layer 368 and the upper insulation layer 369, the inventive concepts are not limited thereto. For example, all of the interconnection lines 371, 373, 375 may be formed on the lower insulation layer 368 and may be covered by the upper insulation layer 81, and the connecting portions 371a, 375a may be formed on the upper insulation layer 369.

Next, a method of manufacturing the display apparatus 3000A according to an exemplary embodiment will hereinafter be described.

FIG. 47 to FIG. 59 are schematic plan view and cross-sectional views illustrating a method of manufacturing a display apparatus according to an exemplary embodiment of the present disclosure. Each cross-sectional views is taken along line A-A of the corresponding plan view.

Figure 47A:
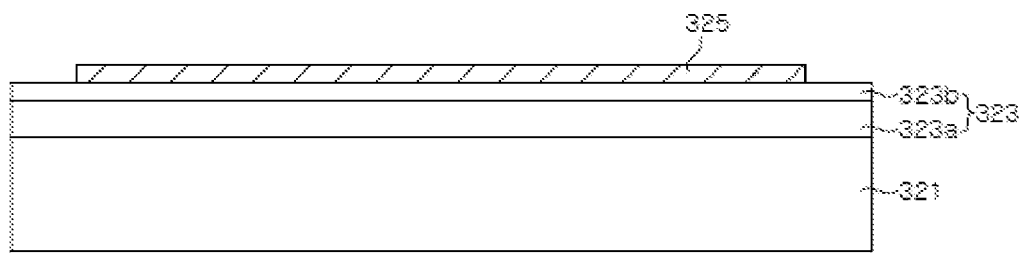
FIGS. 47A, 47B, 47C, 48A, 48B, 49A, 49B, 50A, 50B, 51A, 51B, 52A, 52B, 53A, 53B, 54A, 54B, 55A, 55B, 56A, 56B, 57, 58A, 58B, and FIG. 59 are schematic plan views and cross-sectional views illustrating a method of manufacturing a display apparatus according an exemplary embodiment.

First, referring to FIG. 47A, a first LED stack 323 is grown on a first substrate 321. The first substrate 321 may be, for example, a GaAs substrate. The first LED stack 323 may be formed of AlGaInP-based semiconductor layers, and includes a first conductivity type semiconductor layer 323a, an active layer, and a second conductivity type semiconductor layer 323b.

Then, a reflective electrode 325 is formed on the first LED stack 323. The reflective electrode 325 may be formed of, for example, an Au—Zn alloy or an Au—Be alloy.

The reflective electrode 325 may be formed by a lift-off process or the like, and may be subjected to patterning to have a particular shape. For example, the reflective electrode 325 may be subjected to patterning have a length connecting a plurality of pixels. However, the inventive concepts are not limited thereto. Alternatively, the reflective electrode 325 may be formed over the entire upper surface of the first LED stack 323 without patterning, or may be subjected to patterning after formation thereon.

The reflective electrode 325 may form ohmic contact with the second conductivity type semiconductor layer 323b of the first LED stack 323, for example, a p-type semiconductor layer.

Figure 47B:
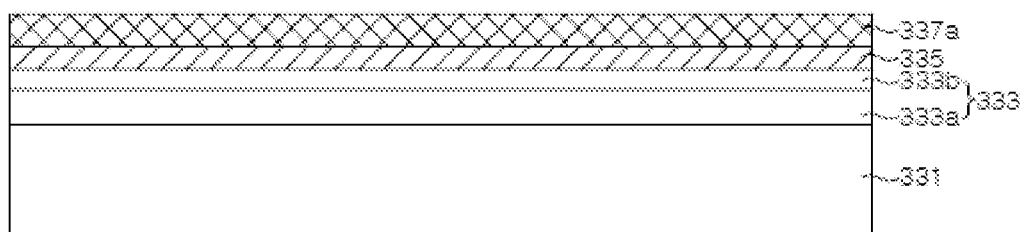

Referring to FIG. 47B, a second LED stack 333 is grown on a second substrate 331, and a second-2 ohmic electrode 335 is formed on the second LED stack 333. The second LED stack 333 may be formed of AlGaInP or AlGaInN-based semiconductor layers, and may include an AlGaInP or AlGaInN-based well layer. The second substrate 331 may be a substrate capable of growing AlGaInP-based semiconductor layers thereon, for example, a GaAs substrate, or a substrate capable of growing GaN-based semiconductor layers thereon, for example, a sapphire substrate. The composition of Al, Ga, and In in the second LED stack 333 may be determined such that the second LED stack 333 may emit green light, for example. The second-2 ohmic electrode 335 forms ohmic contact with the second conductivity type semiconductor layer 333b of the second LED stack 333, for example, a p-type semiconductor layer. The second-2 ohmic electrode 335 may include a reflection layer that may reflect light generated from the second LED stack 333.

A bonding material layer 337a may be formed on the second-2 ohmic electrode 335. The bonding material layer 337a may include a metal layer, such as AuSn, without being limited thereto.

Figure 47C:
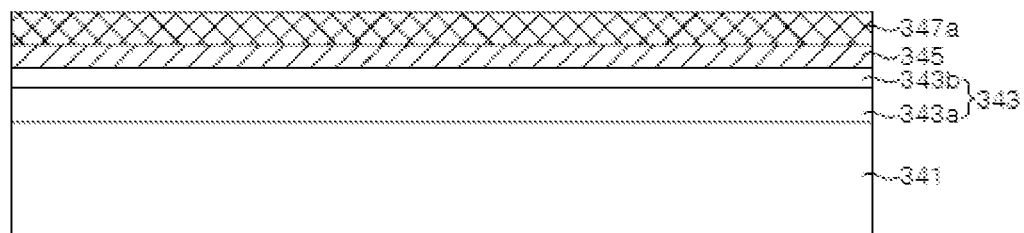

Referring to FIG. 47C, a third LED stack 343 is grown on a third substrate 341, and a third-2 ohmic electrode 345 is formed on the third LED stack 343. The third LED stack 343 may be formed of AlGaInN-based semiconductor layers, and may include a first conductivity type semiconductor layer 343a, an active layer, and a second conductivity type semiconductor layer 343b. The third substrate 341 is a substrate capable of growing GaN-based semiconductor layers thereon, and may be different from the first substrate 321. The composition of Al, Ga, and In in the third LED stack 343 may be determined such that the third LED stack 343 may emit blue light, for example. The third-2 ohmic electrode 345 forms ohmic contact with the second conductivity type semiconductor layer 343b of the third LED stack 343, for example, a p-type semiconductor layer. The third-2 ohmic electrode 345 may include a reflection layer that may reflect light generated from the third LED stack 343.

A bonding material layer 347a may be formed on the third-2 ohmic electrode 345. The bonding material layer 347a may include a metal layer, such as AuSn, without being limited thereto.

Since the first LED stack 323, the second LED stack 333, and the third LED stack 343 are grown on different substrates, respectively, the sequence of forming the first to third LED stacks is not particularly limited.

Figure 48A:
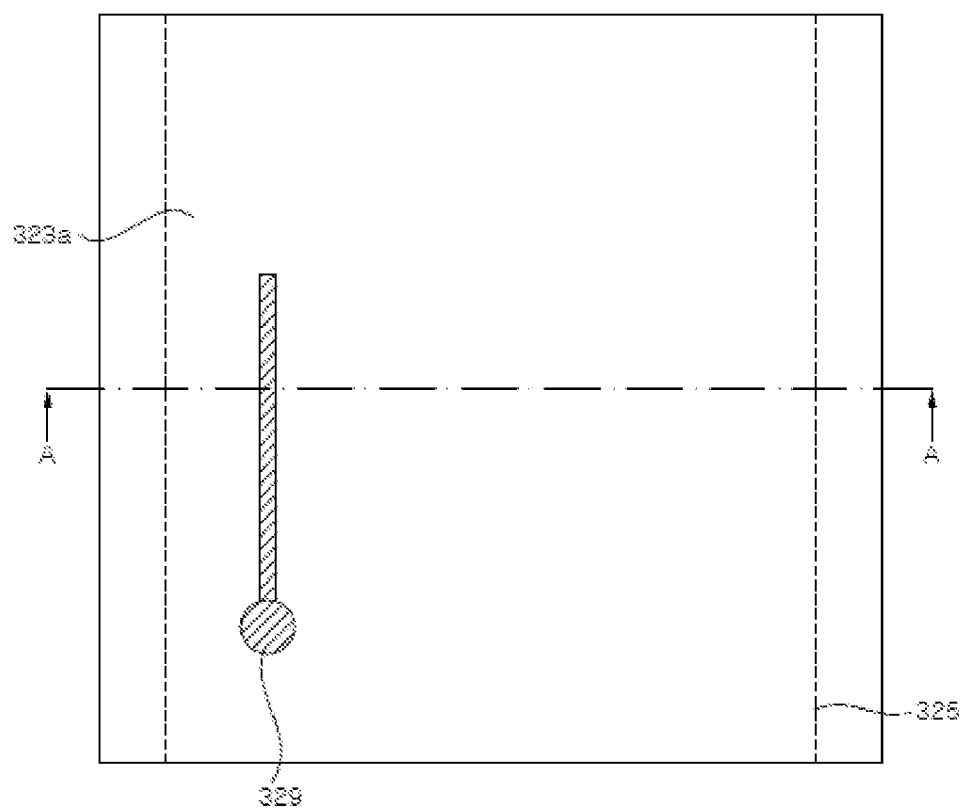
Figure 48B:
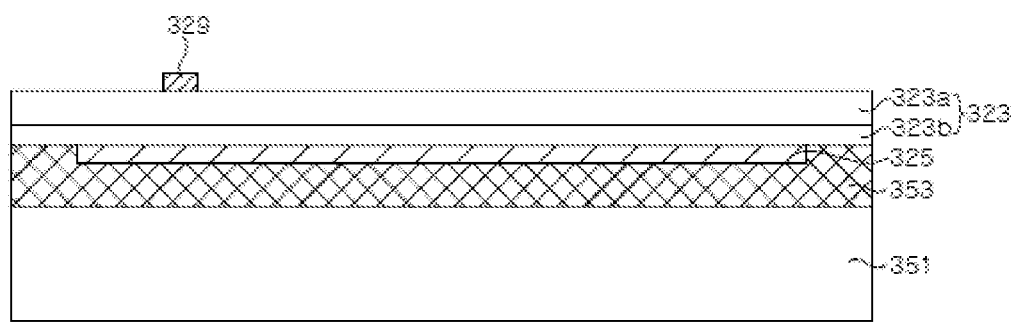

Referring to FIG. 48A and FIG. 48B, the first LED stack 323 of FIG. 47A is coupled to an upper side of a support substrate 251 via a first bonding layer 353. The reflective electrode 325 may be disposed to face the support substrate 251 and may be bonded to the first bonding layer 353. The first substrate 321 is removed from the first LED stack 323 by chemical etching or the like. As such, an upper surface of the first conductivity type semiconductor layer 323a of the first LED stack 323 is exposed. In some exemplary embodiments, a roughened surface may be formed on the exposed surface of the first conductivity type semiconductor layer 323a by surface texturing or the like.

Then, a first-1 ohmic electrode 329 is formed on the exposed surface of the first LED stack 323. The ohmic electrode 329 may be formed of, for example, an Au—Te alloy or an Au—Ge alloy. The ohmic electrode 329 may be formed in each pixel region. The ohmic electrode 329 may be formed towards one side in each pixel region. The ohmic electrode 329 may include a pad region and an extended portion, as shown in the drawings. The extended portion may extend substantially in the longitudinal direction of the reflective electrode 325, as shown in the drawings.

Figure 49A:
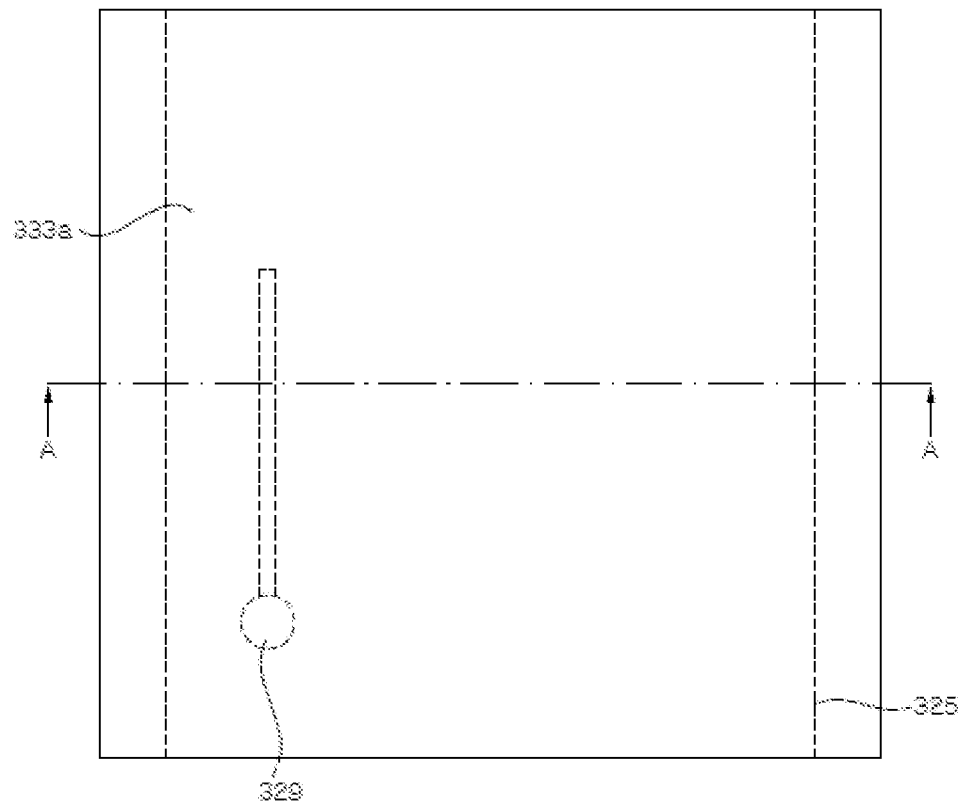
Figure 49B:
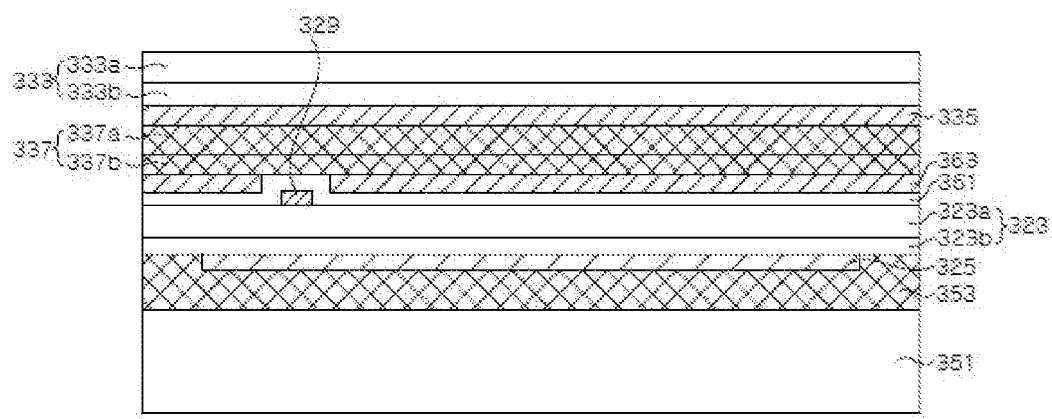

Referring to FIG. 49A and FIG. 49B, a first insulation layer 361 is formed on the first LED stack 323, and a first reflection layer 363 is then formed thereon. As shown in the drawings, the first insulation layer 361 may be formed to cover the first-1 ohmic electrode 329, and the first reflection layer 363 may not cover the first-1 ohmic electrode 329. However, the inventive concepts are not limited thereto. For example, the first reflection layer 363 may cover the first-1 ohmic electrode 329. In some exemplary embodiments, the first reflection layer 363 may be omitted.

A bonding material layer 337b is formed on the first reflection layer 363. The second LED stack 333 of FIG. 47B is coupled to an upper side of the bonding material layer 337b. When the first reflection layer 363 is omitted, the bonding material layer 337b may be formed on the first insulation layer 361. The bonding material layer 337a is disposed to face the support substrate 251 and is bonded to the bonding material layer 337a to form a second bonding layer 337, by which the first LED stack 323 is coupled to the second LED stack 333.

The second substrate 331 is removed from the second LED stack 333 by laser lift-off or chemical lift-off. As such, an upper surface of the first conductivity type semiconductor layer 333a of the second LED stack 333 is exposed. In some exemplary embodiments, a roughened surface may be formed on the exposed surface of the first conductivity type semiconductor layer 333a by surface texturing or the like.

Figure 50A:
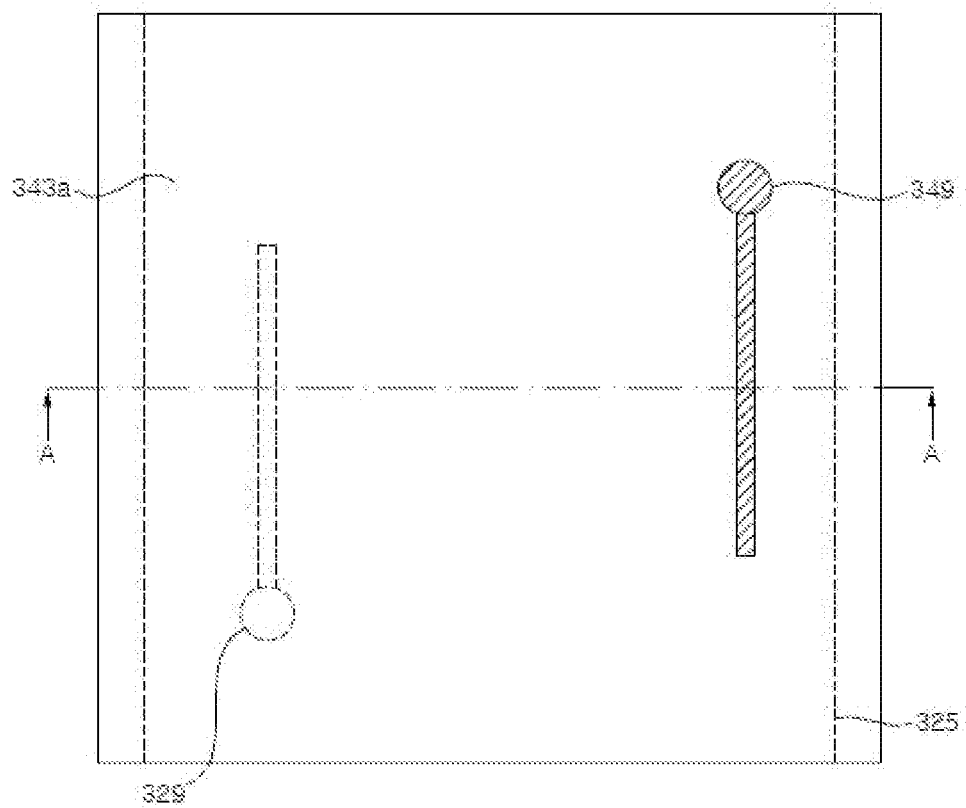
Figure 50B:
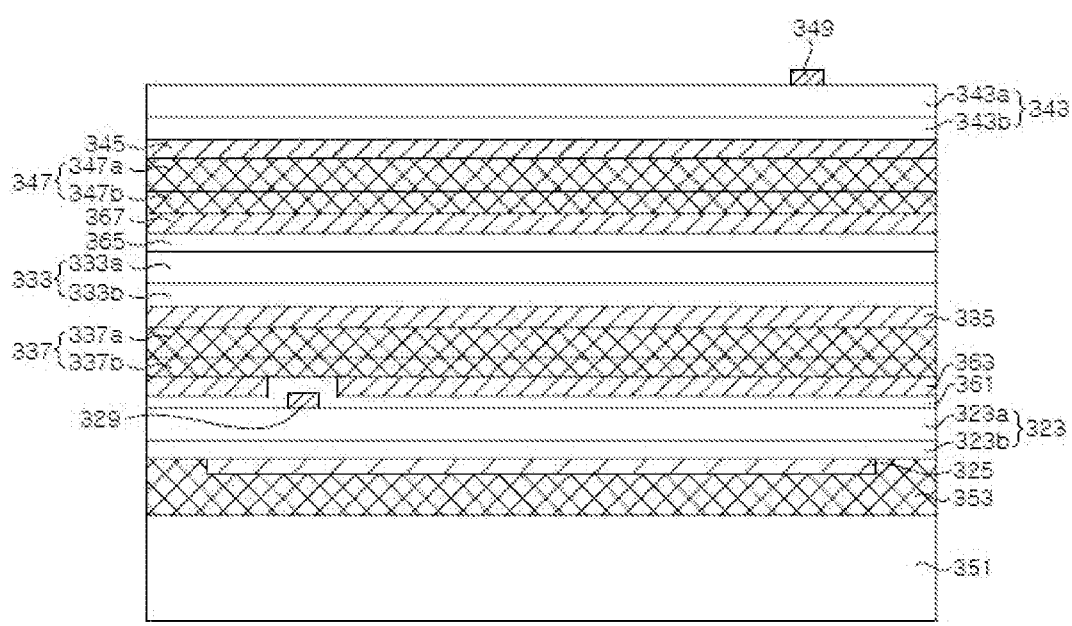

Referring to FIG. 50A and FIG. 50B, first, a second insulation layer 365 is formed on the second LED stack 333, and a second reflection layer 367 is then formed thereon. Thereafter, a bonding material layer 347b is formed on the second reflection layer 367, and the second LED stack 333 of FIG. 48B is coupled to an upper side of the bonding material layer 347b. In some exemplary embodiments, the second reflection layer 367 may be omitted. The bonding material layer 347a is disposed to face the support substrate 251 and is bonded to the bonding material layer 347a to form a third bonding layer 347, by which the second LED stack 333 is coupled to the third LED stack 343.

The third substrate 341 may be removed from the third LED stack 343 by laser lift-off or chemical lift-off. As such, an upper surface of the first conductivity type semiconductor layer 343a of the third LED stack 343 is exposed. In some exemplary embodiments, a roughened surface may be formed on the exposed surface of the first conductivity type semiconductor layer 343a by surface texturing or the like.

Next, a third-1 ohmic electrode 349 is formed on the first conductivity type semiconductor layer 343a. The third-1 ohmic electrode 349 may be formed towards the other side of the pixel to oppose the first-1 ohmic electrode 329. The third-1 ohmic electrode 349 may include a pad region and an extended portion. The extended portion may extend substantially in the longitudinal direction of the reflective electrode 325.

Figure 51A:
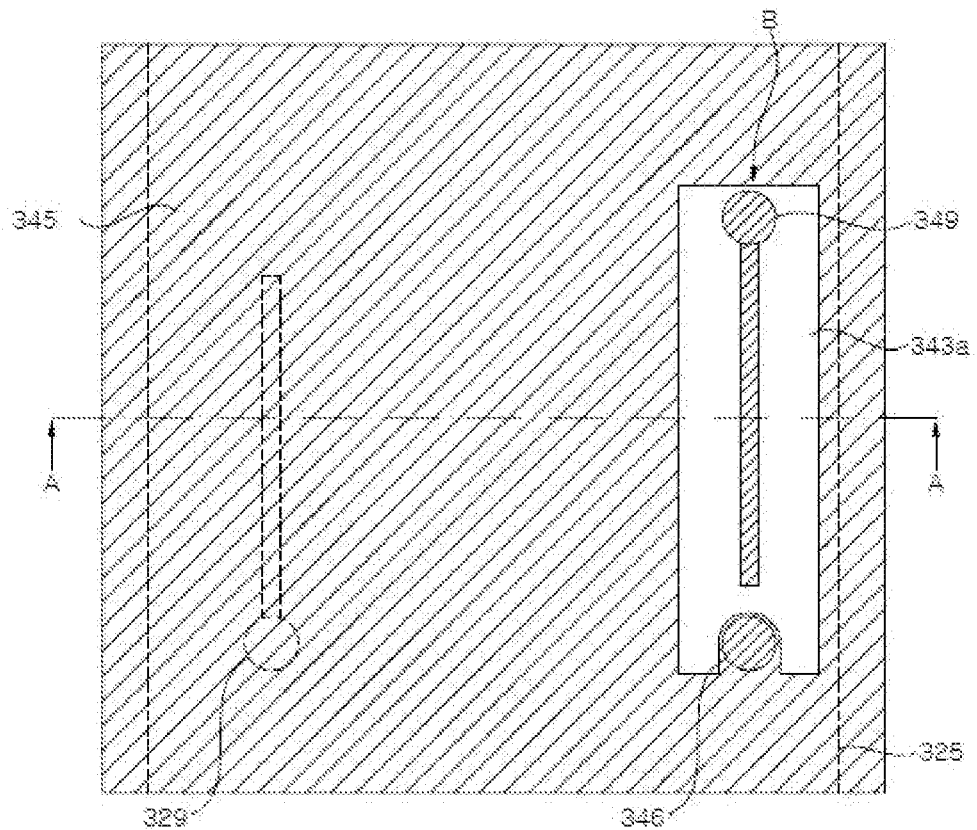
Figure 51B:
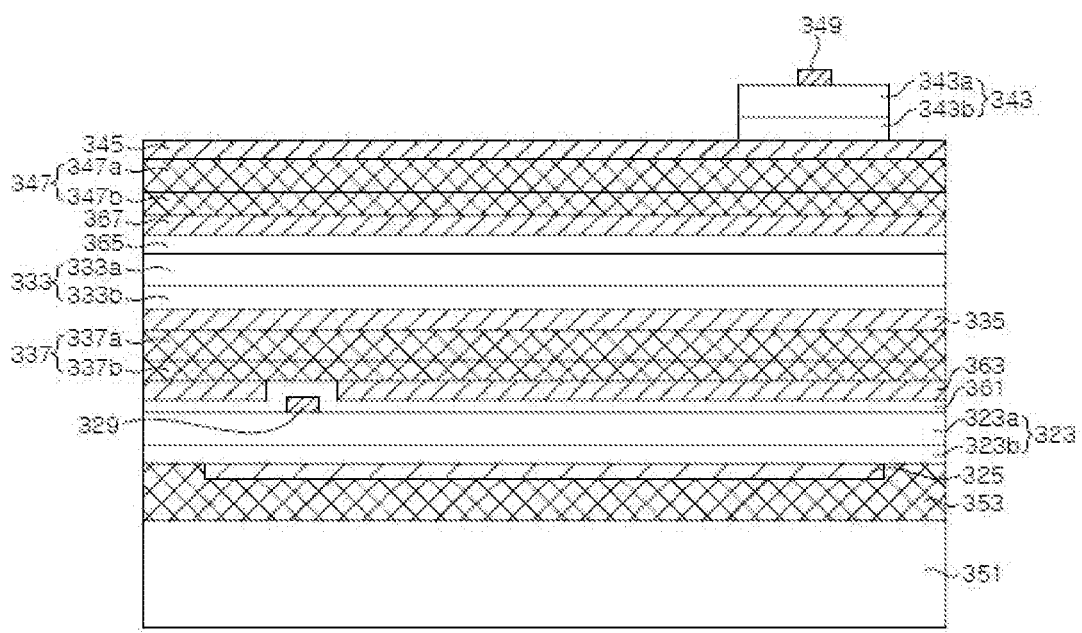

Referring to FIG. 51A and FIG. 51B, in each pixel region, the third LED stack 343 is removed excluding a region corresponding to a third subpixel B by patterning the third LED stack 343. As such, the third-2 ohmic electrode 345 is exposed, as shown in the drawings. In addition, an indentation may be formed on the third LED stack 343 in the region for the third subpixel B.

An electrode pad 346 may be formed on the third-2 ohmic electrode 345 exposed by the indentation formed in the third subpixel B. Although the third-2 ohmic electrode 345 and the electrode pad 346 are described as being formed by separate processes in the illustrated exemplary embodiment, the third-2 ohmic electrode 345 and the electrode pad 346 may be formed together by the same process in other exemplary embodiments. For example, after the third-2 ohmic electrode 345 is exposed, the third-1 ohmic electrode 349 and the electrode pad 346 may be formed together by a lift-off process or the like.

Figure 52A:
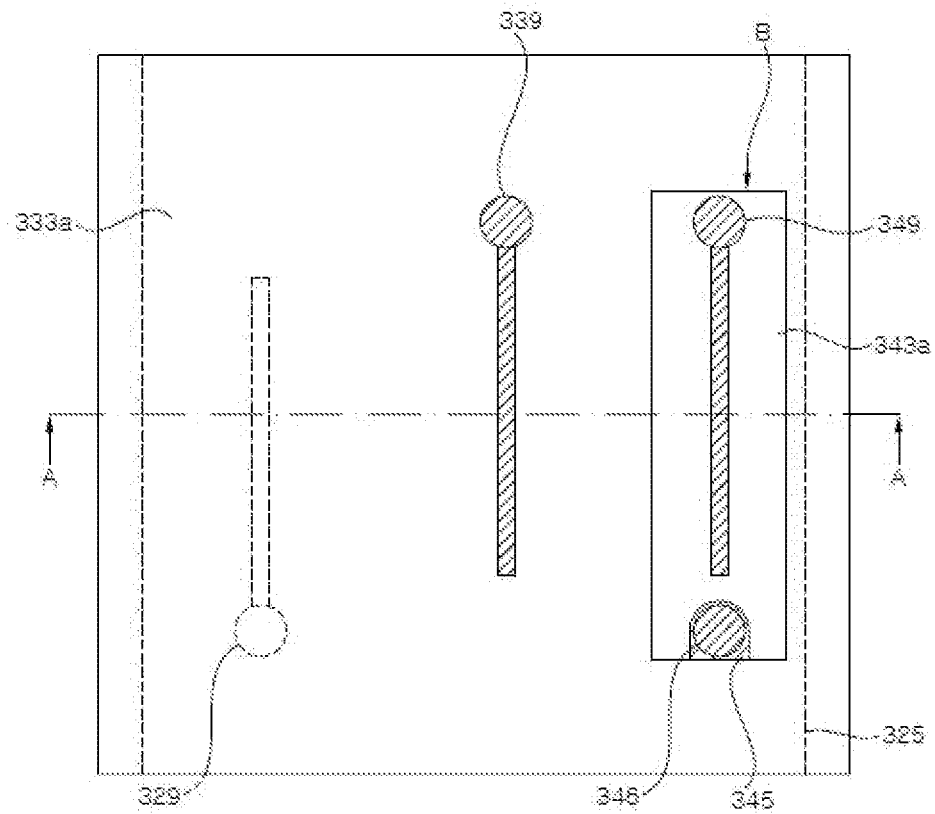
Figure 52B:
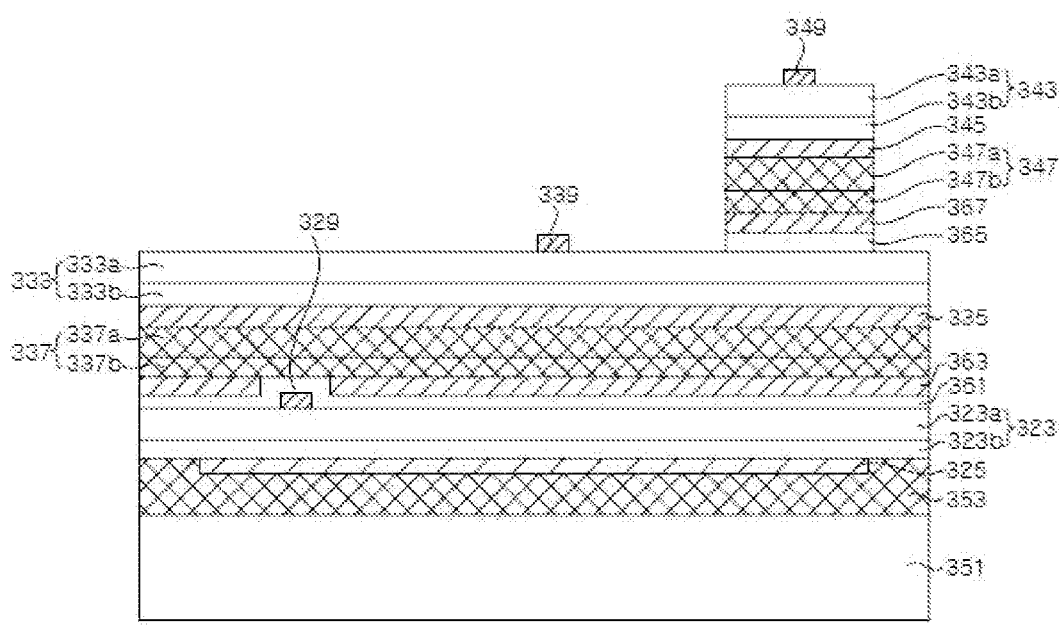

Referring to FIG. 52A and FIG. 52B, in each pixel region, the third-2 ohmic electrode 345, the third bonding layer 347, the second reflection layer 367, and the second transparent insulation layer 365 are sequentially subjected to patterning to expose the second LED stack 333. The third-2 ohmic electrode 345 is restrictively disposed near the region for the third subpixel B.

In each pixel region, a second-1 ohmic electrode 339 is formed on the second LED stack 333. As shown in FIG. 52A, the second-1 ohmic electrode 339 may include a pad region and an extended portion. The extended portion may extend substantially in the longitudinal direction of the reflective electrode 325. The second-1 ohmic electrode 339 forms ohmic contact with the first conductivity type semiconductor layer 333a. As shown in the drawings, the second-1 ohmic electrode 339 may be disposed between the first-1 ohmic electrode 329 and the third-1 ohmic electrode 349, without being limited thereto.

Figure 53A:
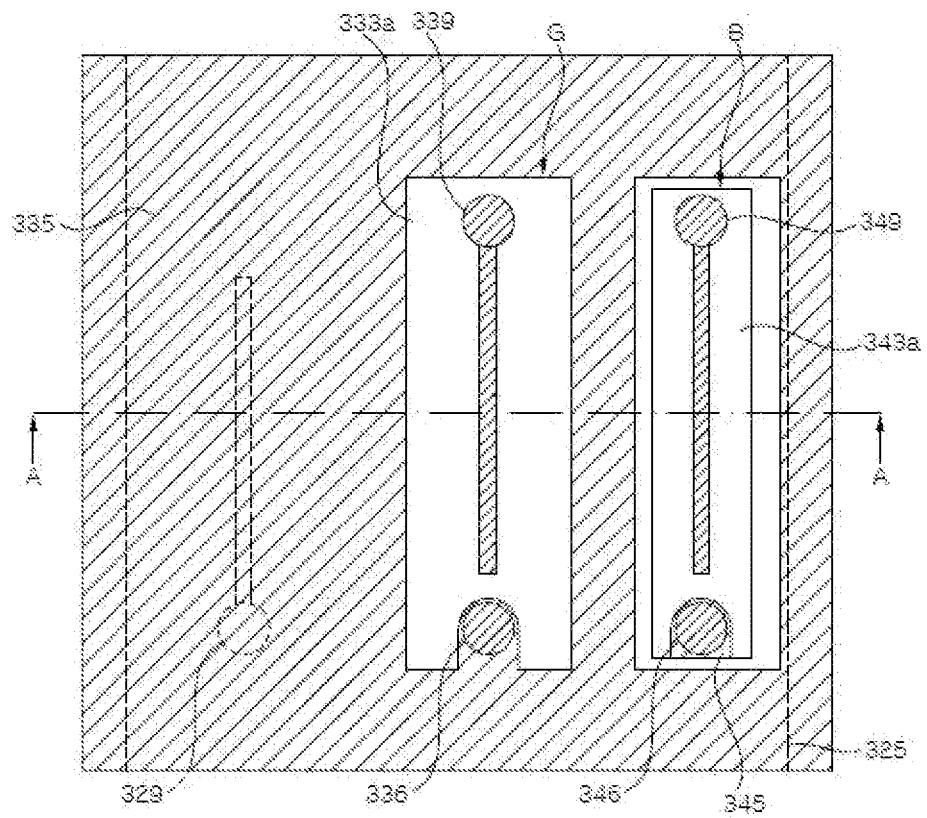
Figure 53B:
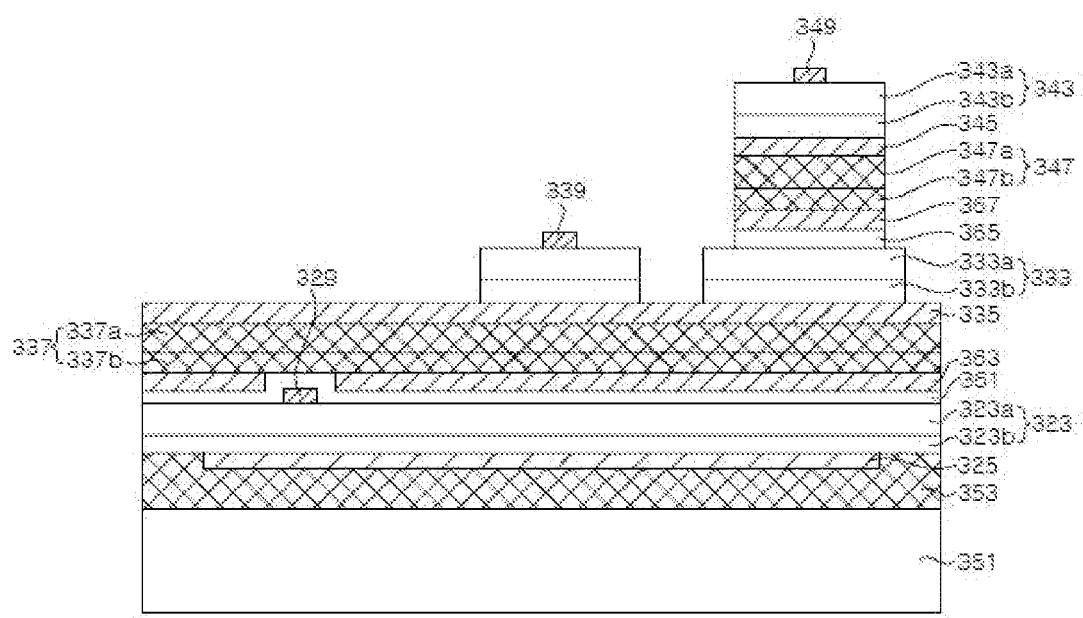

Referring to FIG. 53A and FIG. 53B, the second LED stack 333 is removed except regions corresponding to the third subpixel B and the second subpixel G in each pixel by patterning the second LED stack 333. The second LED stack 333 in the region for the second subpixel G is separated from the second LED stack 333 in the third subpixel B.

As the second LED stack 333 is subjected to patterning, the second-2 ohmic electrode 335 is exposed. The second LED stack 333 in the region for the second subpixel G may include an indentation to which the electrode pad 336 may be formed on the second-2 ohmic electrode 335.

Although the second-1 ohmic electrode 339 and the electrode pad 336 are described as being formed by separate processes in the illustrated exemplary embodiment, the second-1 ohmic electrode 339 and the electrode pad 336 may be formed together by the same process in other exemplary embodiments. For example, after the second-2 ohmic electrode 335 is exposed, the second-1 ohmic electrode 339 and the electrode pad 336 may be formed together by a lift-off process or the like.

Figure 54A:
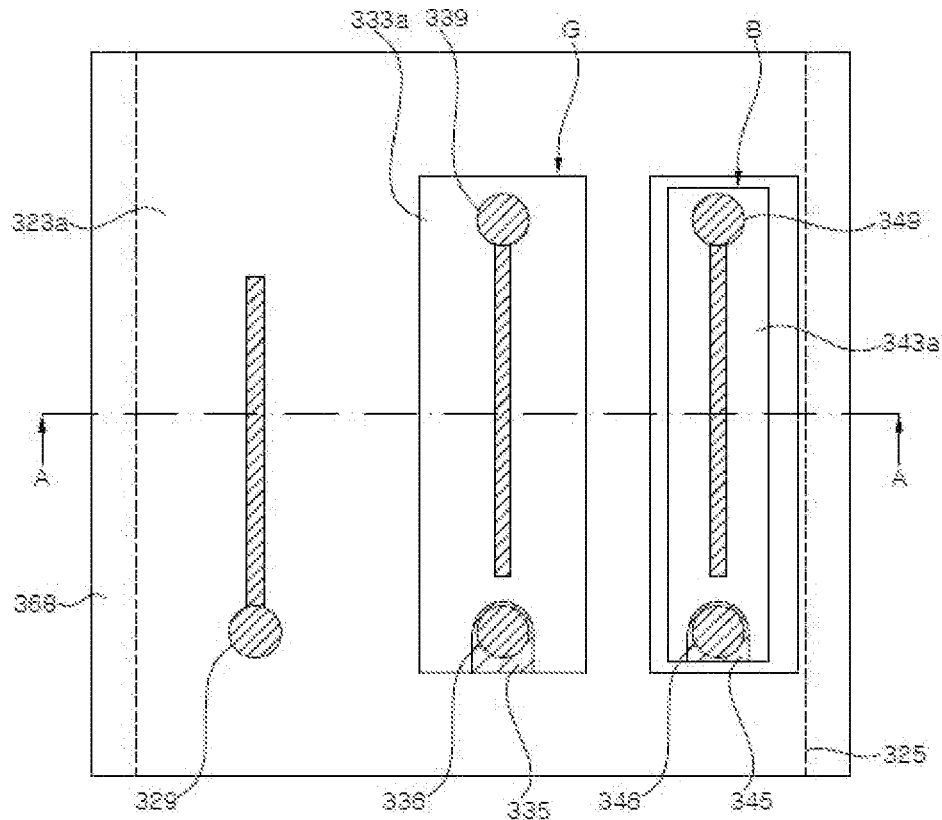
Figure 54B:
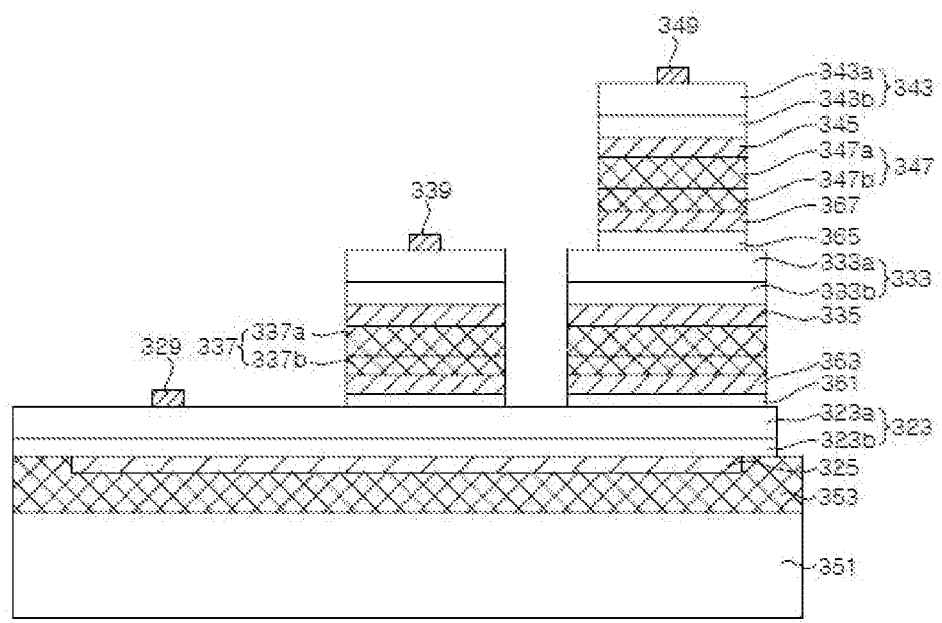

Referring to FIG. 54A and FIG. 54B, the second-2 ohmic electrode 335, the second bonding layer 337, the first reflection layer 363, and the first transparent insulation layer 361 are sequentially subjected to patterning to expose the first LED stack 323. As shown in FIG. 54A, the second-2 ohmic electrode 335 is restrictively disposed near the region for the second subpixel G.

In each pixel region, the first-1 ohmic electrode 329 formed on the first LED stack 323 is exposed. As shown in FIG. 54A, the first-1 ohmic electrode 329 may include a pad region and an extended portion. The extended portion may extend substantially in the longitudinal direction of the reflective electrode 325.

Figure 55A:
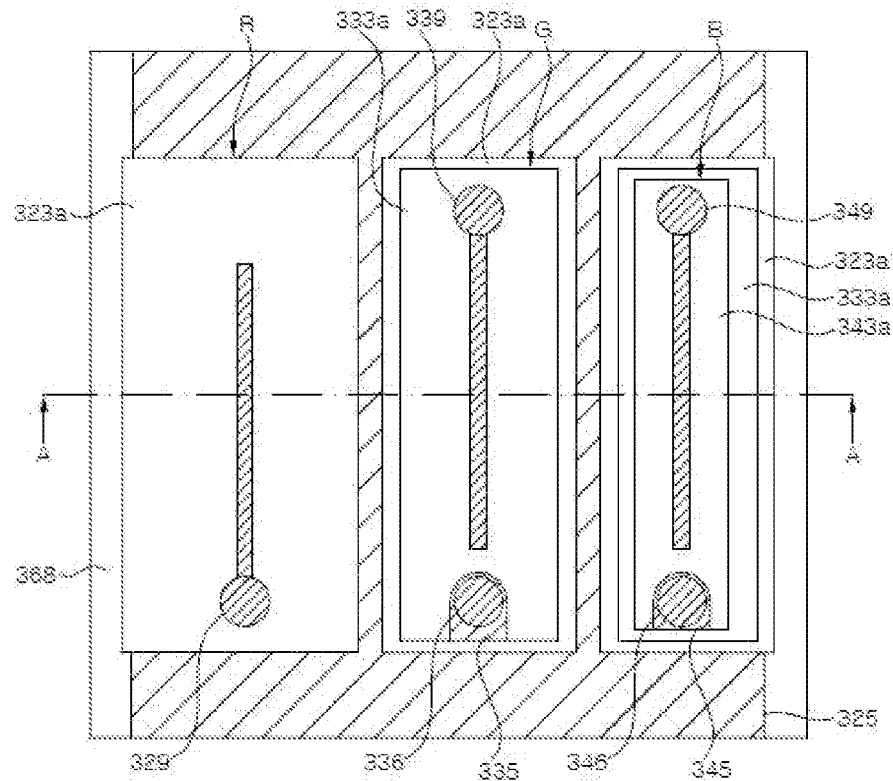
Figure 55B:
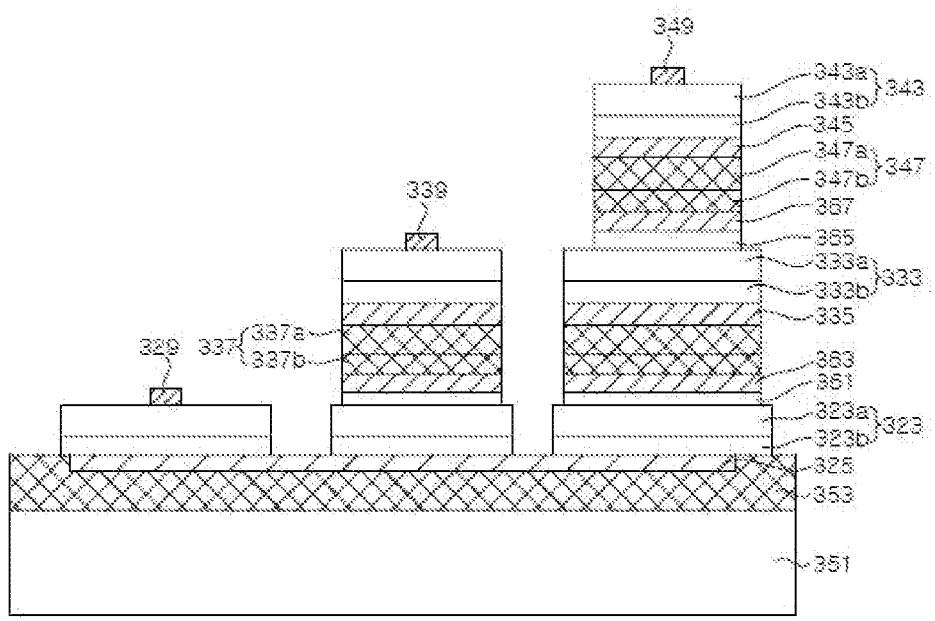

Referring to FIG. 55A and FIG. 55B, the first LED stack 323 is removed from a region excluding the regions corresponding to the first to third subpixels R, G, B by patterning the first LED stack 323. The first-1 ohmic electrode 329 remains in the region for the first subpixel R. The first LED stack 323 in the region for the first subpixel R is separated from the first LED stack 323 in the region for the second subpixel G and the first LED stack 323 in the region for the third subpixel B. The first LED stack 323 in the region for the second subpixel G may be separated from the first LED stack 323 in the region for the third subpixel B, without being limited thereto. For example, the first LED stack 323 of the second subpixel G may be continuously extend to the third subpixel B.

As the first LED stack 323 is subjected to patterning, the reflective electrode 325 is exposed and the surface of the first bonding layer 353 may be partially exposed. In other exemplary embodiments, an insulation layer may be disposed on the first bonding layer 353. In this case, the insulation layer is exposed and the surface of the first bonding layer 353 may not be exposed.

Figure 56A:
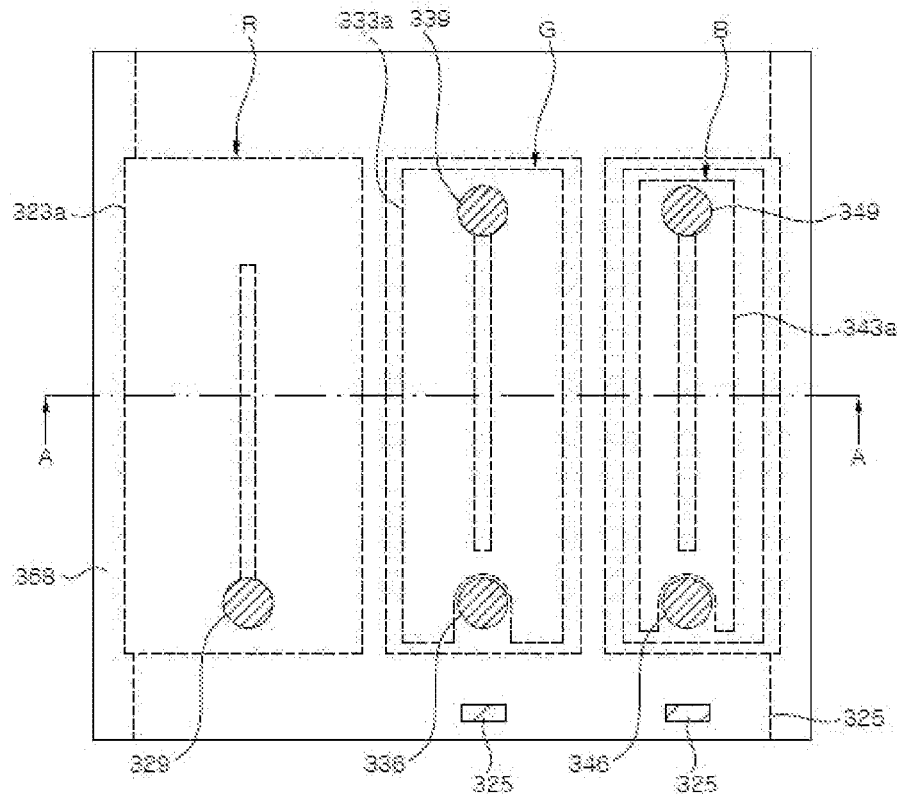
Figure 56B:
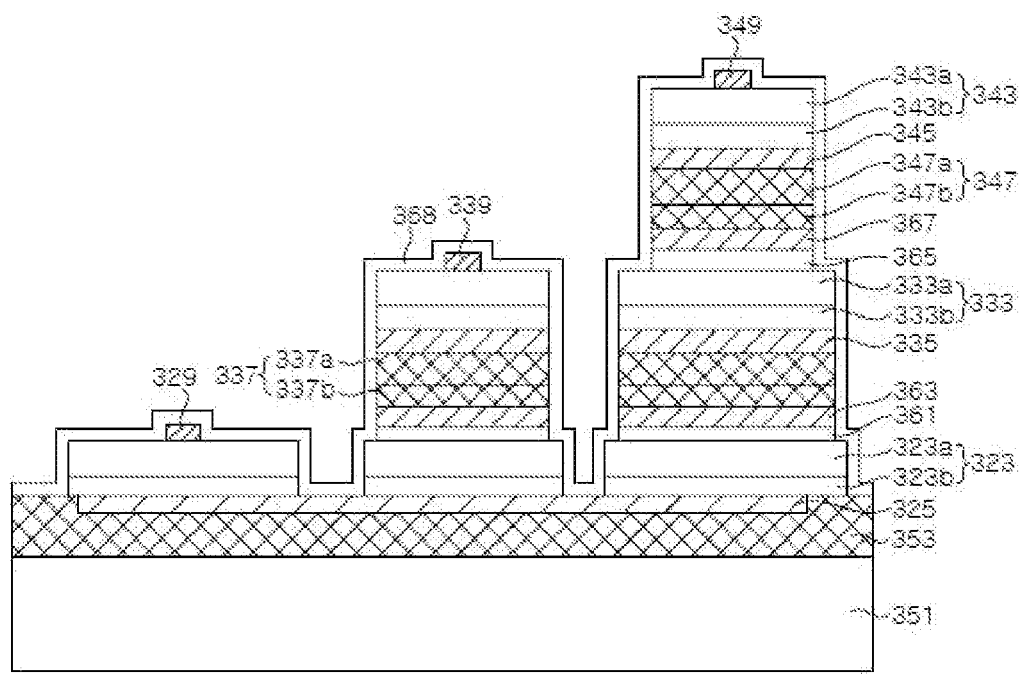

Referring to FIG. 56A and FIG. 56B, a lower insulation layer 368 is formed. The lower insulation layer 368 may cover the first to third LED stacks 323, 333, 343, the reflective electrode 325, and the first bonding layer 353. The lower insulation layer 368 may be subjected to patterning to form openings that expose the first-1 ohmic electrode 329, the second-1 ohmic electrode 339, the third-1 ohmic electrode 349, the electrode pads 336, 346, and the reflective electrode 325.

Figure 57:
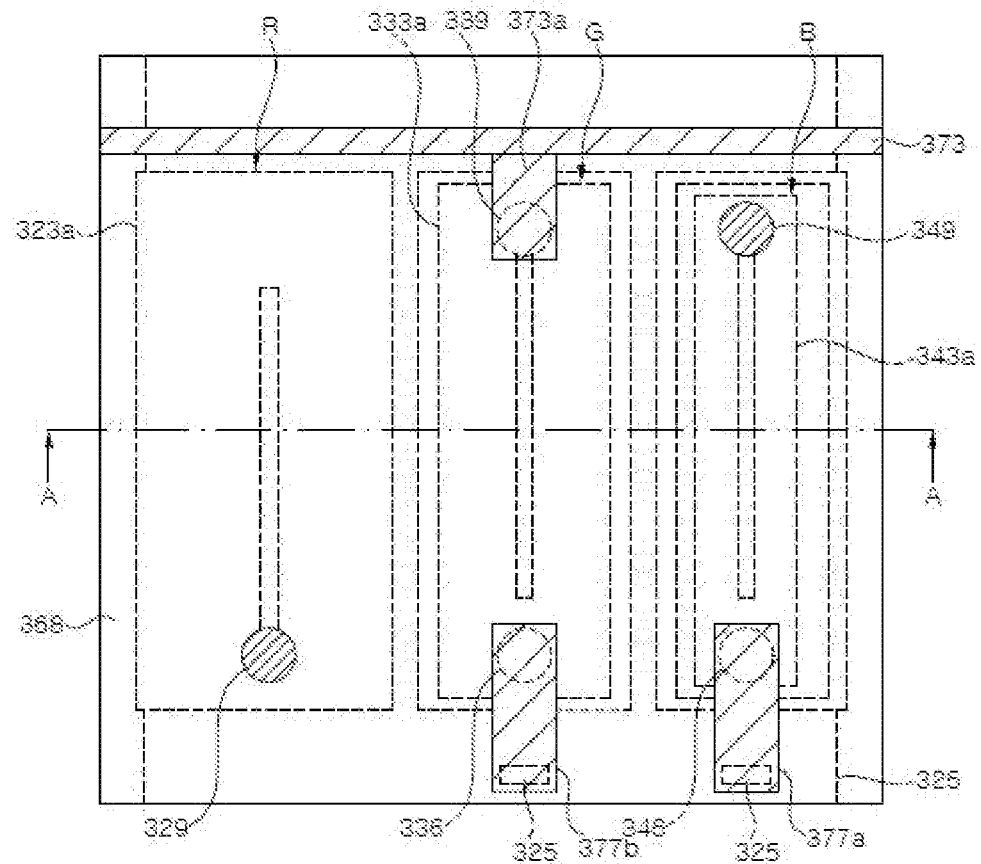

Referring to FIG. 57, an interconnection line 373 and connecting portions 373a, 377a, 377b are formed on the lower insulation layer 368. The connecting portion 373a connects the second-1 ohmic electrode 339 to the interconnection line 373, the connecting portion 377a connects the electrode pad 346 to the reflective electrode 325, and the connecting portion 377b connects the electrode pad 336 to the reflective electrode 325. A cross-sectional view taken along line A-A of FIG. 57 is substantially the same as FIG. 56B, and thus, will be omitted to avoid redundancy.

Figure 58A:
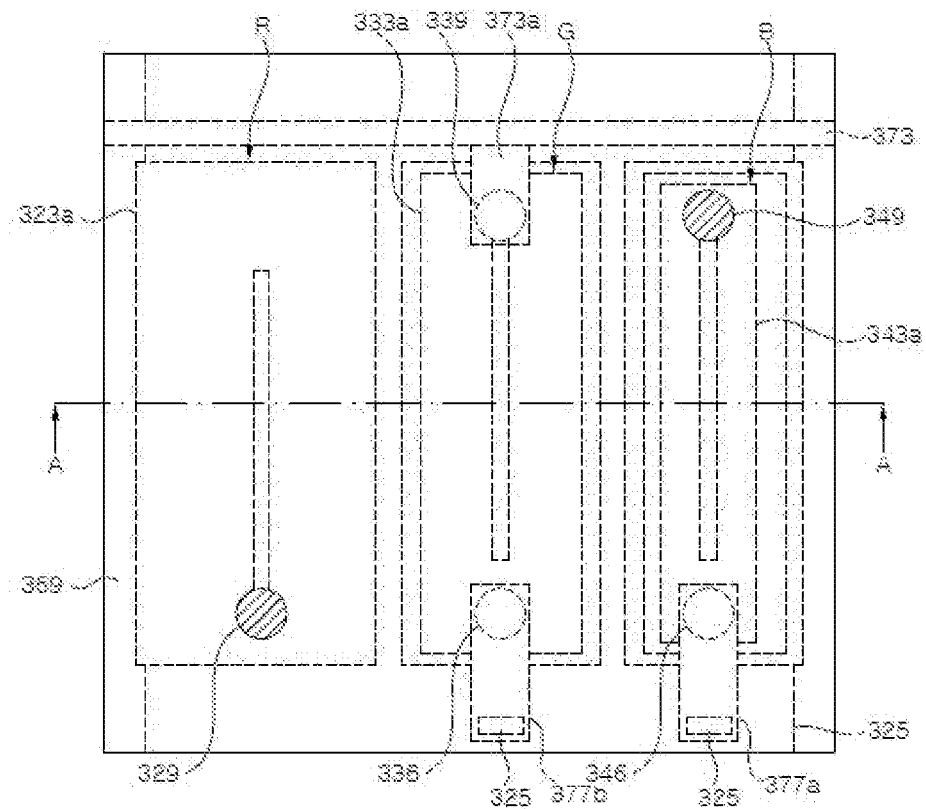
Figure 58B:
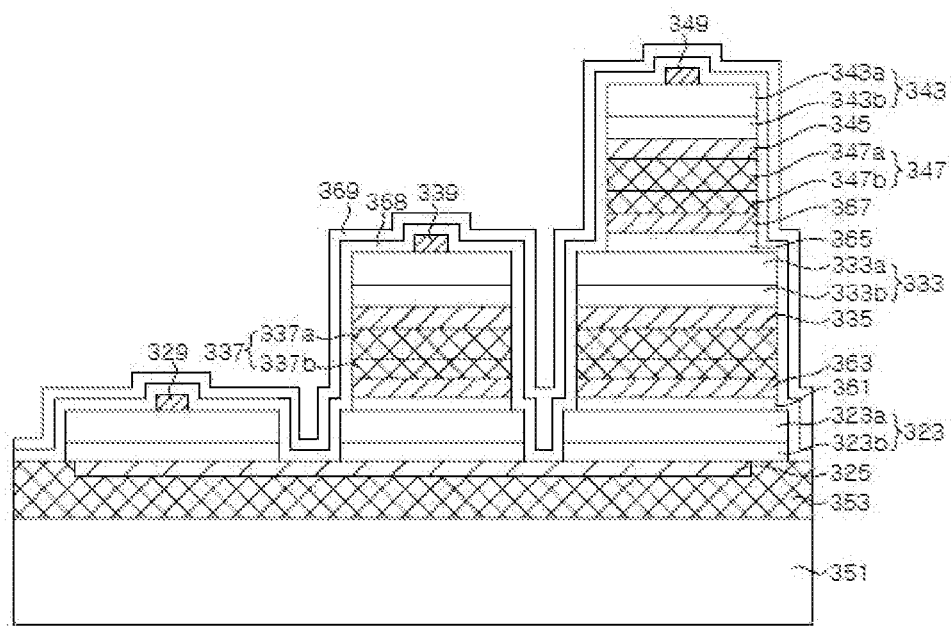

Referring to FIG. 58A and FIG. 58B, an upper insulation layer 369 is formed. The upper insulation layer 369 covers the interconnection line 373 and the connecting portions 373a, 377a, 377b. The upper insulation layer 369 may be subjected to patterning to expose the pad regions of the first-1 ohmic electrode 329 and the third-1 ohmic electrode 349.

Figure 59:
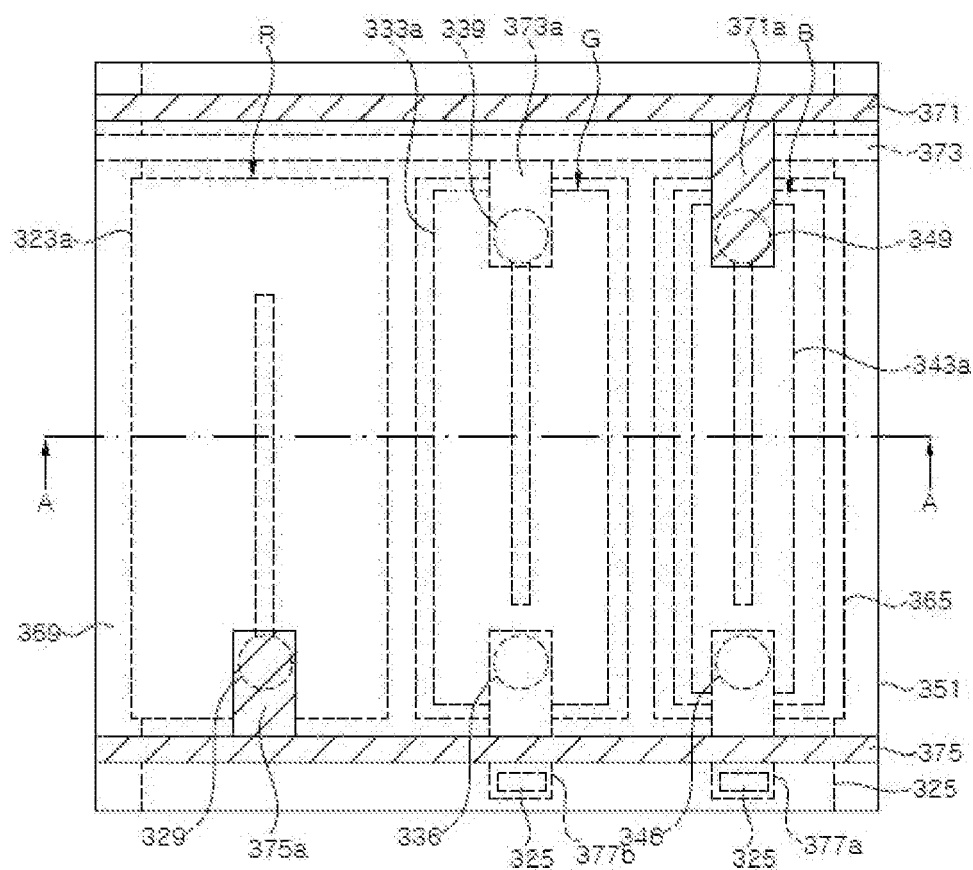

Referring to FIG. 59, interconnection lines 371, 375 and connecting portions 371a, 375a are formed on the upper insulation layer 369. The connecting portion 371a connects the interconnection line 371 to the third-1 ohmic electrode 349, and the connecting portion 375a connects the interconnection line 375 to the first-1 ohmic electrode 329.

As such, the display apparatus 3000A of FIG. 44 and FIG. 45 is provided. A cross-sectional view taken along line A-A of FIG. 59 is substantially the same as FIG. 58B, and thus, will be omitted to avoid redundancy.

In the illustrated exemplary embodiment, light interference can occur between the subpixels R, G, B. More particularly, light interference can occur between the first LED stack 323, the second LED stack 333, and the third LED stack 343. Accordingly, a light blocking layer, such as a light reflective layer or a light absorptive layer, may be formed on a side surface of each of the subpixels to prevent light interference. The light reflective layer may include a distributed Bragg reflector, which may be formed by alternately stacking material layers having different refractive indices, or by a metal reflection layer formed on a transparent insulation layer or a white organic material including a reflective material, such as $TiO_2$. The light absorptive layer may include, for example, a black epoxy resin.

For example, at least one of the lower insulation layer 368 and the upper insulation layer 369 may include the light reflective layer or the light absorptive layer. In this case, the lower insulation layer 368 and/or the upper insulation layer 369 may have openings on the first to third LED stacks 323, 333, 343 to allow light generated from each of the subpixels to be emitted outside therethrough. The openings through which light is emitted to the outside may be restrictively formed in an upper region of each of the first to third LED stacks 323, 333, 343. As such, edges of the first to third LED stacks 323, 333, 343 may also be covered by the reflection layer.

Although the pixels are described as being driven in a passive matrix manner, the inventive concepts are not limited thereto, and the pixels may be driven in an active matrix manner in some exemplary embodiments.

Figure 60:
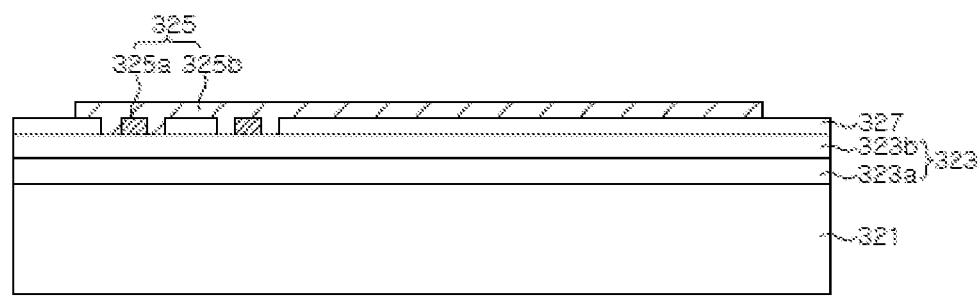
FIG. 60 is a schematic cross-sectional view of a display apparatus according to another exemplary embodiment.

FIG. 60 is a schematic cross-sectional view of a display apparatus according to another exemplary embodiment.

Although the reflective electrode 325 is directly formed on the second conductivity type semiconductor layer 323b in FIG. 47A, the inventive concepts are not limited thereto. For example, referring to FIG. 60, the reflective electrode 325 may include an ohmic contact layer 325a and a reflection layer 325b. The ohmic contact layer 325a may be formed of, for example, Au—Zn alloys or Au—Be alloys, and the reflection layer 325b may be formed of Al, Ag or Au. In particular, when the reflection layer 325b is formed of Au, the reflection layer 325b may exhibit relatively high reflectance to light generated from the first LED stack 323, for example, red light, and may exhibit relatively low reflectance to light generated from the second LED stack 333 and the third LED stack 343, for example, green light or blue light.

An insulation layer 327 may be disposed between the reflection layer 325b and the second conductivity type semiconductor layer 323b. The insulation layer 327 may have openings that expose the second conductivity type semiconductor layer 323b, and the ohmic contact layer 325a may be formed in the openings of the insulation layer 327.

As the reflection layer 325b covers the insulation layer 327, an omnidirectional reflector (ODR) may be formed by a stacked structure of the first LED stack 323 having a high refractive index, the insulation layer 327 having a low refractive index, and the reflection layer 325b.

The reflective electrode 325 may be formed by the following process. First, the first LED stack 323 is grown on the substrate 321 and the insulation layer 327 is formed on the first LED stack 323. Then, opening(s) are formed by patterning the insulation layer 327. For example, SiO$_2$ may be formed on the first LED stack 323 and a photoresist is deposited thereon, followed by forming a photoresist pattern through photolithography and development. Thereafter, the SiO$_2$ layer is subjected to patterning through the photoresist pattern as an etching mask, thereby forming the insulation layer 327 having the openings.

Thereafter, the ohmic contact layer 325a is formed in the opening(s) of the insulation layer 327. The ohmic contact layer 325a may be formed by a lift-off process or the like. After formation of the ohmic contact layer 325a, the reflection layer 325b is formed to cover the ohmic contact layer 325a and the insulation layer 327. The reflection layer 325b may be formed by a lift-off process or the like. The reflection layer 325b may partially or completely cover the ohmic contact layer 325a, as shown in the drawings. The reflective electrode 325 is formed by the ohmic contact layer 325a and the reflection layer 325b. The shape of the reflective electrode 325 is substantially the same as that of the reflective electrode described above, and thus, detailed descriptions thereof will be omitted.

Although the first LED stack 323 is described as being formed of AlGaInP-based semiconductor layers to emit red light, the inventive concepts are not limited thereto. For example, the first LED stack 323 may emit green light or blue light. Accordingly, the first LED stack 323 may be formed of AlGaInN-based semiconductor layers. In addition, the second LED stack 333 or the third LED stack 343 may be formed of AlGaInP-based semiconductor layers.

According to the exemplary embodiments of the present disclosure, a plurality of pixels may be formed at the wafer level by wafer bonding, thereby eliminating a need for individual mounting of light emitting diodes.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode pixel for a display, comprising:
a first subpixel comprising a first LED sub-unit;
a second subpixel comprising a second LED sub-unit;
a third subpixel comprising a third LED sub-unit; and
a bonding layer overlapping the first, second, and third subpixels,
wherein:
each of the first, second, and third LED sub-units includes a first type of semiconductor layer and a second type of semiconductor layer;
each of the first, second, and third LED sub-units is spaced apart from each other and disposed on a different plane;
the light emitting diode pixel further includes a reflective electrode electrically connected to the second type of semiconductor layer of the first LED sub-unit; and
the reflective electrode extends from the first subpixel to the third subpixel.

2. The light emitting diode pixel of claim 1, wherein the first LED sub-unit, the second LED sub-unit, and the third LED sub-unit comprise a first LED stack, a second LED stack, and a third LED stack configured to emit light having a different wavelength from each other, respectively.

3. The light emitting diode pixel of claim 2, wherein the third LED stack of the third subpixel is configured to emit light having a longer peak wavelength than those emitted from the second LED stack of the second subpixel and the first LED stack of the first subpixel.

4. The light emitting diode pixel of claim 3, wherein at least one of the first, second, and third LED stacks has a surface area less than about 10,000 square μm.

5. The light emitting diode pixel of claim 1, wherein the first, second, and third subpixels have different widths from each other.

6. The light emitting diode pixel of claim 5, wherein the second LED sub-unit of the second subpixel has a width less than that of the third LED sub-unit of the third subpixel.

7. The light emitting diode pixel of claim 1, wherein the bonding layer has a varying thickness along the first, second, and third subpixels.

8. The light emitting diode pixel of claim 1, wherein each of the first, second, and third LED sub-units is formed in plural to respectively correspond to the first, second, and third subpixels.

9. The light emitting diode pixel of claim 1, further comprising a support substrate on which the first, second, and third subpixels are disposed,
wherein the support substrate is configured to transmit light generated from the first, second, and third subpixels.

10. A light emitting diode pixel for a display, comprising:
a first subpixel comprising a first LED sub-unit;
a second subpixel comprising a second LED sub-unit;
a third subpixel comprising a third LED sub-unit; and
a bonding layer overlapping the first, second, and third subpixels,
wherein:
each of the first, second, and third LED sub-units includes a first type of semiconductor layer and a second type of semiconductor layer;
each of the first, second, and third LED sub-units is spaced apart from each other;
the first LED sub-unit of the first subpixel does not overlap the third LED sub-unit of the third subpixel;
the light emitting diode pixel further includes a reflective electrode electrically connected to the second type semiconductor layer of the first LED sub-unit; and
the reflective electrode extends from the first subpixel to the third subpixel.

11. The light emitting diode pixel of claim 10, wherein the first, second, and third subpixels have different widths from each other.

12. The light emitting diode pixel of claim 10, wherein the second LED sub-unit of the second subpixel has a width less than that of the first LED sub-unit of the first subpixel.

13. The light emitting diode pixel of claim 10, wherein the bonding layer has a varying thickness along the first, second, and third subpixels.

14. A display apparatus, comprising:
a support substrate including a circuit;
a first subpixel comprising a first LED sub-unit;
a second subpixel comprising a second LED sub-unit; and a bonding layer overlapping the first subpixel and the second subpixel, wherein:

each of the first and second sub-units includes a first type of semiconductor layer and a second type of semiconductor layer;

the first and second sub-units are separated from each other in a first direction;

a first portion of the bonding layer overlapping the first subpixel and a second portion of the bonding layer overlapping the second subpixel have different thicknesses;

the display apparatus further includes a reflective electrode electrically connected to the second type semiconductor layer of the first LED sub-unit; and the reflective electrode extends from the first subpixel to the second subpixel.

15. The display apparatus of claim 14, wherein the bonding layer includes a first bonding part disposed between the support substrate and the first LED sub-unit, and a second bonding part disposed between the first LED sub-unit and the second LED sub-unit.

16. The display apparatus of claim 14, wherein the first and second subpixels have different widths from each other.

17. The display apparatus of claim 14, wherein the second LED sub-unit of the second subpixel has a width less than that of the first LED sub-unit of the first subpixel.

18. The display apparatus of claim 14, wherein the second LED sub-unit of the second subpixel does not overlap the first LED sub-unit of the first subpixel.

\* \* \* \* \*